(12) United States Patent
Funaya et al.

(10) Patent No.: US 9,818,815 B2
(45) Date of Patent: Nov. 14, 2017

(54) SEMICONDUCTOR DEVICE AND METHOD OF MANUFACTURING THE SAME

(71) Applicant: Renesas Electronics Corporation, Tokyo (JP)

(72) Inventors: Takuo Funaya, Tokyo (JP); Hiromi Shigihara, Tokyo (JP); Hisao Shigihara, Tokyo (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/961,622

(22) Filed: Dec. 7, 2015

(65) Prior Publication Data

US 2016/0087025 A1 Mar. 24, 2016

Related U.S. Application Data

(63) Continuation of application No. 14/625,390, filed on Feb. 18, 2015, now Pat. No. 9,219,108, which is a
(Continued)

(30) Foreign Application Priority Data

Dec. 21, 2012 (JP) ................................. 2012-279843

(51) Int. Cl.
*H01L 49/02* (2006.01)
*H01L 23/495* (2006.01)
(Continued)

(52) U.S. Cl.
CPC ........ *H01L 28/10* (2013.01); *H01L 23/49575* (2013.01); *H01L 23/5227* (2013.01);
(Continued)

(58) Field of Classification Search
CPC ...................... H01L 23/5227; H01L 23/49575
See application file for complete search history.

(56) References Cited

U.S. PATENT DOCUMENTS 5,170,302 A * 12/1992 Matsumoto ............ G11B 5/313
360/123.39
6,483,662 B1 * 11/2002 Thomas ................ G11B 5/3116
360/123.4
(Continued)

FOREIGN PATENT DOCUMENTS

CN         1866467 A       11/2006
JP         H06-29662 A     2/1994
(Continued)

OTHER PUBLICATIONS

Japanese Office Action dated Jul. 19, 2016 with an English translation thereof.
(Continued)

*Primary Examiner* — Marc Armand
(74) *Attorney, Agent, or Firm* — McGinn IP Law Group, PLLC

(57) ABSTRACT

A semiconductor device includes a semiconductor substrate having a main surface; a first coil formed on the main surface; a first insulating film formed over the first coil and having a first main surface; a second insulating film formed on the first main surface of the first insulating film and having a second main surface; and a second coil formed on the second main surface of the second insulating film, wherein the first main surface of the first insulating film has a first area on which the second insulating film is formed, and has a second area without the first area in a plan view, and wherein the second insulating film is surrounded with the second area in the plane view.

15 Claims, 40 Drawing Sheets

Related U.S. Application Data continuation of application No. 14/106,569, filed on Dec. 13, 2013, now Pat. No. 8,987,861.

(51) Int. Cl.
*H01L 23/522* (2006.01)
*H01L 27/06* (2006.01)
*H01L 27/12* (2006.01)
*H01L 23/00* (2006.01)

(52) U.S. Cl.
CPC .............. *H01L 24/03* (2013.01); *H01L 24/05* (2013.01); *H01L 24/06* (2013.01); *H01L 24/49* (2013.01); *H01L 27/0617* (2013.01); *H01L 27/1203* (2013.01); *H01L 24/45* (2013.01); *H01L 24/48* (2013.01); *H01L 2224/02166* (2013.01); *H01L 2224/04042* (2013.01); *H01L 2224/05554* (2013.01); *H01L 2224/06102* (2013.01); *H01L 2224/45144* (2013.01); *H01L 2224/48091* (2013.01); *H01L 2224/48137* (2013.01); *H01L 2224/4945* (2013.01); *H01L 2224/49113* (2013.01); *H01L 2224/49171* (2013.01); *H01L 2224/49175* (2013.01); *H01L 2924/10161* (2013.01); *H01L 2924/12041* (2013.01); *H01L 2924/1305* (2013.01); *H01L 2924/1306* (2013.01); *H01L 2924/13055* (2013.01); *H01L 2924/181* (2013.01); *H01L 2924/3025* (2013.01); *H01L 2924/30107* (2013.01)

(56) References Cited

U.S. PATENT DOCUMENTS

| | | | |
|---|---|---|---|
| 2005/0174209 A1* | 8/2005 | Teshima | H01F 5/003 336/200 |
| 2006/0263727 A1 | 11/2006 | Lee et al. | |
| 2009/0224375 A1 | 9/2009 | Eda | |
| 2009/0309688 A1 | 12/2009 | Kawano | |
| 2013/0154767 A1 | 6/2013 | Kim et al. | |

FOREIGN PATENT DOCUMENTS

| | | |
|---|---|---|
| JP | 2000-183089 A | 6/2000 |
| JP | 2009/212332 A | 9/2009 |
| JP | 2009-267215 A | 11/2009 |
| JP | 2009-302268 A | 12/2009 |
| JP | 2009-302418 A | 12/2009 |

OTHER PUBLICATIONS

United States Notice of Allowance in U.S. Appl. No. 14/106,569 dated Nov. 19, 2014.

United States Notice of Allowance in co-pending U.S. Appl. No. 14/625,390 dated Aug. 19, 2015.

Chinese Office Action dated Jul. 7, 2017 with Search Report in Chinese Application No. 201310712188.8 with a partial English translation thereof.

\* cited by examiner

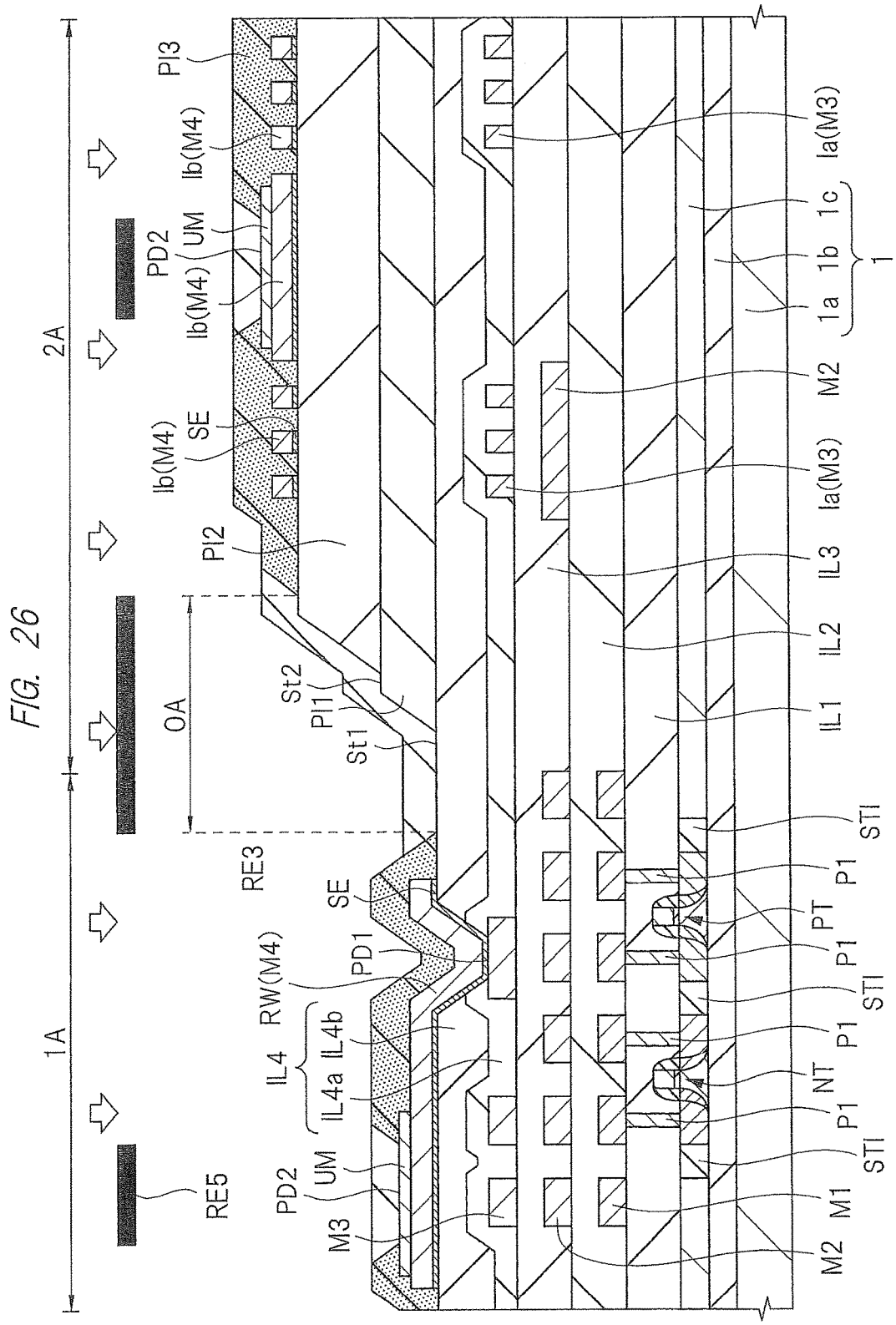

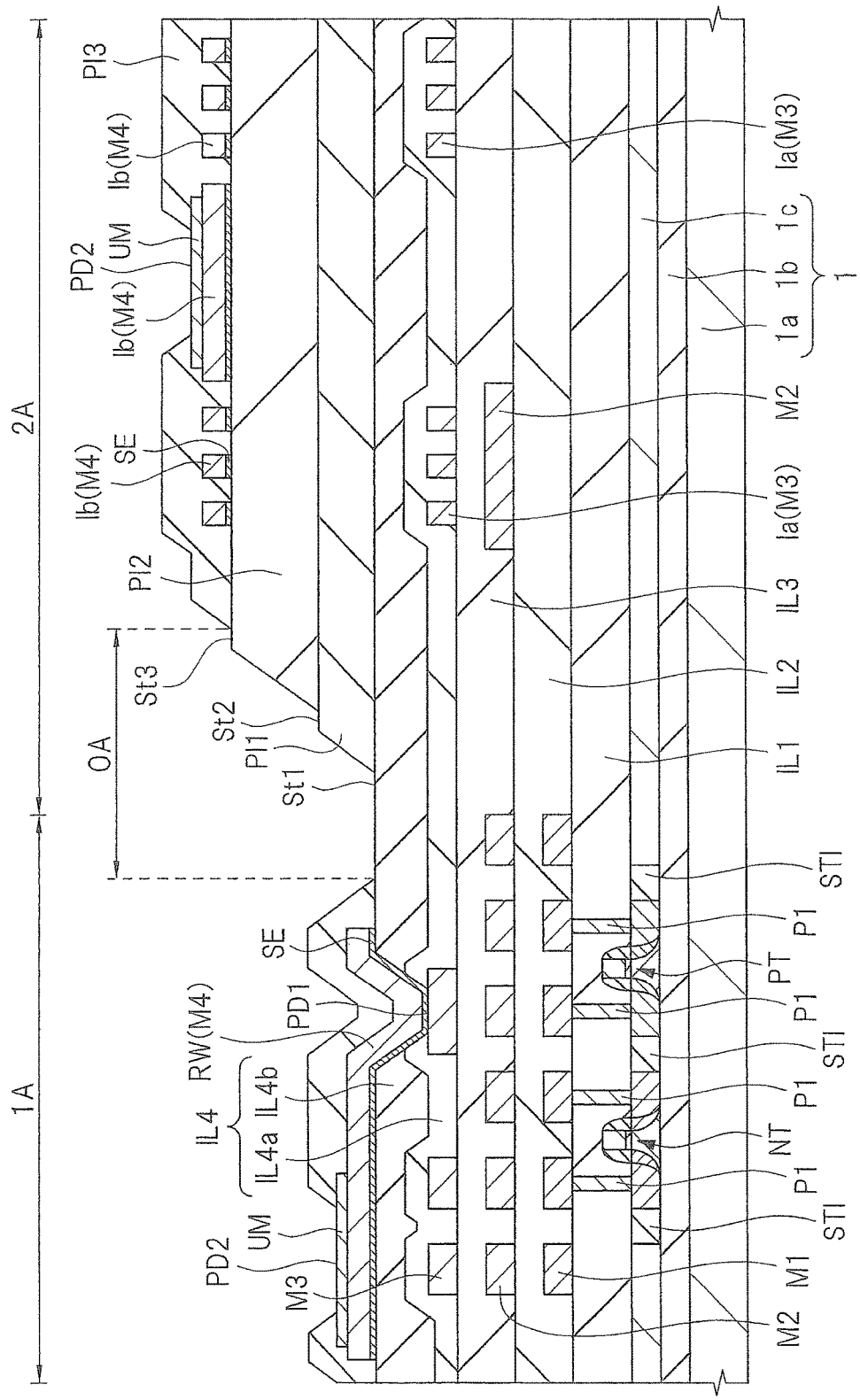

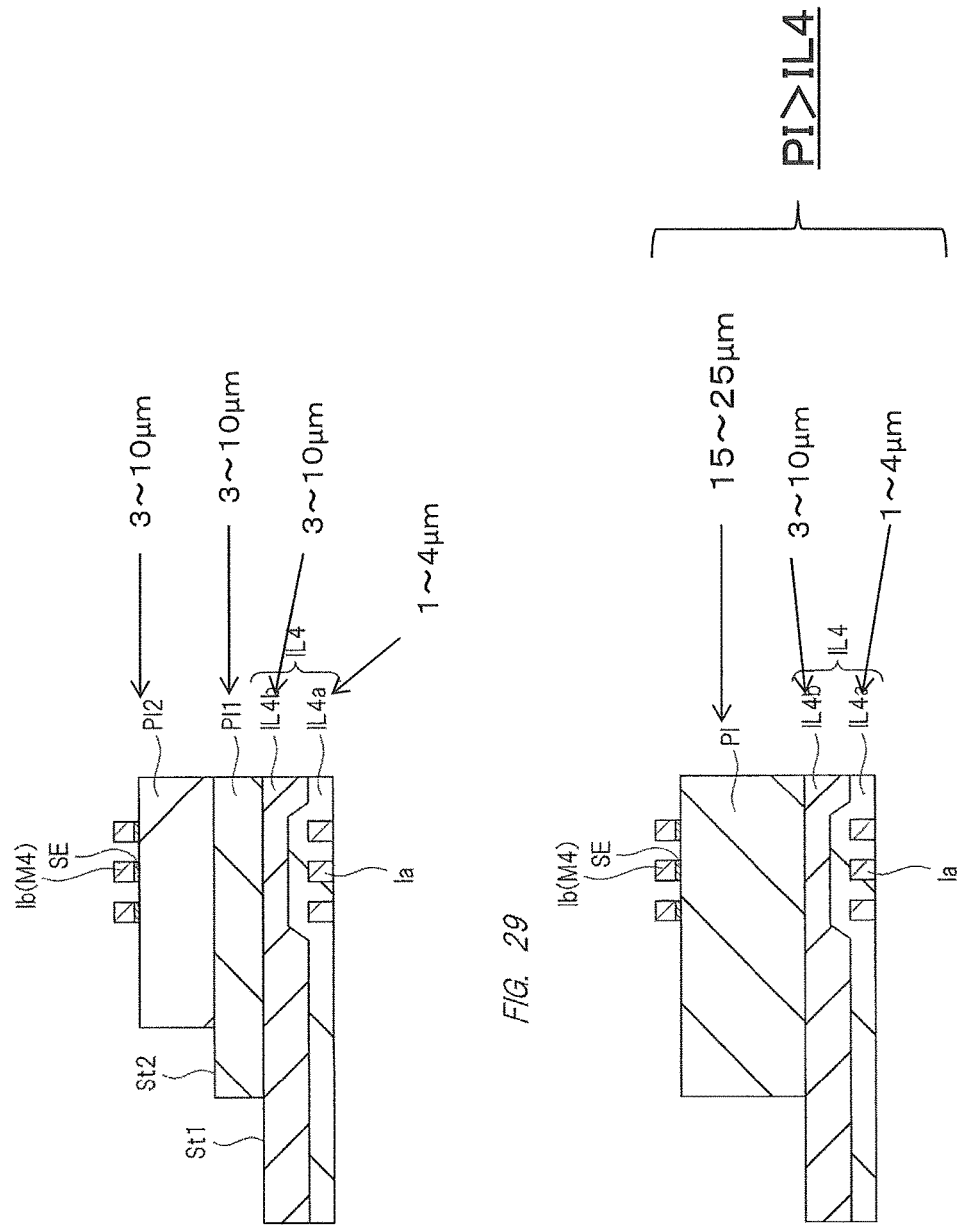

SEMICONDUCTOR DEVICE AND METHOD OF MANUFACTURING THE SAME

CROSS-REFERENCE TO RELATED APPLICATION

The present application is a Continuation Application of U.S. patent application Ser. No. 14/625,390 filed on Feb. 18, 2015, which is a Continuation Application of U.S. patent application Ser. No. 14/106,569, filed on Dec. 13, 2013, now U.S. Pat. No. 8,987,861 B2, issued on Mar. 24, 2015, which is based on Japanese Patent Application No. 2012-279843 filed on Dec. 21, 2012, the entire contents of which are hereby incorporated by reference.

BACKGROUND

The present invention relates to a semiconductor device and a method of manufacturing the same, and, for example, relates to an effective technique applied to a semiconductor device having an inductor (coil) and a method of manufacturing a semiconductor device having an inductor.

A device that transfers electrical signals between two circuits the potentials of inputted electrical signals of which are different from each other can be a device using a photocoupler. The photocoupler has a light-emitting element, such as a light-emitting diode, and a light-receiving element, such as a phototransistor, and uses the light-emitting element to convert an inputted electrical signal into light and uses the light-receiving element to restore the electrical signal from the light, thereby transferring the electrical signal.

In addition, a technique of inductively coupling two inductors to transfer an electrical signal has been developed. For example, Patent Document 1 (Japanese Patent Application Laid-Open Publication No. 2009-302418) explained below discloses a circuit device including a first inductor (200), a first insulating layer (100), and a second inductor (300) (see FIG. 1). The first inductor (200) is positioned on one face of the first insulating layer (100), and the second inductor (300) is positioned on the other face of the first insulating layer (100), and positioned in a region where the second inductor (300) is superposed on the first inductor (200), as viewed perpendicularly to the one face of the first insulating layer (100). In addition, as the first insulating layer (100), polyimide resin has been exemplified.

Incidentally, in the above paragraph, numerals in parentheses are reference numerals or figure numbers provided in the Patent Document 1.

SUMMARY

As a technique of transferring electrical signals between two circuits the inputted electrical signals of which have different potentials, there is a technique using the "photocoupler" mentioned above. However, since the photocoupler has the light-emitting element and the light-receiving element, it is difficult to miniaturize the photocoupler. Further, adoption of the photocoupler is limited because, for example, the photocoupler cannot follow an electrical signal when the frequency of the electrical signal is high.

On the other hand, in a semiconductor device inductively coupling two inductors to transfer an electrical signal, the inductors can be formed by means of a microfabrication technique for a semiconductor device, and miniaturization of the device can be achieved. Further, the electrical characteristics of the semiconductor device are also good, and thus the development thereof is desired.

Especially, for further improvement in device characteristics such as improvement in withstand voltage, examinations are required in consideration of a device structure or a method of manufacturing the same.

The above and other preferred aims and novel characteristics of the present invention will be apparent from the description of the present specification and the accompanying drawings.

The typical ones of the inventions disclosed in the present application will be briefly described as follows.

A semiconductor device presented in an embodiment disclosed in the present patent application includes a laminated insulating film formed above a first coil. This laminated insulating film includes a second insulating film, and a third insulating film formed on the second insulating film. The second insulating film and the third insulating film is a laminated insulating film having a step formed by a main surface of the second insulating film and a main surface of the third insulating film via side surfaces of the third insulating film, and a second coil is formed on the laminated insulating film.

A method of manufacturing a semiconductor device presented in an embodiment disclosed in the present patent application includes a step of forming a laminated insulating film above a first coil forming a second insulating film on a first insulating film, and a step of forming a third insulating film on the second insulating film forming the third insulating film so as to provide a step between the second insulating film and the third insulating film. After the above-described steps, a second coil is formed on the laminated insulating film.

A method of manufacturing a semiconductor device presented in an embodiment disclosed in the present patent application includes a step of forming an active element in a first region of a semiconductor substrate, a step of forming a wiring in the first region of the semiconductor substrate and forming a first coil in a second region of the semiconductor substrate, and a step of forming a laminated insulating film on a first insulating film on the first coil. The step of forming a laminated insulating film includes a step of forming a second insulating film on the first insulating film and a step of forming a third insulating film on the second insulating film forming the third insulating film so as to provide a step between the second insulating film and the third insulating film. In addition, the method of manufacturing a semiconductor device further includes a step of forming a second coil on the laminated insulating film and forming a rewiring extended on the first insulating film from an opening portion of the first insulating film on the wiring.

According to a semiconductor device that is disclosed in the present patent application and that is described in an exemplified embodiment described below, the characteristics of a semiconductor device can be improved.

According to a method of manufacturing a semiconductor device that is disclosed in the present patent application and that is described in an exemplified embodiment presented below, a semiconductor device having good characteristics can be manufactured.

BRIEF DESCRIPTION OF THE DRAWINGS

FIG. 26 is a sectional view showing the manufacturing step of the semiconductor device of the first embodiment, continued from FIG. 25;

FIG. 27 is a sectional view showing the manufacturing step of the semiconductor device of the first embodiment, continued from FIG. 26;

FIG. 28 is a sectional view of an inductor portion of the semiconductor device of the first embodiment;

FIG. 29 is a sectional view showing a configuration of a comparative example 1 of the first embodiment;

DETAILED DESCRIPTION OF THE EXEMPLARY EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including the number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value etc. (the number of pieces, values, amount, range, and the like) mentioned above.

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, when there are similar members (portions), a generic reference of the members may be added with a symbol to denote an individual or specific portion. In addition, the description of the same or similar portions is not repeated in principle unless particularly required in the following embodiments.

Further, in some drawings used in the embodiments, hatching is used even in a plan view so as to make the drawings easy to see.

Moreover, in a sectional view and a plan view, the dimensions of each part are not intended to correspond to those of an actual device, and, in order to make the drawings easy to understand, a specific part may be represented in a relatively magnified manner. Also, even if a plan view and a sectional view correspond to each other, the dimensions of each part may be differently represented.

First Embodiment

Description of Structure

Figure 1:
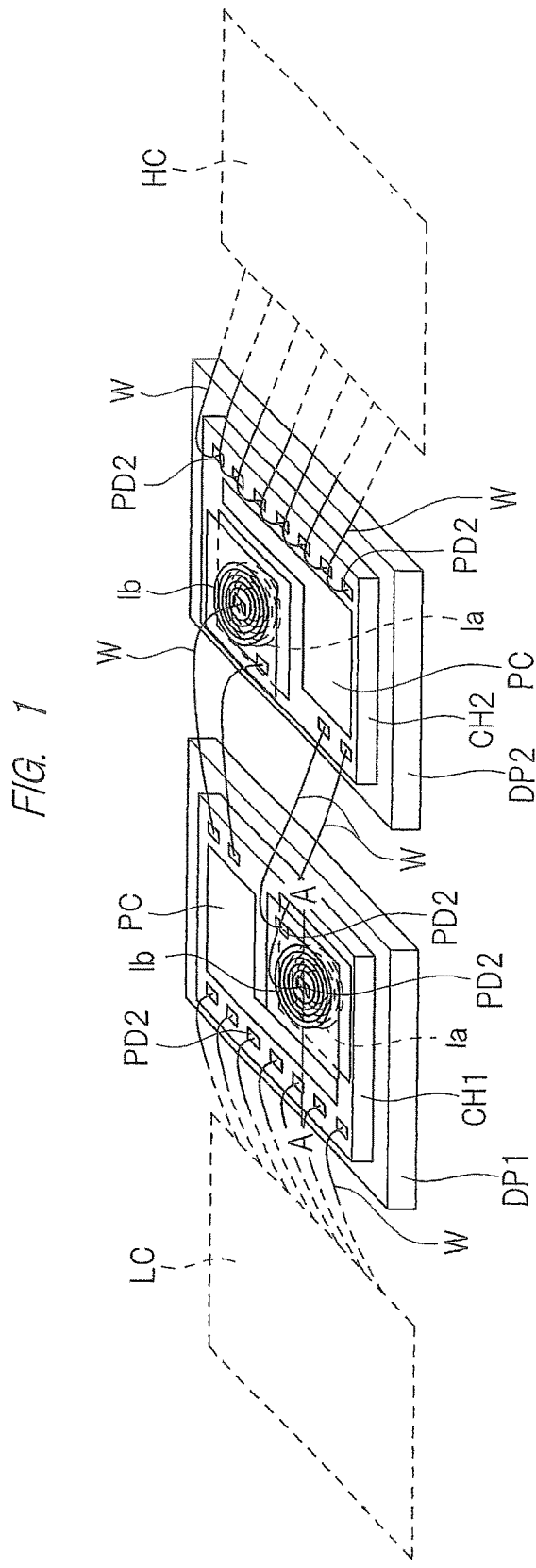
FIG. 1 is a conceptual view showing a configuration of a semiconductor device of a first embodiment.

FIG. 1 is a conceptual illustration showing a configuration of a semiconductor device of a first embodiment. The semiconductor device shown in FIG. 1 is a semiconductor device having two chips (CH1, CH2) integrated in one package.

A chip (a semiconductor chip, a semiconductor piece) CH1 is mounted on a die pad DP1. The chip CH1 has a transformer composed of a lower-layer inductor (coil) Ia and an upper-layer inductor (coil) Ib. The upper-layer inductor Ib is connected to a pad region PD2 in a chip CH2 via a wire W. The lower-layer inductor Ia is connected to a peripheral circuit PC via a wiring (not shown). In the peripheral circuit PC, a logic circuit composed of an element (active element), such as a MISFET, is formed. The peripheral circuit PC is connected via a wiring (not shown) to a pad region PD2 disposed at the end of the chip CH1. The pad region PD2 is connected via a wire W and an unshown lead to a low-voltage region LC having a circuit drivable at low voltage (for example, 50 V or less).

The chip CH2 is mounted on a die pad DP2. The chip CH2 has a transformer composed of a lower-layer inductor Ia and an upper-layer inductor Ib. The upper-layer inductor Ib is connected to a pad region PD2 in the chip CH1 via a wire W. The lower-layer inductor Ia is connected to a peripheral circuit PC via a wiring (not shown). In the peripheral circuit PC, a logic circuit or the like composed of an element, such as a MISFET, is formed. The peripheral circuit PC is connected via a wiring (not shown) to a pad region PD2 disposed at the end of the chip CH2. The pad region PD2 is connected via a wire W and a lead (not shown) to a high-voltage region HC having a circuit driven at high voltage (for example, an AC RMS value of 100 Vrms or more).

For example, a transmission circuit in the peripheral circuit PC of the chip CH1 causes pulsed current to flow in the inductor Ia. At this time, the direction of the electric current caused to flow in the inductor Ia is changed based on whether an electrical signal (a transmission signal, data) is "1" or "0". This current of the inductor Ia produces induced voltage in the upper-layer inductor Ib. This voltage is transferred to the chip CH2 via the wire W, amplified at a receiving circuit in the peripheral circuit PC of the chip CH2, and further, latched. In this manner, the electrical signal can be wirelessly transferred by means of magnetic induction coupling. In other words, by connecting, via the transformer, the low-voltage region LC and the high-voltage region HC which are electrically insulated from each other, an electrical signal can be transferred between these regions (LC, HC).

In addition, by forming inductors (Ia, Ib) constituting a transformer in the same manner as a wiring or the like by means of microfabrication for forming a semiconductor device, the peripheral circuits PC and the inductors (Ia, Ib) can be integrated and formed on the same chip.

Figure 3:
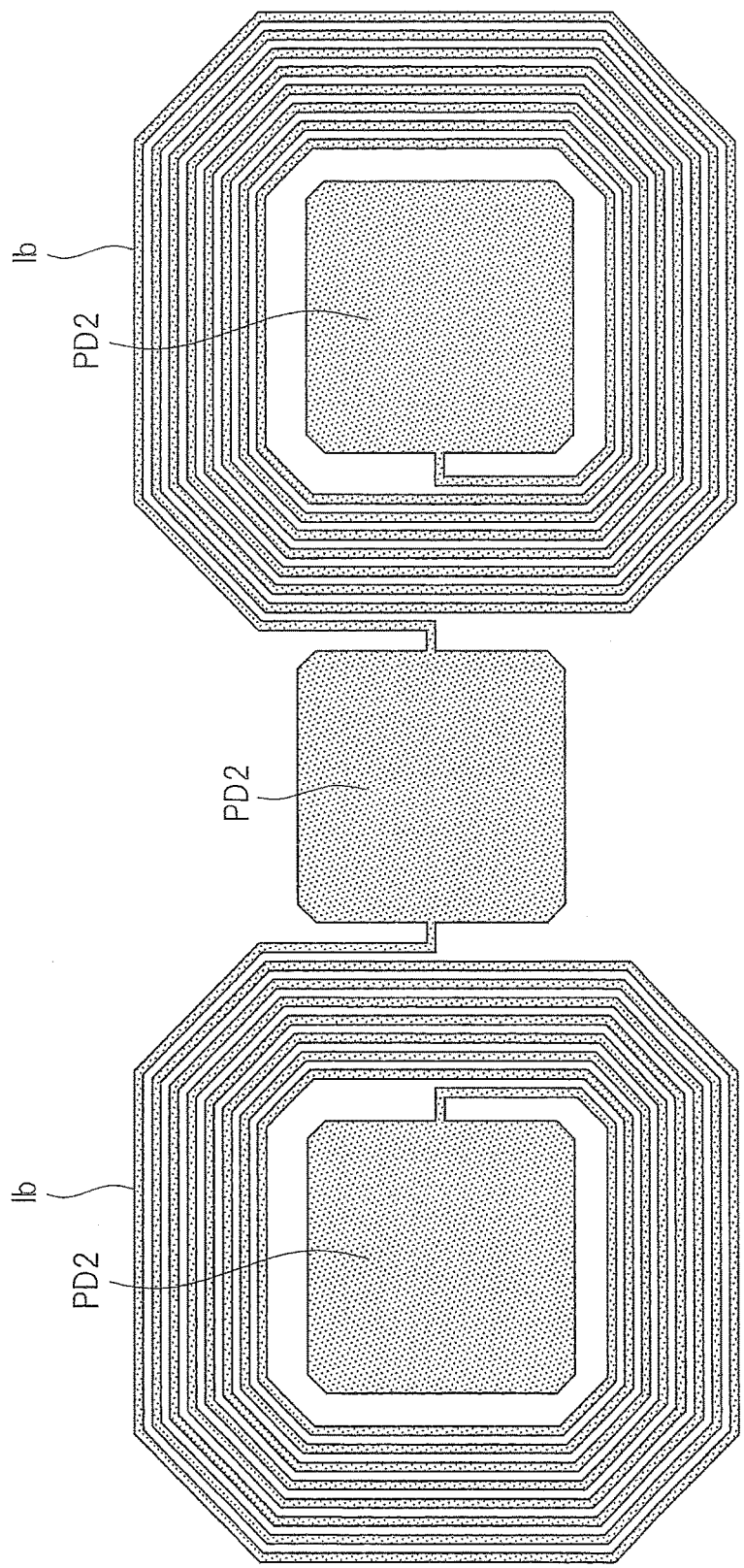
FIG. 3 is a plan view showing an exemplary configuration of an inductor of the semiconductor device of the first embodiment.

The shape of a conductive pattern constituting the transformer, as shown in FIG. 1, can be a spiral conductive pattern (see FIG. 3).

Figure 2:
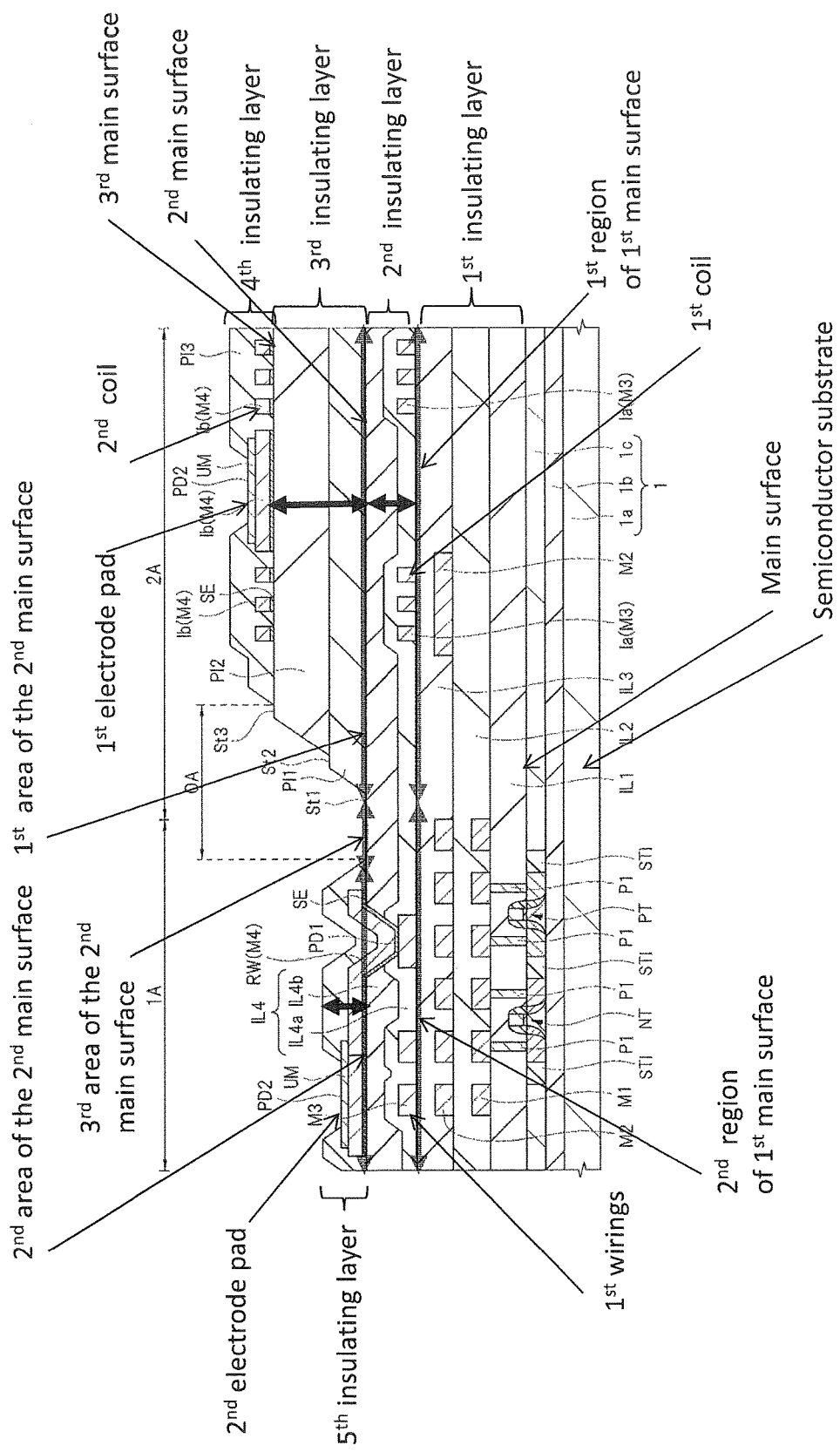
FIG. 2 is a sectional view showing the configuration of the semiconductor device of the first embodiment.

FIG. 2 is a sectional view showing the configuration of the semiconductor device of the first embodiment. The semiconductor device shown in FIG. 2 is a semiconductor device having a transformer, and, for example, corresponds to a cross section taken along the line A-A in FIG. 1.

The semiconductor device of the first embodiment is formed by utilizing an SOI (Silicon on Insulator) substrate, and has a peripheral circuit forming region 1A and a transformer forming region 2A.

An SOI substrate 1 has a supporting substrate 1a, an insulating layer (a buried insulating layer, BOX) 1b formed on the supporting substrate 1a, and a semiconductor layer (for example, a silicon layer 1c) formed on the insulating layer 1b.

In the peripheral circuit forming region 1A, a semiconductor element, such as a MISFET (Metal Insulator Semiconductor Field Effect Transistor), is formed. The MISFET constitutes the peripheral circuit PC shown in FIG. 1, for example. A MISFET is here exemplified as a semiconductor element, but, in addition to a MISFET, a capacitor, a memory element, a transistor having another configuration, or the like may be formed in the peripheral circuit forming region 1A.

Further, an interlayer insulating film IL1 is formed on MISFETs (NT, PT), and first-layer wirings M1 are formed on the interlayer insulating film IL1. The MISFETs (NP, PT) and the first-layer wirings M1 are connected together via plugs P1. In addition, second-layer wirings M2 are formed on the first-layer wirings M1 via an interlayer insulating film IL2. The first-layer wirings M1 and the second-layer wirings M2 are connected together via plugs (not shown) formed in the interlayer insulating film IL2. In addition, third-layer wirings M3 are formed on the second-layer wirings M2 via an interlayer insulating film IL3. The second-layer wirings M2 and the third-layer wirings M3 are connected together via plugs (not shown) formed in the interlayer insulating film IL3. In the semiconductor device of the first embodiment, the third-layer wirings M3 are uppermost-layer wirings. That is, by the wirings to the third-layer wirings M3, desired wire connection of the semiconductor elements (for example, the above-described MISFET) is achieved, and desired operation can be performed. Therefore, for example, pad regions PD1 that are exposed parts of the third-layer wirings (uppermost-layer wirings) can be utilized to perform a test (test step) to determine whether or not the semiconductor device performs the desired operation.

Rewirings RW are formed on the third-layer wirings M3 via an interlayer insulating film (an insulating film, a protective film) IL4. The interlayer insulating film IL4 is composed of a laminated film of an insulating film IL4a and an insulating film IL4b on the insulating film IL4a. The rewirings RW are wiring that draws out, to desired regions (pad regions PD2) of the chip, the pad region PD1 which is a part of the uppermost-layer wirings (here, the third-layer wirings M3).

A transformer having an inductor Ia and an inductor Ib is formed in the transformer forming region 2A. The lower-layer inductor Ia is formed in the same layer as the third-layer wirings M3. The inductor Ib is formed on the Inductor Ia via the interlayer insulting film IL4 and polyimide films PI1 and PI2. The polyimide films PI1 and PI2 are not formed in the peripheral circuit forming region 1A. That is, a step St1 is formed between the interlayer insulating film IL4 (insulating film IL4b) and the polyimide film PI1. Thus, a height difference corresponding to the film thickness of the polyimide films PI1 and PI2 (a laminated film, a laminated insulating film) exists between the forming position of the inductor Ia and the forming position of the rewiring RW, but the inductor Ia and the rewiring RW are formed of the same material (the same step). In addition, the polyimide film PI2 is so formed as to be retreated from the end of the polyimide film PI1. In other words, the polyimide films PI1 and PI2 are formed in a stairs-like shape (pyramid shape). That is, a step St2 is formed between the polyimide films PI1 and PI2. The polyimide film is a polymer having a recurring unit containing an imide bond, and is a kind of organic insulating film. Other than the polyimide film, another organic insulating film, such as epoxy, PBO, acrylic, or WRP resins, can be used. Polyimide resins are organic resins preferably used for a device requiring high resistance to 200° C. or higher heat, and can be differently used based on the coefficient of thermal expansion, mechanical strength, such as ductility, or cure temperature of a material. In addition, a silicon oxide film or a silicon nitride film can be preferably used as inorganic insulating films (IL1, IL2, IL3, IL4a, etc.) used in the first embodiment, but the inorganic insulating films are not limited to the silicon oxide film and the silicon nitride film.

Since the laminated structure of the polyimide films PI1 and PI2 is adopted in this manner, the film thickness of an insulating film between the inductors Ia, Ib can be increased. This can improve withstand voltage between the inductors Ia, Ib.

Further, since the polyimide films PI1 and PI2 are so formed in a stairs-like shape as to have the steps St1, St2, the film formability of the polyimide films PI1 and PI2 can be improved, so that peeling-off of the polyimide films PI1 and PI2 can be reduced.

A polyimide film PI3 is formed on the rewiring RW and the inductor Ia. The polyimide film PI3 is so formed as to be retreated from the end of the polyimide film PI2. In other words, in the transformer forming region 2A, a step St3 is formed between the polyimide film PI2 and the polyimide film PI3. In addition, the polyimide film PI3 in the border between the peripheral circuit forming region 1A and the transformer forming region 2A is so removed that an opening portion (recess) OA through which at least the interlayer insulating film IL4 (insulating film IL4b) is exposed is formed.

Thus, since the rewiring RW is covered with the polyimide film PI3, the rewiring RW can be protected. Further, since the inductor Ib is covered with the polyimide film PI3, the inductor Ib can be protected. In addition, since the polyimide film PI3 is so formed as to be retreated from the end of the polyimide film PI2 such that a laminated film of polyimide films (PI1 to PI3) is formed in a stairs-like shape (pyramid shape) in the transformer forming region 2A, a creepage distance between the pad region PD2 of the peripheral circuit forming region 1A and the pad region PD2 of the transformer forming region 2A can be increased, so that withstand voltage can be improved (see FIG. 38 for a third embodiment, FIG. 41 for a fourth embodiment, etc.).

Regarding the configuration of the inductor, the shape thereof is not limited as long as the inductor can generate a magnetic field when electric current flows, but it is preferred that a conductive film (a conducting film, a conductor film) having a spiral planar shape be used. FIG. 3 is a plan view showing a configuration example of an inductor of the semiconductor device of the first embodiment. The inductor shown in FIG. 3 corresponds to the upper-layer inductor Ib, for example. In FIG. 3, the inductor is composed of a conductive film having a spiral planar shape as viewed from above, and two spiral conductive films are arranged symmetrically with respect to the center line of the pad region PD2 located in the center in FIG. 3. Further, an inner end of the spiral conductive film located on the left side in FIG. 3 is connected to the pad region PD2 located in the center of the spiral. In addition, an inner end of the spiral conductive film located on the right side in FIG. 3 is connected to the pad region PD2 located in the center of the spiral. In the first embodiment, the set of conductive films including the pad regions PD2 is referred to as an inductor. Each pad region PD2 is connected to a receiving circuit (Rx) of another chip, for example, by, a wire (W) or the like (see FIG. 34, FIG. 35, etc.).

The lower-layer inductor Ia is composed of a spiral conductive film, like the upper-layer inductor Ib, and, for example, can be formed in a spiral planar shape shown in FIG. 3 as viewed from above. An end (pad region) of the spiral conductive film is connected to a transmission circuit (Tx) via a wiring in a layer below the inductor Ia, for example (see FIG. 34, FIG. 35, etc.).

[Description of Manufacturing Method]

Next, with reference to FIGS. 4 to 27, a method of manufacturing the semiconductor device of the first embodiment will be described, and the configuration of the semiconductor device will be made clearer. FIGS. 4 to 27 are sectional views showing manufacturing steps of the semiconductor device of the first embodiment.

Figure 4:
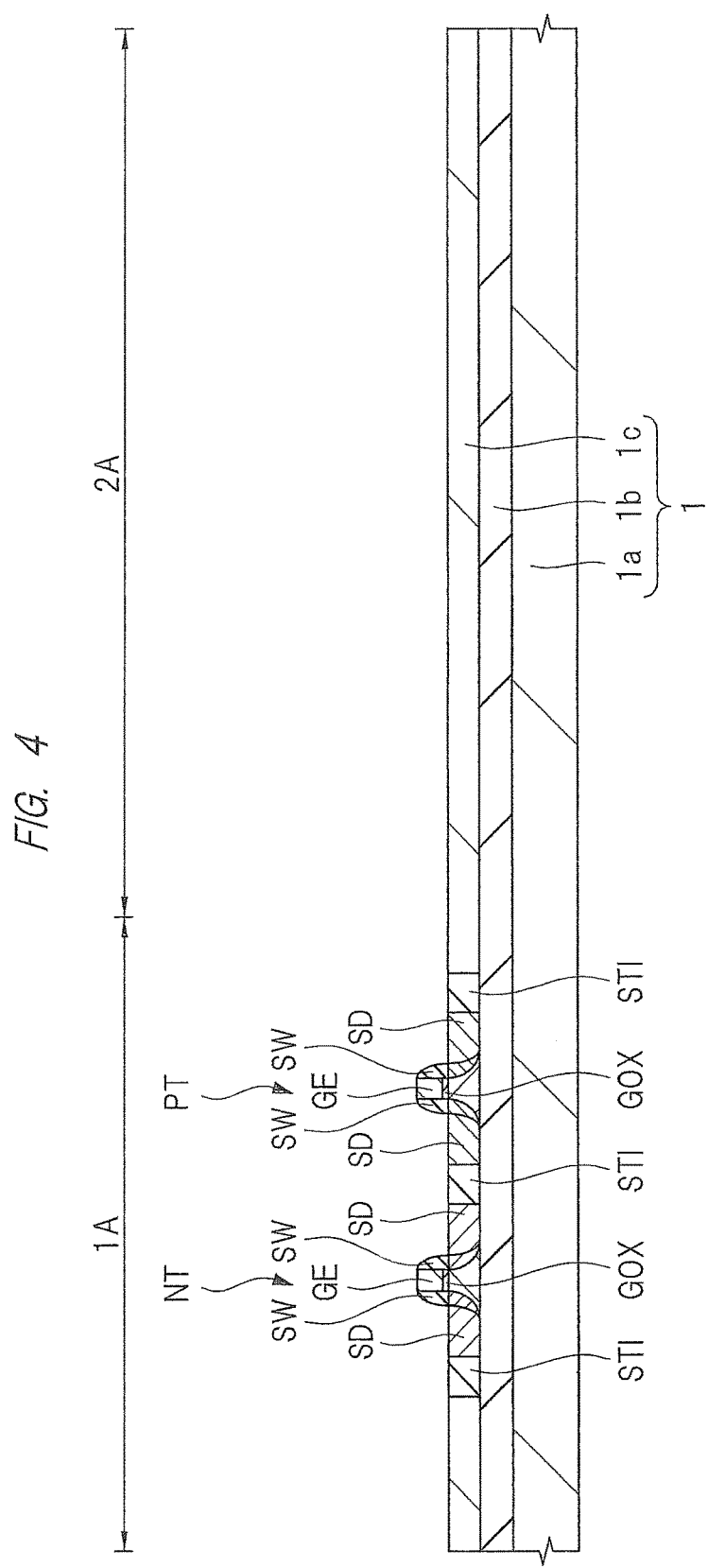
FIG. 4 is a sectional view showing a manufacturing step of the semiconductor device of the first embodiment.

As shown in FIG. 4, an SOI substrate, for example, is prepared as a semiconductor substrate. The SOI substrate 1 is composed of a supporting substrate 1a composed of silicon single crystal (semiconductor film), an insulating layer (a buried insulating layer, BOX) 1b formed on the supporting substrate 1a, and a silicon layer (a semiconductor layer, a semiconductor film, a thin-film semiconductor film, a thin-film semiconductor region) 1c formed on the insulating layer 1b. The SOI substrate 1 has a peripheral circuit forming region 1A and a transformer forming region 2A.

Next, a device isolation insulating film STI is formed in the silicon layer 1c of the SOI substrate 1. The device isolation insulating film STI is provided to prevent elements from interfering with each other. The device isolation region can be formed by means of an STI (shallow trench isolation) process, for example.

For example, by means of a photolithography technique and an etching technique, a device isolation trench is formed on the silicon layer 1c of the SOI substrate 1. The photolithography technique is a technique to form a photoresist film (mask film) having a desired shape by forming a photoresist film on a film to be etched (here, the silicon film 1c) and exposing and developing the photoresist film. In addition, removing a film to be etched (here, the silicon film 1c) is referred to as etching, and here, since an underlayer film to be etched (here, the silicon film 1c) is removed using a photoresist film as a mask, the film to be etched can be selectively removed. Incidentally, after the etching step, the photoresist film is removed by an ashing process or the like.

Next, a silicon oxide film is so deposited on the SOI substrate 1 by a CVD (Chemical Vapor Deposition) process or the like as to be thick just enough to fill in the device isolation trench, and the silicon oxide film outside the device isolation trench is removed by a chemical mechanical polishing (CMP) process, an etching-back process, or the like. Thus, the silicon oxide film can be buried in the device isolation trench. The device isolation insulating film STI can also be formed by means of a LOCOS (Local Oxidation of Silicon) process.

Next, MISFETs (NT, PT) are formed in the peripheral circuit forming region 1A. Although the method of forming the MISFETs is not limited, the MISFETs can be formed according to the following steps, for example.

First, a gate insulating film GOX is formed on the SOI substrate 1, and further a polycrystalline silicon film is formed on top of the gate insulating film GOX. Although the method of forming the gate insulating film GOX is not limited, the gate insulating film GOX is formed by thermally oxidizing the surface of the silicon layer 1c, for example. In that case, the gate insulating film GOX is composed of a silicon oxide film. Other than the silicon oxide film, a silicon oxynitride film may be used as the gate insulating film GOX. A high-dielectric-constant film (so-called high-k film) can also be used as the gate insulating film GOX. Further, a film forming process other than the thermal oxidation process, such as a CVD process, can also be used to form the gate insulating film GOX.

The polycrystalline silicon film on the gate insulating film GOX can be formed by means of a CVD process, for example. It should be noted that according to the characteristics of each MISFET (NT, PT), impurities may be implanted in regions for forming gate electrodes GE. That is, impurities are implanted in a desired region in the polycrystalline silicon film.

Next, the gate electrodes GE are formed by patterning the polycrystalline silicon film by means of the photolithography technique and the etching technique. Next, source/drain regions SD having an LDD structure are formed in the silicon layers 1c on both sides of each gate electrode GE.

First, an n⁻-type semiconductor region (low-concentration n-type impurity region) is formed by forming a photoresist film (not shown) having an opening portion in an n-channel type MISFET (NT) forming region of the peripheral circuit forming region 1A, and then ion-implanting n-type impurities using the photoresist film and the gate electrode GE as masks. Thereafter, the photoresist film is removed.

Next, a p⁻-type semiconductor region (low-concentration p-type impurity region) is formed by forming a photoresist film (not shown) having an opening portion in a p-channel type MISFET (PT) of the peripheral circuit forming region 1A, and then ion-implanting p-type impurities using the photoresist film and the gate electrode GE as masks. Thereafter, the photoresist film is removed.

Next, a sidewall film SW is formed on each sidewall of the gate electrodes GE by forming a silicon oxide film by a CVD process, for example, as an insulating film on the SOI substrate 1, and then anisotropically etching this silicon oxide film.

Next, an n⁺-type semiconductor region (high-concentration n-type impurity region) is formed by forming a photoresist film (not shown) having an opening portion in the n-channel type MISFET (NT) forming region of the peripheral circuit forming region 1A, and then ion-implanting n-type impurities using the photoresist film, the gate electrode GE, and the sidewall films SW as masks. Thereafter, the photoresist film is removed.

Next, a p⁺-type semiconductor region (high-concentration p-type impurity region) is formed by forming a photoresist film (not shown) having an opening portion in the p-channel type MISFET (PT) forming region of the peripheral circuit forming region 1A, and then ion-implanting p-type impurities using the photoresist film, the gate electrode GE, and the sidewall films SW as masks. Thereafter, the photoresist film is removed. Next, a thermal treatment (annealing) is performed to activate impurity ions implanted at the previous steps.

According to the above steps, MISFETs (NT, PT) having the source/drain region SD having an LDD structure having a high-concentration impurity region and a low-concentration impurity region can be formed.

Figure 5:
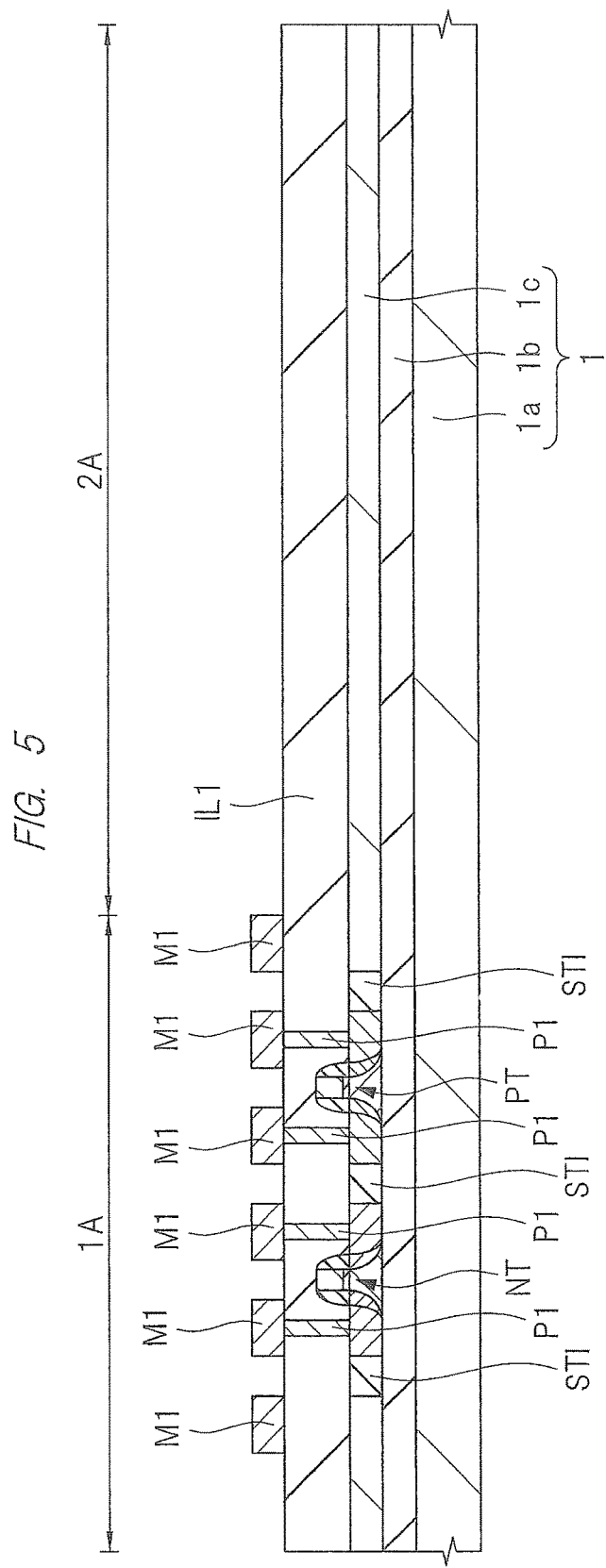
FIG. 5 is a sectional view showing the manufacturing step of the semiconductor device of the first embodiment, continued from FIG. 4.

Next, as shown in FIG. 5, the interlayer insulating film IL1 is formed on the SOI substrate 1, including on the MISFETs (NT, PT). For example, after a silicon oxide film is deposited by a CVD process, the surface of the interlayer insulating film IL1 is planarized by means of a CMP process or the like, if necessary.

Next, contact holes are formed by patterning the interlayer insulating film IL1. Next, plugs P1 are formed by burying a conductive film in the contact holes. For example, a laminated film of a titanium film and a titanium nitride film is deposited on the interlayer insulating film IL1 including the inside of the contact holes as a barrier film by a sputtering process or the like. Next, on the barrier film, a tungsten (W) film as a main conductive film is so deposited by a CVD process or the like as to be thick just enough to fill the contact holes. Next, the barrier film and the main conductive film which are unnecessary on the interlayer insulating film IL1 are removed by a CMP process. Thereby, the plugs P1 are formed.

Next, on the interlayer insulating film IL1 and the plugs P1, a laminated film is formed as a conductive film by sequentially depositing a titanium/titanium-nitride film, an aluminum film, and a titanium/titanium-nitride film, for example, by means of a sputtering process or the like. Next, first-layer wirings M1 are formed on the plugs P1 by patterning the laminated film by means of the photolithography technique and the etching technique.

Figure 6:
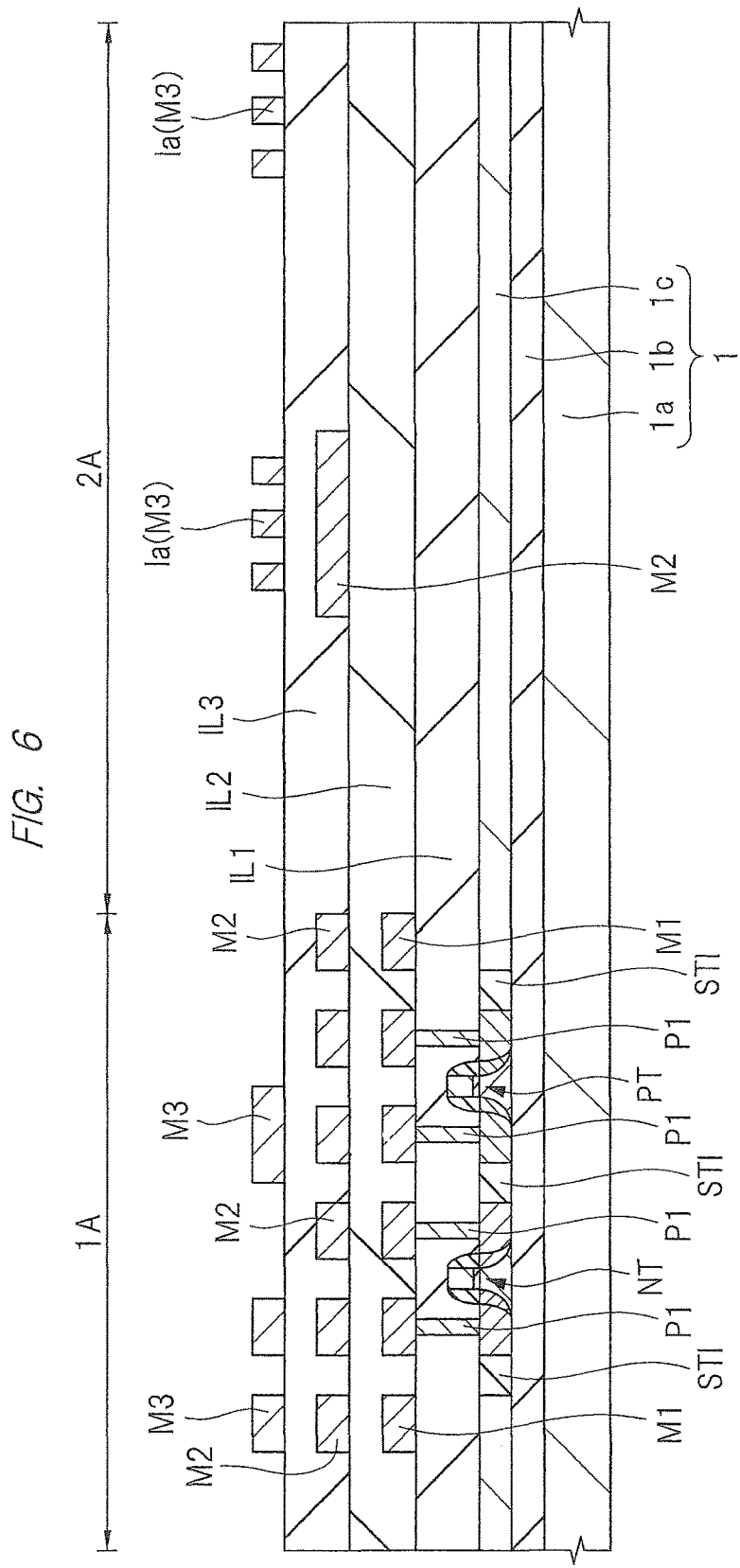
FIG. 6 is a sectional view showing the manufacturing step of the semiconductor device of the first embodiment, continued from FIG. 5.

Next, as shown in FIG. 6, the interlayer insulating film IL2 composed of a silicon oxide film is formed on the first-layer wirings M1 by a CVD process or the like. Next, contact holes (not shown) are formed on the first-layer wirings M1 by patterning the interlayer insulating film IL2. Next, plugs (not shown) are formed in the interlayer insulating film IL2 by burying a conductive film in the contact holes. These plugs can be formed in the same manner as the plugs P1.

Next, on the interlayer insulating film IL2 and the plugs, a laminated film is formed as a conductive film by sequentially depositing a titanium/titanium-nitride film, an aluminum film, and a titanium/titanium-nitride film, for example, by means of a sputtering process or the like. Next, second-layer wirings M2 are formed on the plugs by patterning the laminated film by means of the photolithography technique and the etching technique.

Next, the interlayer insulating film IL3 composed of a silicon oxide film is formed on the second-layer wirings M2 by a CVD process or the like. Next, contact holes (not shown) are formed on the second-layer wirings M2 by patterning the interlayer insulating film IL3.

Next, plugs (not shown) are formed in the interlayer insulating film IL3 by burying a conductive film in the contact holes. These plugs can be formed in the same manner as the plugs P1.

Next, on the interlayer insulating film IL3 and the plugs, a laminated film is formed as a conductive film by sequentially depositing a titanium/titanium-nitride film, an aluminum film, and a titanium/titanium-nitride film, for example, by means of a sputtering process or the like. Next, third-layer wirings M3 are formed on the plugs by patterning the laminated film by means of the photolithography technique and the etching technique.

Here, in the transformer forming region 2A, a lower-layer inductor Ia is formed in the same layer as the third-layer wirings M3. That is, at the time of patterning the above laminated film, the above-described spiral conductive film (inductor Ia) is formed in the transformer forming region 2A (see FIG. 3).

Of course, the second-layer wiring M2 (for example, a wiring that electrically connects the lower-layer inductor Ia and a peripheral circuit) can also be formed in the transformer forming region 2A. Also, the first-layer wiring M1 can be formed in the transformer forming region 2A.

Figure 7:
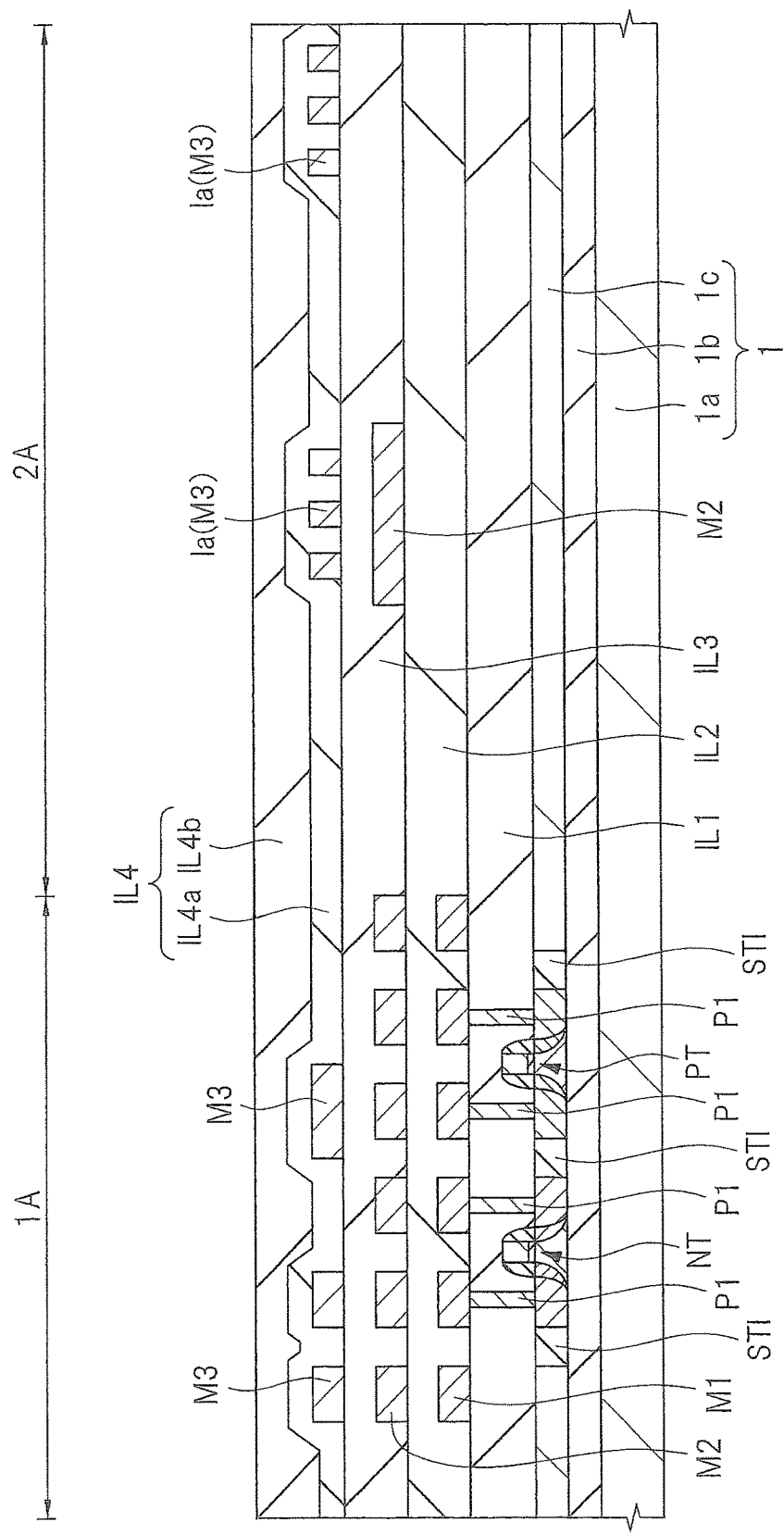
FIG. 7 is a sectional view showing the manufacturing step of the semiconductor device of the first embodiment, continued from FIG. 6.

Next, as shown in FIG. 7, an insulating film IL4a is formed on the third-layer wirings M3 (here, the uppermost layer wirings) and the interlayer insulating film IL3. For example, the insulating film IL4a is formed by depositing a silicon nitride film having a film thickness of about 1 to 4 µm by a CVD process or the like.

Figure 8:
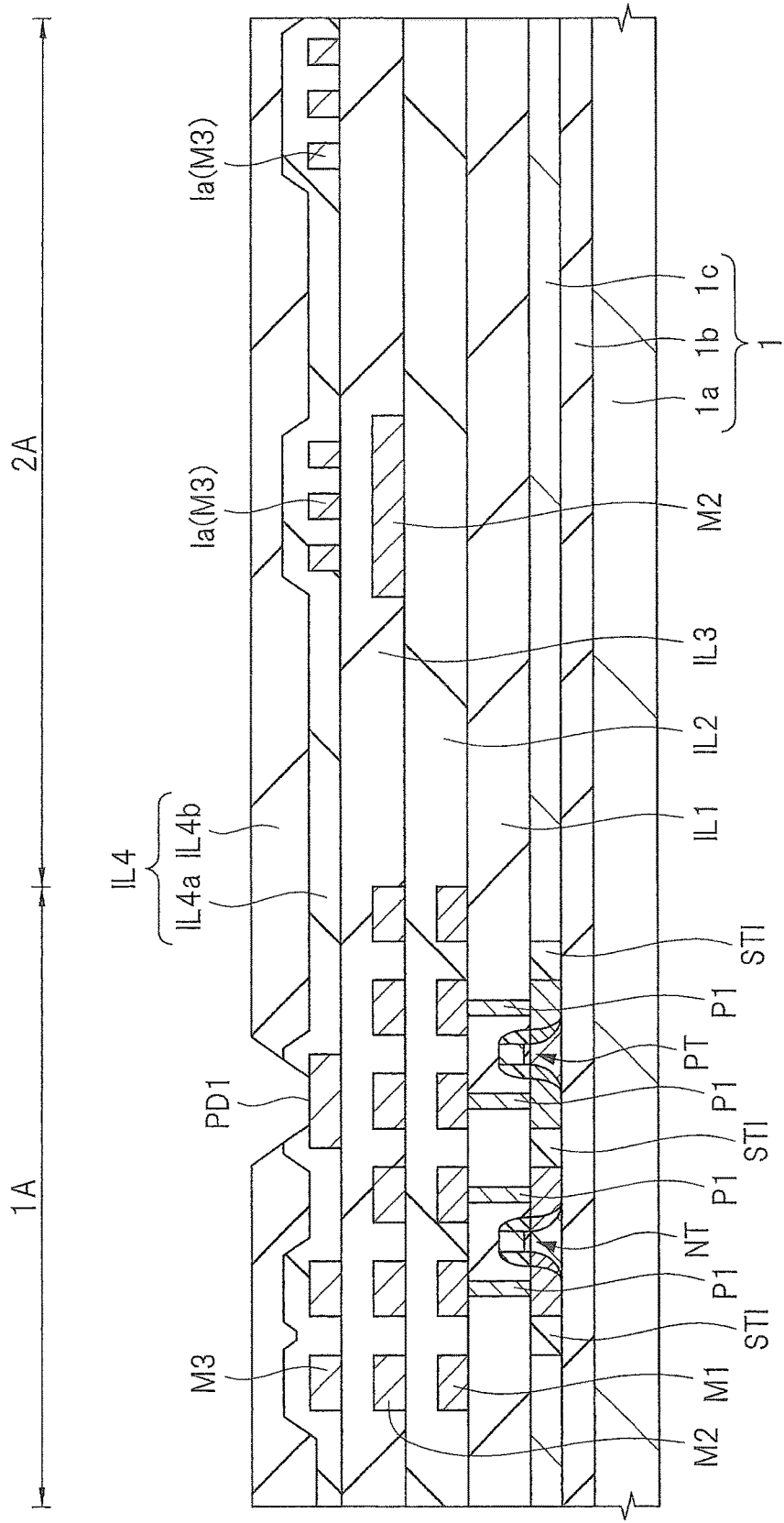
FIG. 8 is a sectional view showing the manufacturing step of the semiconductor device of the first embodiment, continued from FIG. 7.

Next, a photosensitive polyimide film, for example, is applied to the insulating film IL4a as an insulating film IL4b. For example, the polyimide film is formed by rotationally applying a polyimide precursor solution to the surface of the SOI substrate 1, and then drying the same. Next, as shown in FIG. 8, an opening portion (an opening region, an exposed portion of the third-layer wiring M3) is formed by removing the polyimide film (IL4b) in the pad region PD1 by exposing and developing the photosensitive polyimide film (IL4b). Thereafter, the polyimide film (IL4b) is cured by a thermal treatment. The film thickness of the polyimide film (IL4b) is about 3 to 10 µm, for example. Next, the third-layer wiring M3 in the pad region PD1 is exposed by removing the insulating film IL4a by etching. Thus, the interlayer insulating film IL4 having the opening portion in the pad region PD1 and composed of the laminated film of the insulating film IL4a and the insulating film IL4b is formed.

Figure 9:
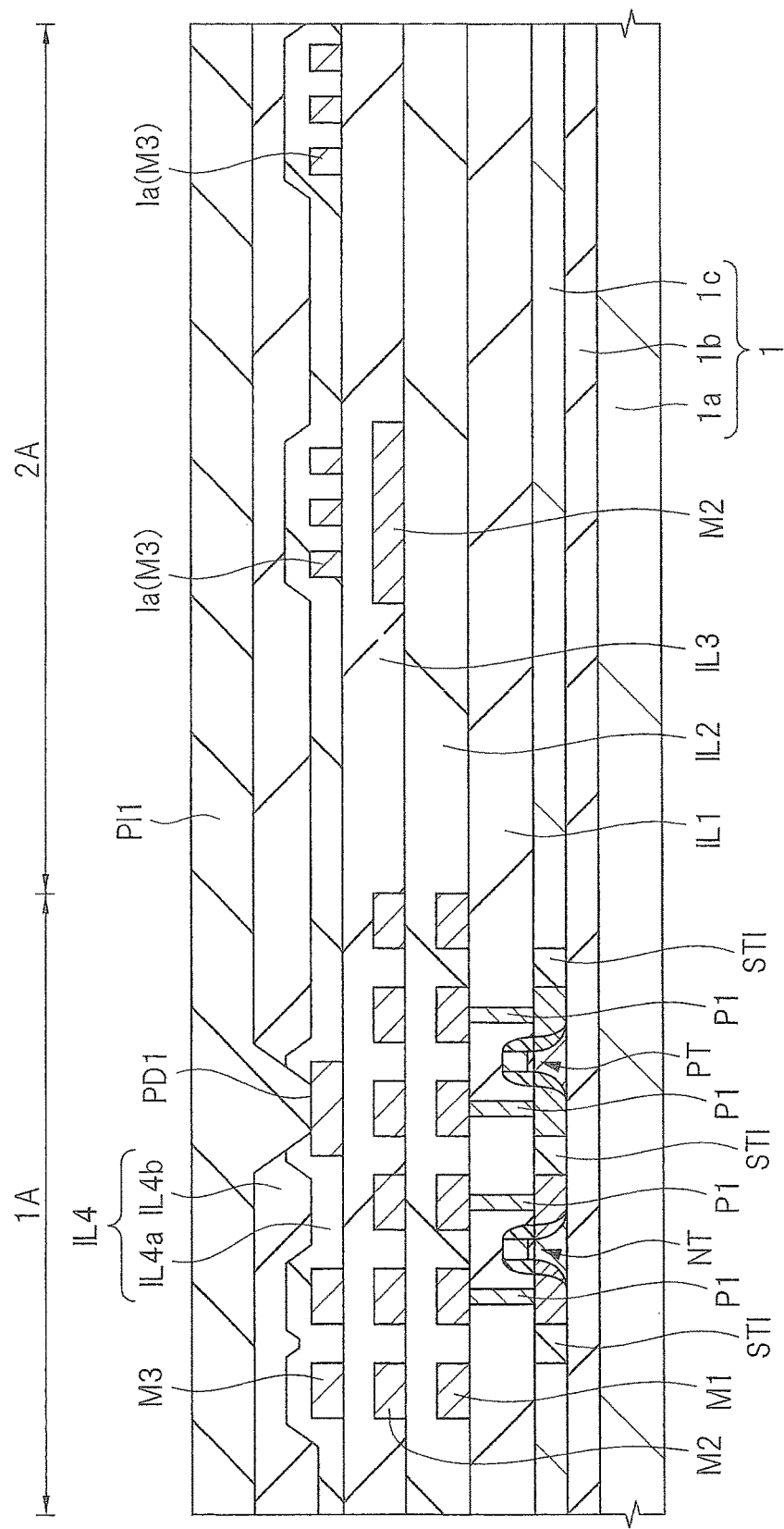
FIG. 9 is a sectional view showing the manufacturing step of the semiconductor device of the first embodiment, continued from FIG. 8.
Figure 10:
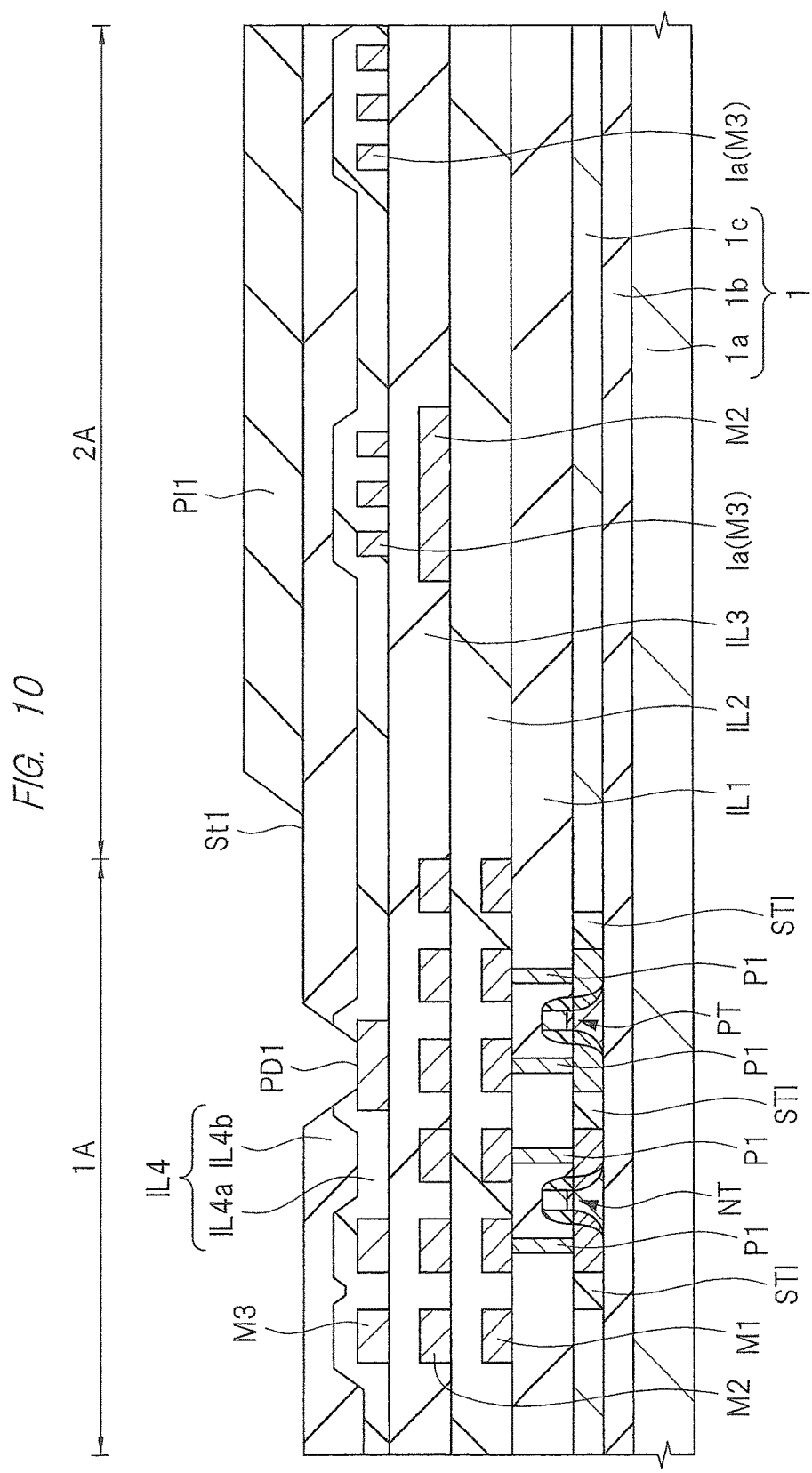
FIG. 10 is a sectional view showing the manufacturing step of the semiconductor device of the first embodiment, continued from FIG. 9.

Next, as shown in FIG. 9, a photosensitive polyimide film PI1 is applied to the insulating film IL4b including the pad region PD1 as a first insulating film (an interlayer insulating film, an insulating film for ensuring withstand voltage, an insulating film between inductors). For example, the polyimide film PI1 is formed by rotationally applying a polyimide precursor solution to the surface of the SOI substrate 1, and then drying the same. Next, as shown in FIG. 10, the polyimide film PI1 in the peripheral circuit forming region 1A is removed by exposing and developing the photosensitive polyimide film PI1. Thereafter, the polyimide film PI1 is cured by a thermal treatment. The film thickness of the polyimide film PI1 is about 3 to 10 µm, for example. Here, since the insulating film IL4b extends from the transformer forming region 2A to the peripheral circuit forming region 1A, the step St1 is formed between the insulating film IL4b and the polyimide film PI1.

Figure 11:
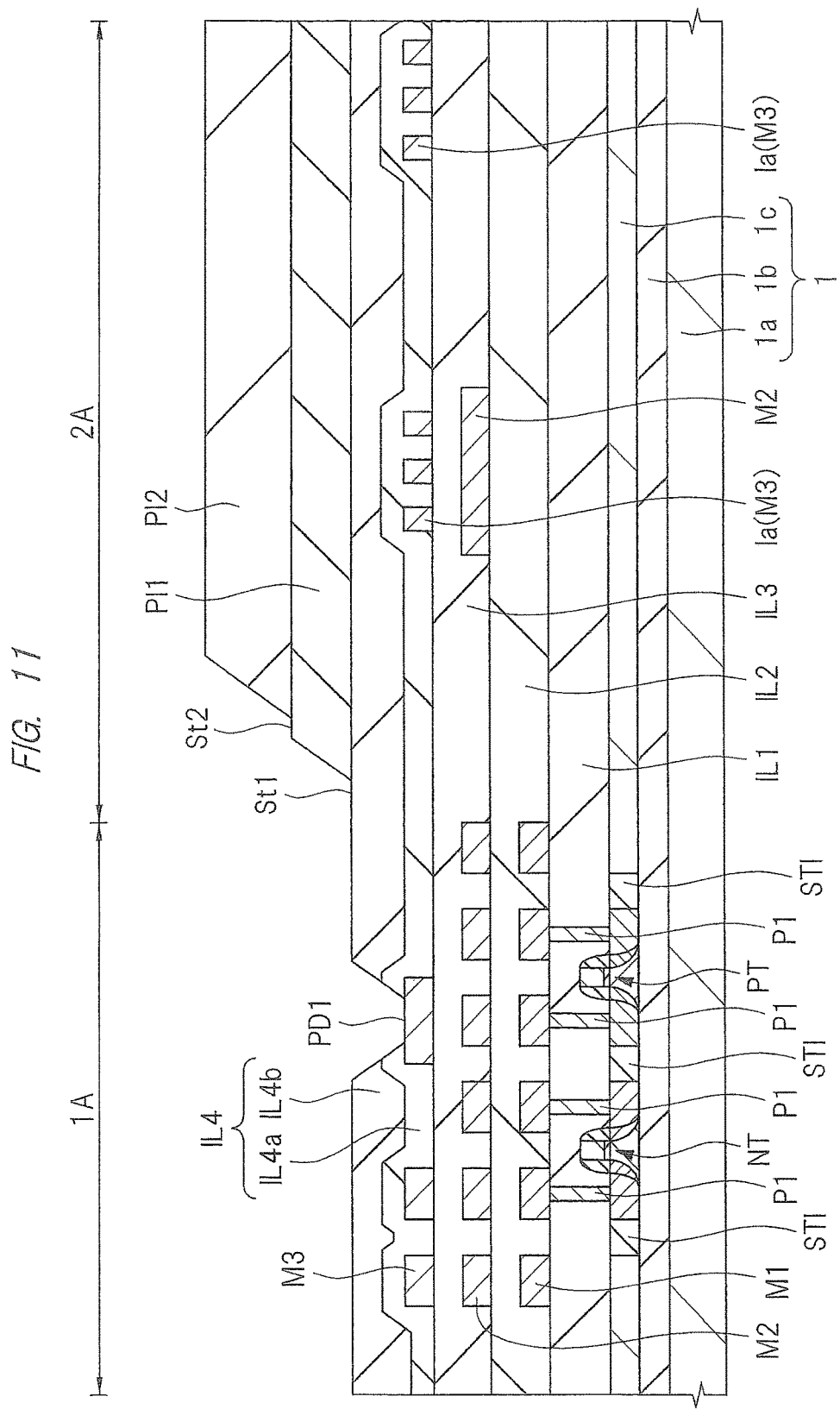
FIG. 11 is a sectional view showing the manufacturing step of the semiconductor device of the first embodiment, continued from FIG. 10.

Next, as shown in FIG. 11, a photosensitive polyimide film PI2 is applied on the insulating film IL4b including the pad region PD1 and the polyimide film PI1 as a second insulating film (an interlayer insulating film, an insulating film for ensuring withstand voltage, an insulating film between inductors). For example, the polyimide film PI2 is formed by rotationally applying a polyimide precursor solution to the surface of the SOI substrate 1, and then drying the same. Next, the polyimide film PI2 in the peripheral circuit forming region 1A is removed by exposing and developing the photosensitive polyimide film PI2. At this time, the polyimide film PI2 is retreated from the end of the polyimide film PI1. Thus, the end of the polyimide film PI1 is exposed, and the step St2 is formed between the polyimide film PI1 and the polyimide film PI2. Thereafter, the polyimide film PI2 is cured by a thermal treatment. The film thickness of the polyimide film PI1 is about 3 to 10 µm, for example. Further, the retreat amount of the polyimide film PI2, i.e., a distance between the end of the polyimide film PI1 and the end of the polyimide film PI2 (step width) is 50 µm to 100 µm, for example.

Since the polyimide films PI1 and PI2 are laminated in this manner, the film thickness of an insulating film between the inductors (Ia, Ib) can be increased. This can improve withstand voltage between the inductors Ia, Ib. In addition, since the polyimide films PI1 and PI2 are formed by repeating the steps of application, exposure and development, and cure, these films can be formed with good film formability. That is, if application, exposure and development, and cure are performed once to forma thick film, thermal contraction is increased at the thermal drying step in development, so that peeling-off of the film is caused or the flatness thereof is deteriorated. On the other hand, if polyimide films (PI1, PI2) are formed in a laminating manner by repeating the steps more than once, thermal contraction of each film is relatively small, so that the adhesiveness of these films is improved, and the flatness thereof is also improved.

Further, since the polyimide films PI1 and PI2 are so formed in a stairs-like shape as to have the steps St1, St2, the occurrence of a depression or peeling-off of the polyimide film PI2 due to defective exposure can be reduced. The details will be described later (see FIGS. 31 to 33, etc.).

Figure 12:
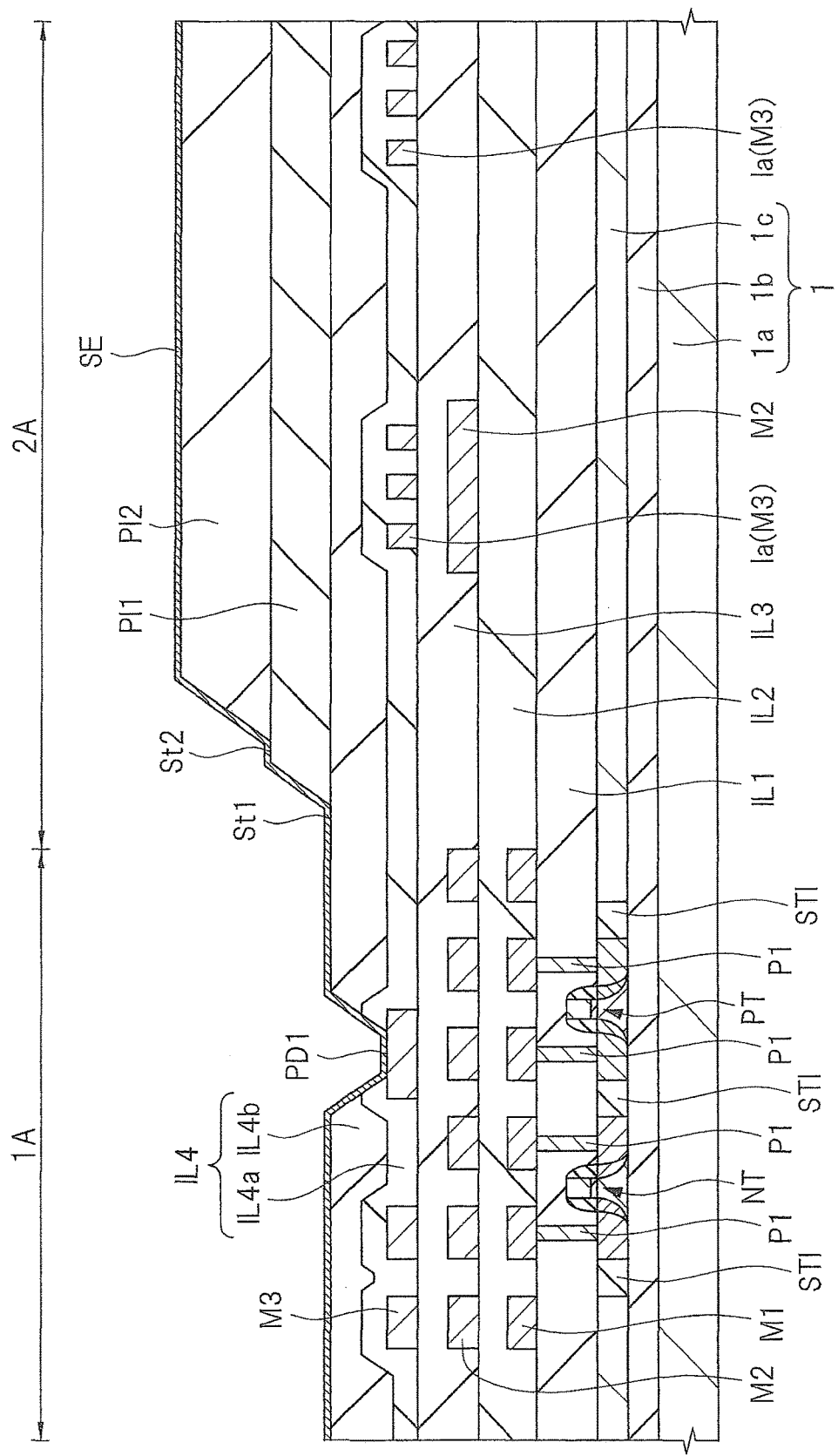
FIG. 12 is a sectional view showing the manufacturing step of the semiconductor device of the first embodiment, continued from FIG. 11.

Next, as shown in FIG. 12, on the insulating film IL4b including the pad region PD1, and the polyimide films PI1 and PI2, a barrier film (not shown) composed of a titanium (Ti) or Chromium (Cr) film, for example, is so deposited as to have a film thickness of about 75 nm by a sputtering process or the like, and further, on the barrier film (not shown), a copper thin film (copper film) is so deposited as a Cu seed layer (power feeding layer) SE for electrolytic plating as to have a film thickness of about 250 nm by a sputtering process or the like.

Here, according to the first embodiment, since depressions in the ends of the polyimide films PI1, PI2 or peeling-off thereof are reduced, the barrier film (not shown) or the Cu seed layer SE can be formed with good coatability. The details will be described later (see FIGS. 31 to 33, etc.).

Figure 13:
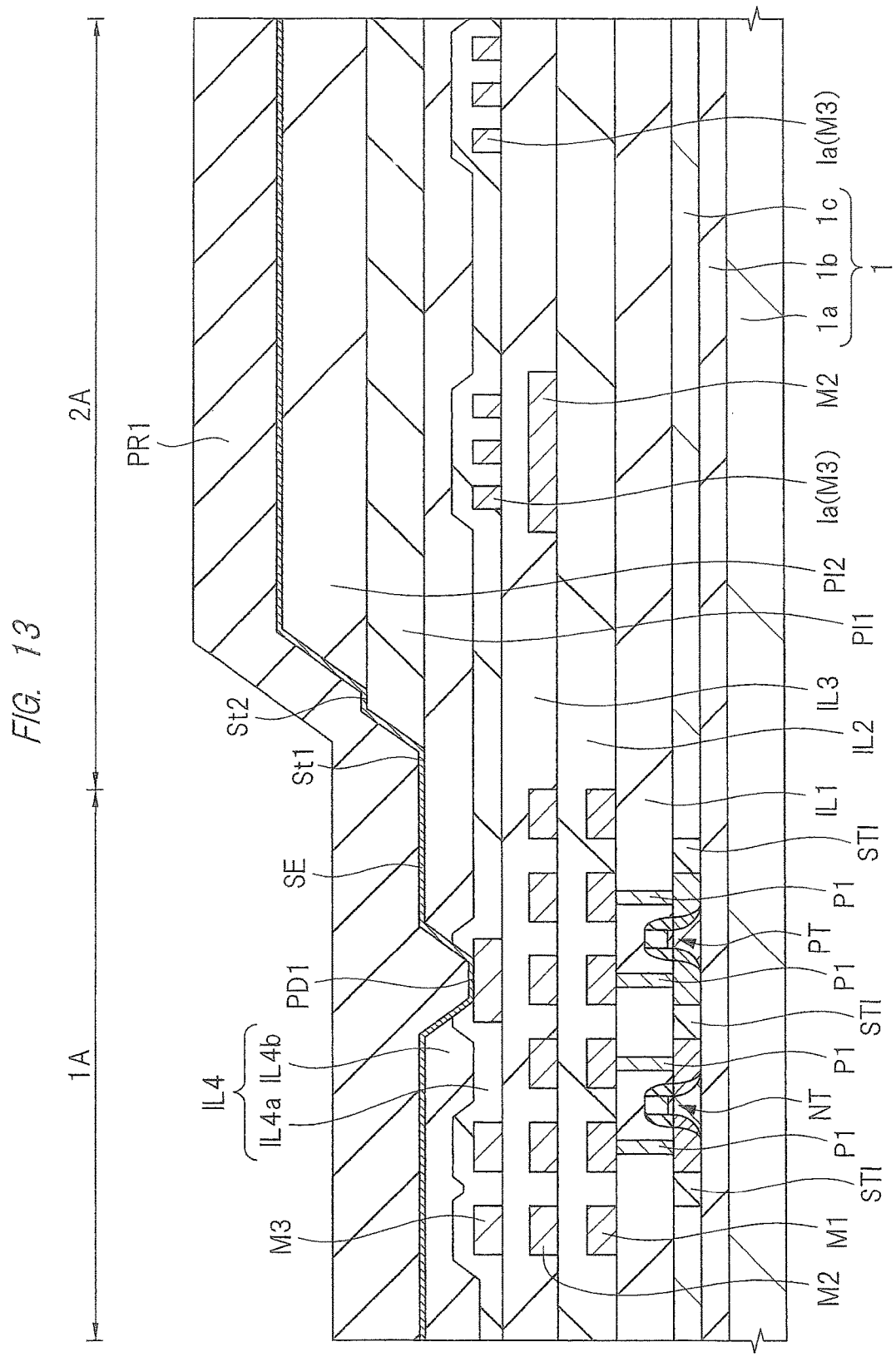
FIG. 13 is a sectional view showing the manufacturing step of the semiconductor device of the first embodiment, continued from FIG. 12.
Figure 14:
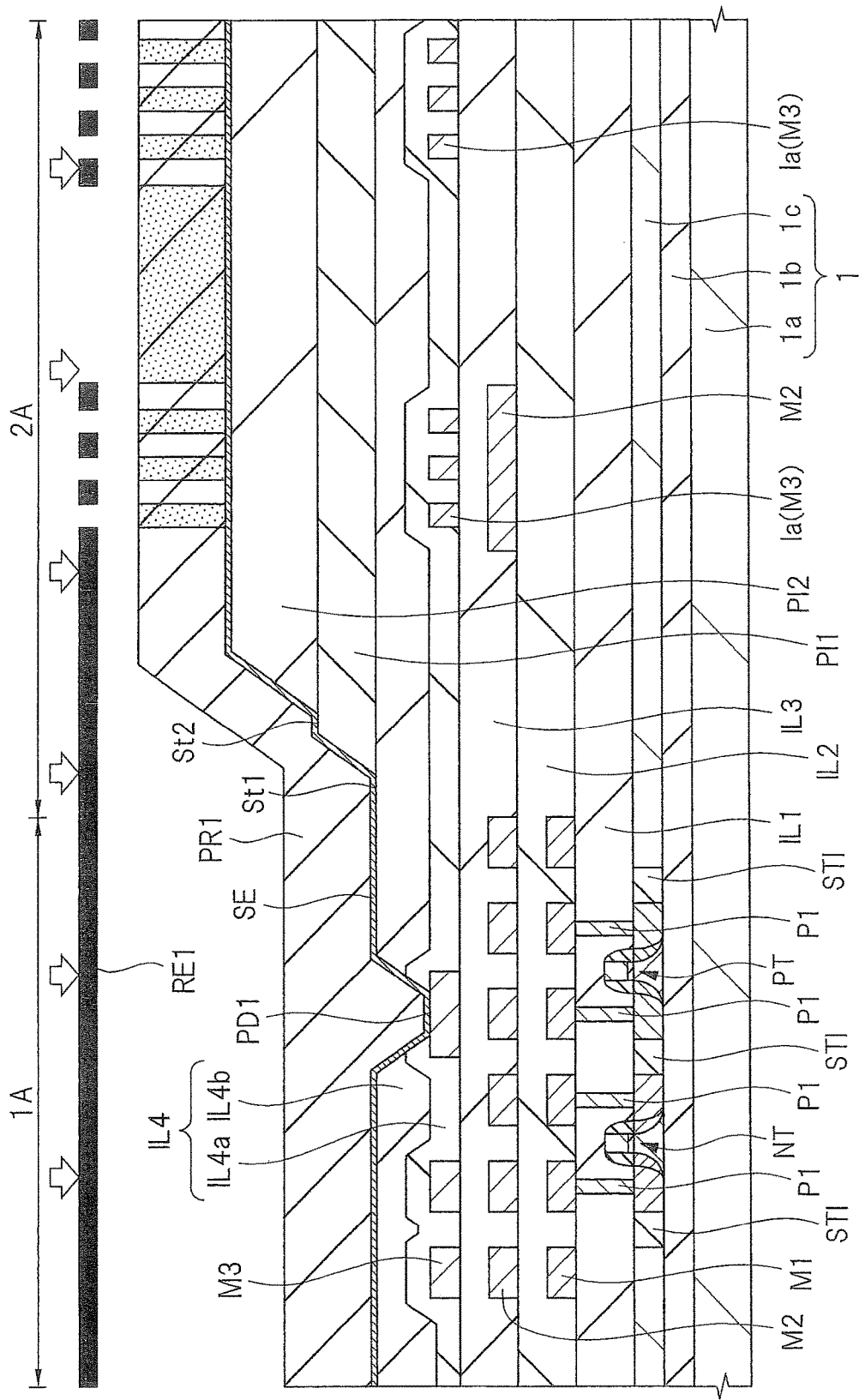
FIG. 14 is a sectional view showing the manufacturing step of the semiconductor device of the first embodiment, continued from FIG. 13.

Next, as shown in FIG. 13, a photoresist film PR1 is applied on the Cu seed layer SE. Next, as shown in FIG. 14, the photoresist film PR1 is exposed using as a mask a reticle RE1 on which a pattern of inductor Ib has been drawn. The pattern of inductor Ib can be the shape shown in FIG. 3 described above, for example.

Figure 15:
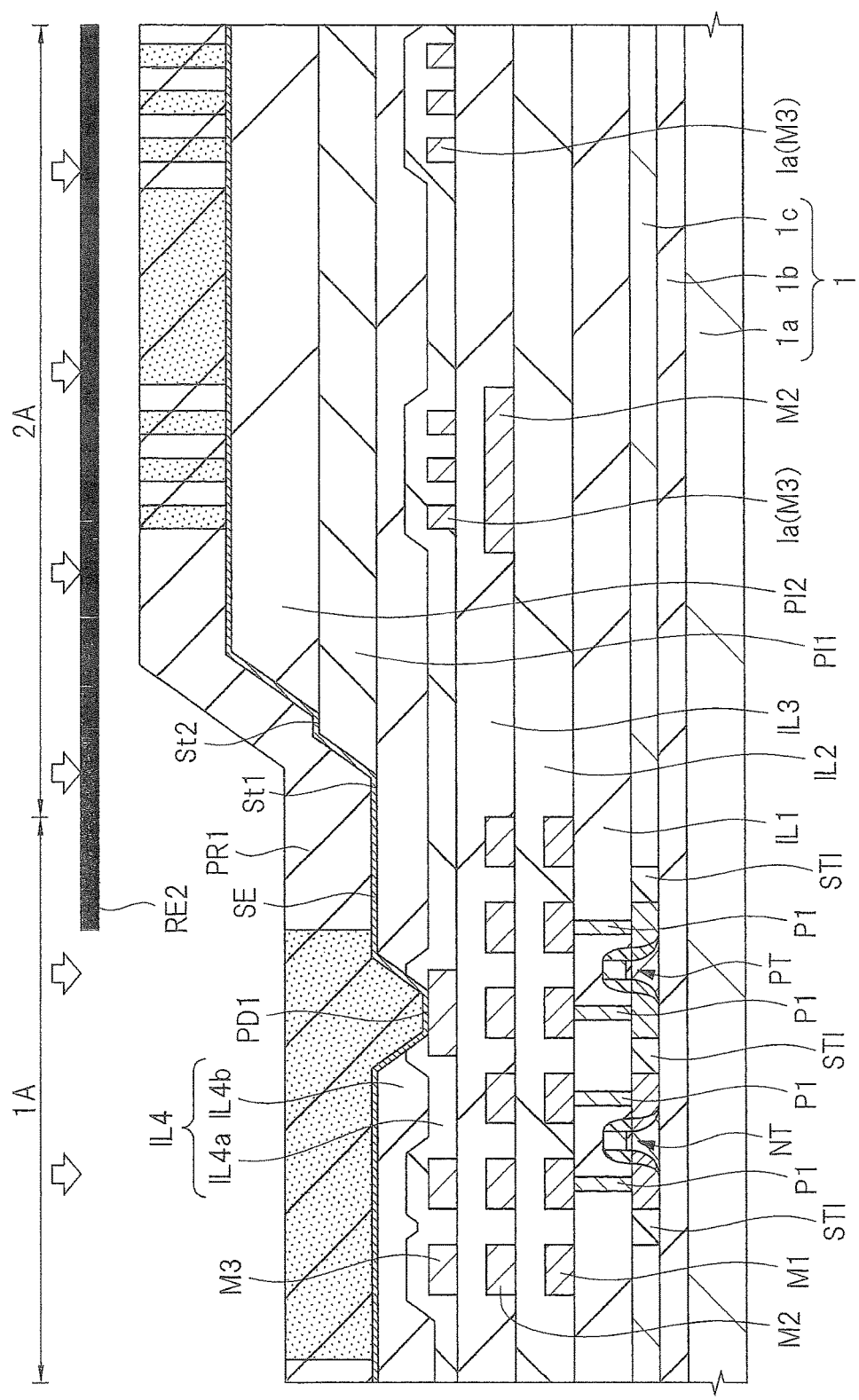
FIG. 15 is a sectional view showing the manufacturing step of the semiconductor device of the first embodiment, continued from FIG. 14.
Figure 16:
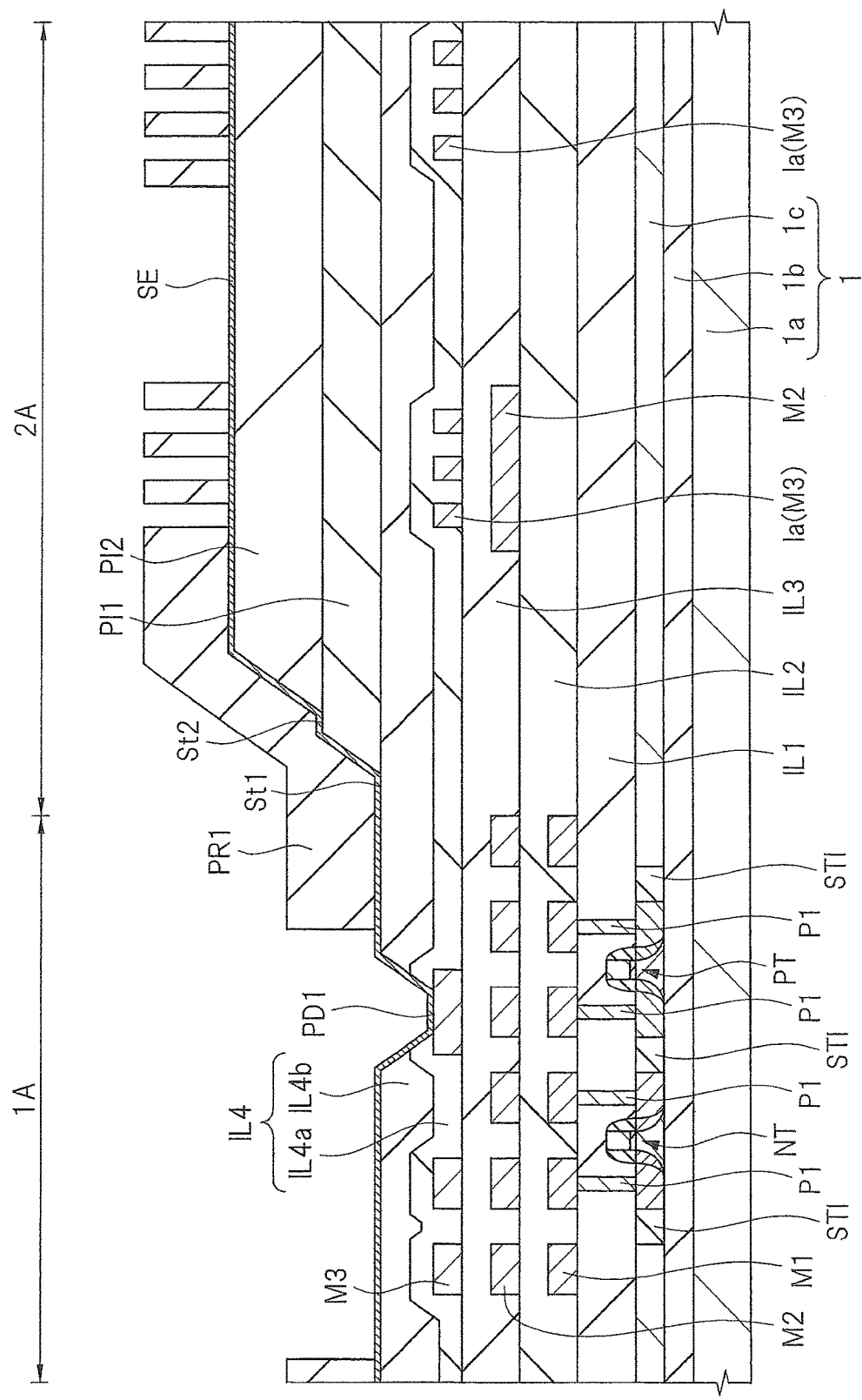
FIG. 16 is a sectional view showing the manufacturing step of the semiconductor device of the first embodiment, continued from FIG. 15.

Here, the photoresist film PR1 is qualitatively altered by irradiating the photoresist film PR1 with light through a region corresponding to the pattern of inductor Ib. Next, as shown in FIG. 15, the photoresist film PR1 is exposed using as a mask a reticle RE2 on which a pattern of rewiring RW has been drawn. Here, the photoresist film PR1 is qualitatively altered by irradiating the photoresist film PR1 with light through a region corresponding to the pattern of rewiring RW. Next, as shown in FIG. 16, by a development process, the photoresist film PR1 in a qualitatively-altered region is removed, and thermally dried. Thus, the photoresist film PR1 in inductor Ib and rewiring RW forming regions is removed, and opening portions (wiring trenches) are formed. In addition, the Cu seed layer SE is exposed in the region from which the photoresist film PR1 has been removed.

Since the polyimide films PIT and PI2 provide a difference in height between the surface of the peripheral circuit forming region 1A and the surface of the transformer forming region 2A in this manner, the patterns (the pattern of inductor Ib, the pattern of rewiring RW) can be precisely transferred to the peripheral circuit forming region 1A and the transformer forming region 2A by exposing the photoresist film PR1 for each region. That is, if a difference in height exists between transfer regions (the surface of the peripheral circuit forming region 1A and the surface of the transformer forming region 2A) in one-shot exposure (transfer) of patterns (the pattern of inductor Ib, the pattern of rewiring RW), it is difficult to set a focal height (position), so that exposure (transfer) of a desired pattern may fail because of defocus in either region. On the other hand, in the first embodiment, exposure can be performed with a reticle (mask) prepared for each region under exposure conditions, such as a focal position, optimized for each region. Therefore, exposure (transfer) of each pattern (the pattern of inductor Ib, the pattern of rewiring RW) can be precisely performed.

Figure 17:
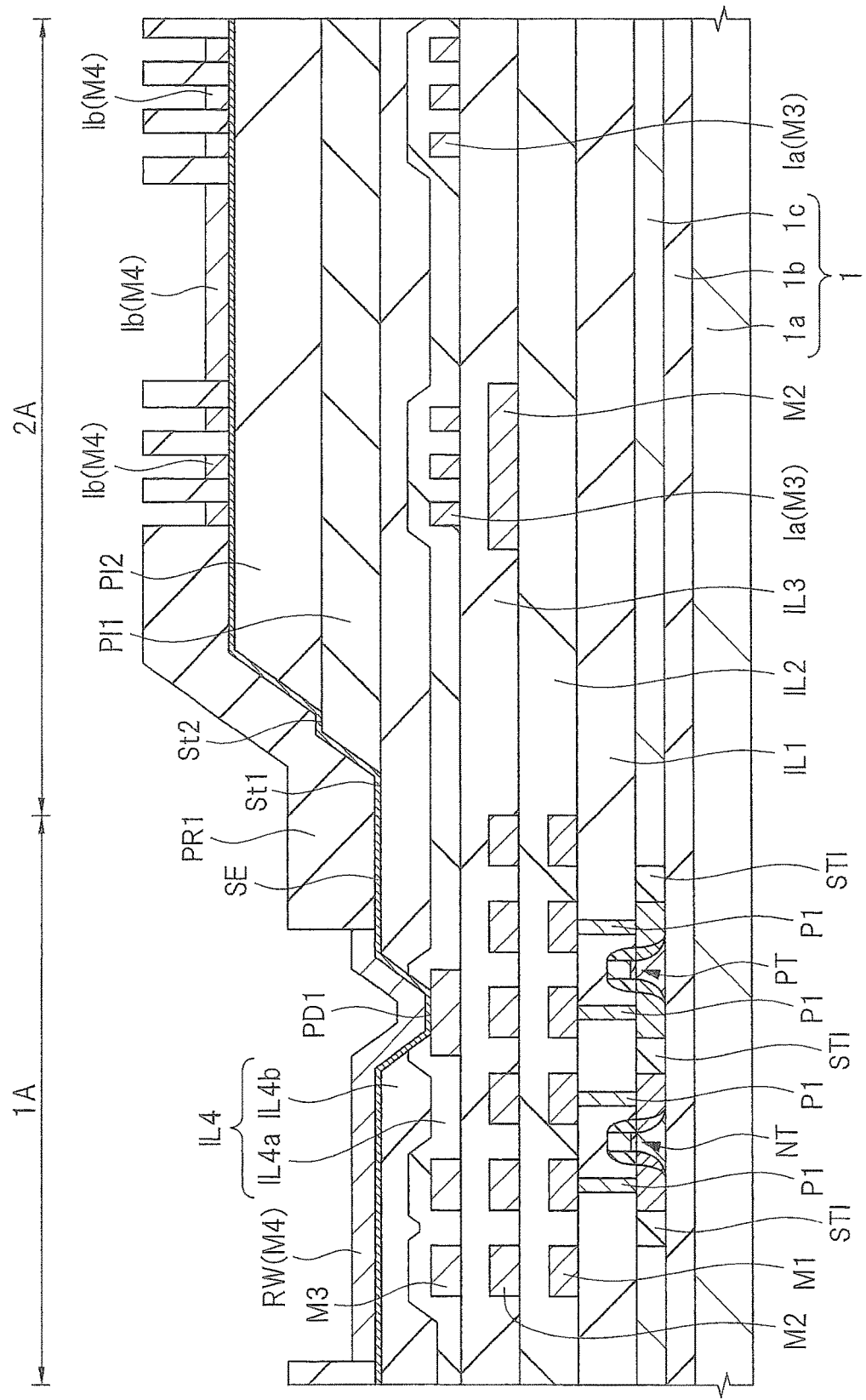
FIG. 17 is a sectional view showing the manufacturing step of the semiconductor device of the first embodiment, continued from FIG. 16.

Next, as shown in FIG. 17, within the opening portions (wiring trenches) of the remaining photoresist film PR1, i.e., on the Cu seed layer SE in the inductor Ib and rewiring RW forming regions, the inductor Ib and the rewiring RW are formed by forming Cu films (copper films) having a film thickness of about 4 to 10 μm by an electrolytic plating process.

Figure 18:
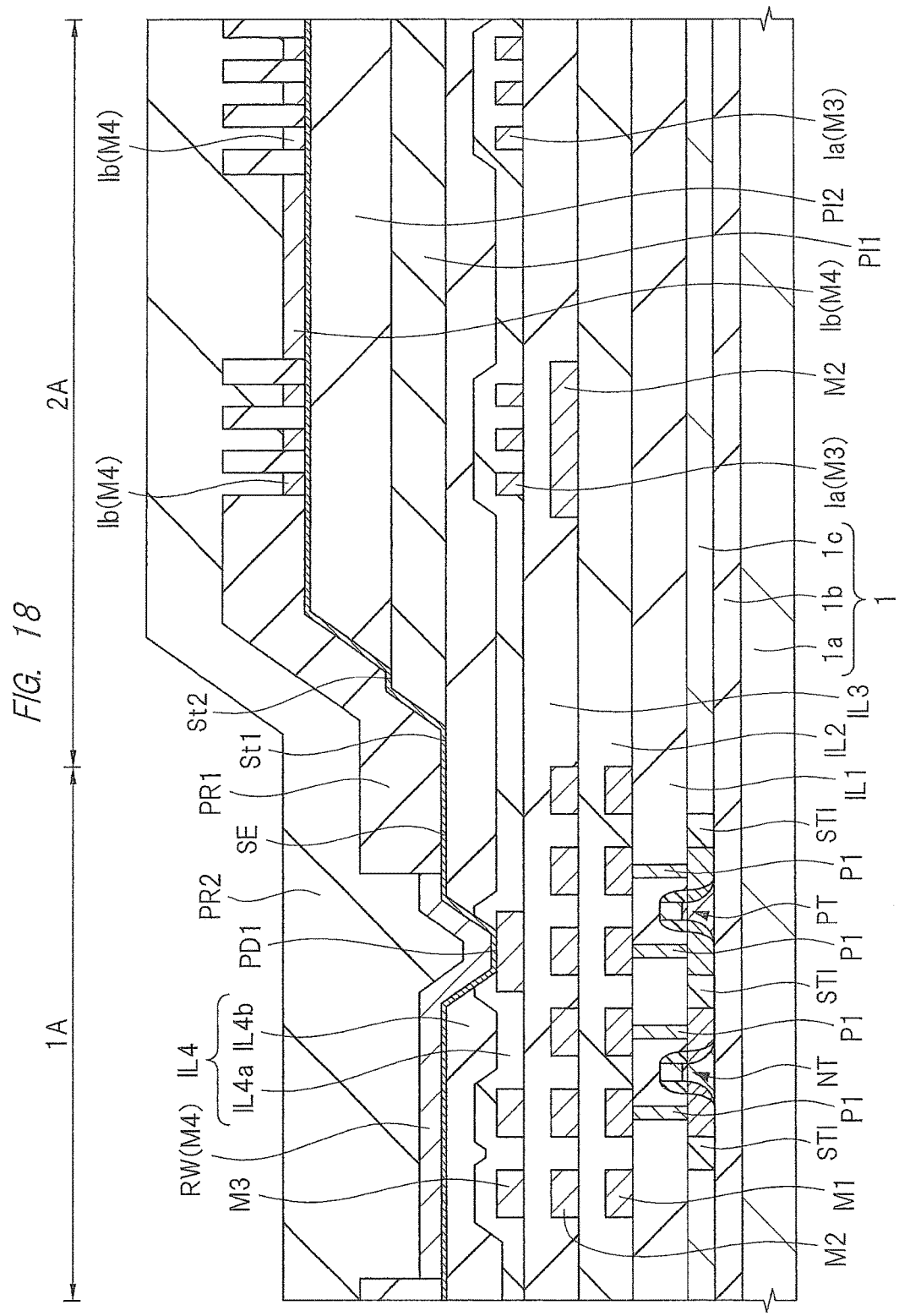
FIG. 18 is a sectional view showing the manufacturing step of the semiconductor device of the first embodiment, continued from FIG. 17.
Figure 19:
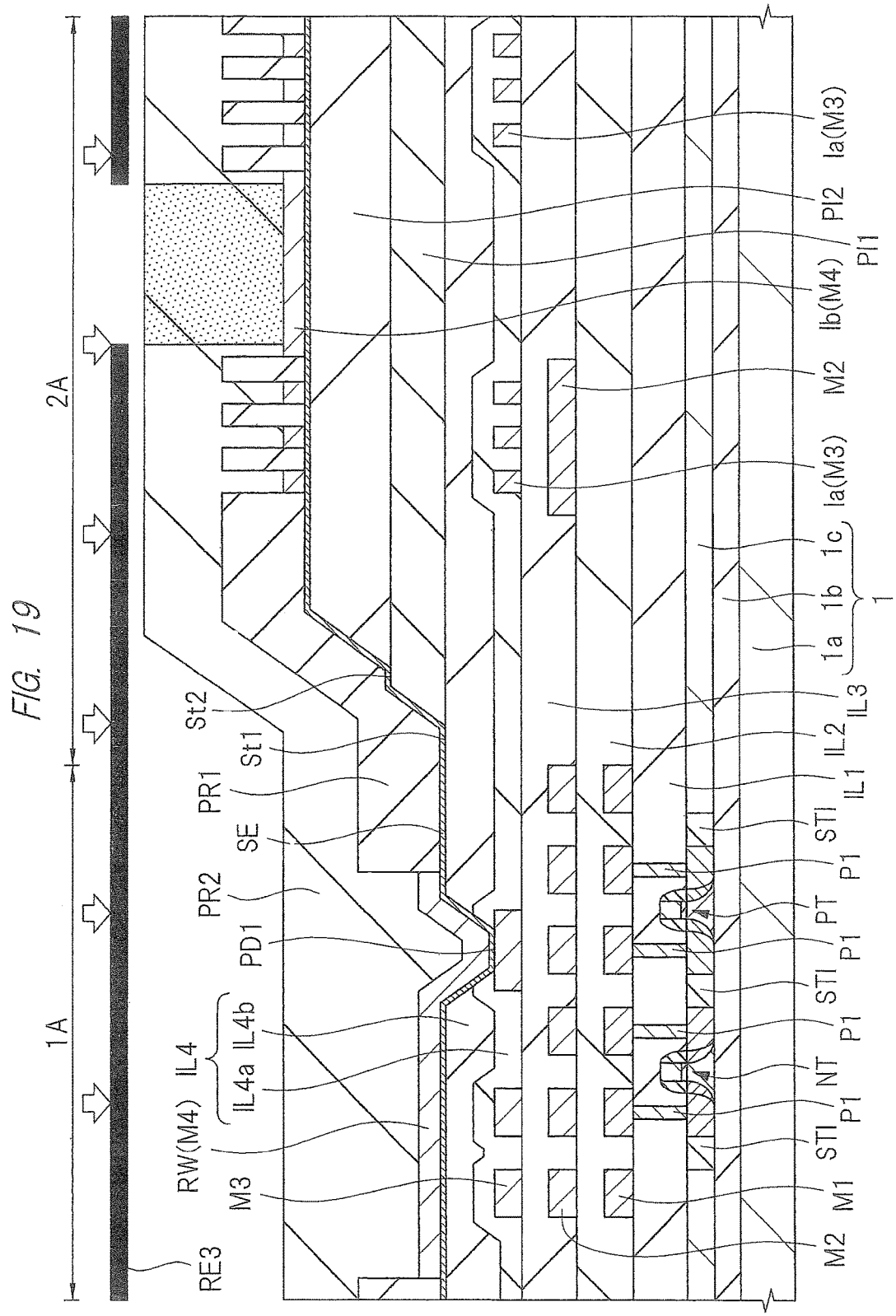
FIG. 19 is a sectional view showing the manufacturing step of the semiconductor device of the first embodiment, continued from FIG. 18.
Figure 20:
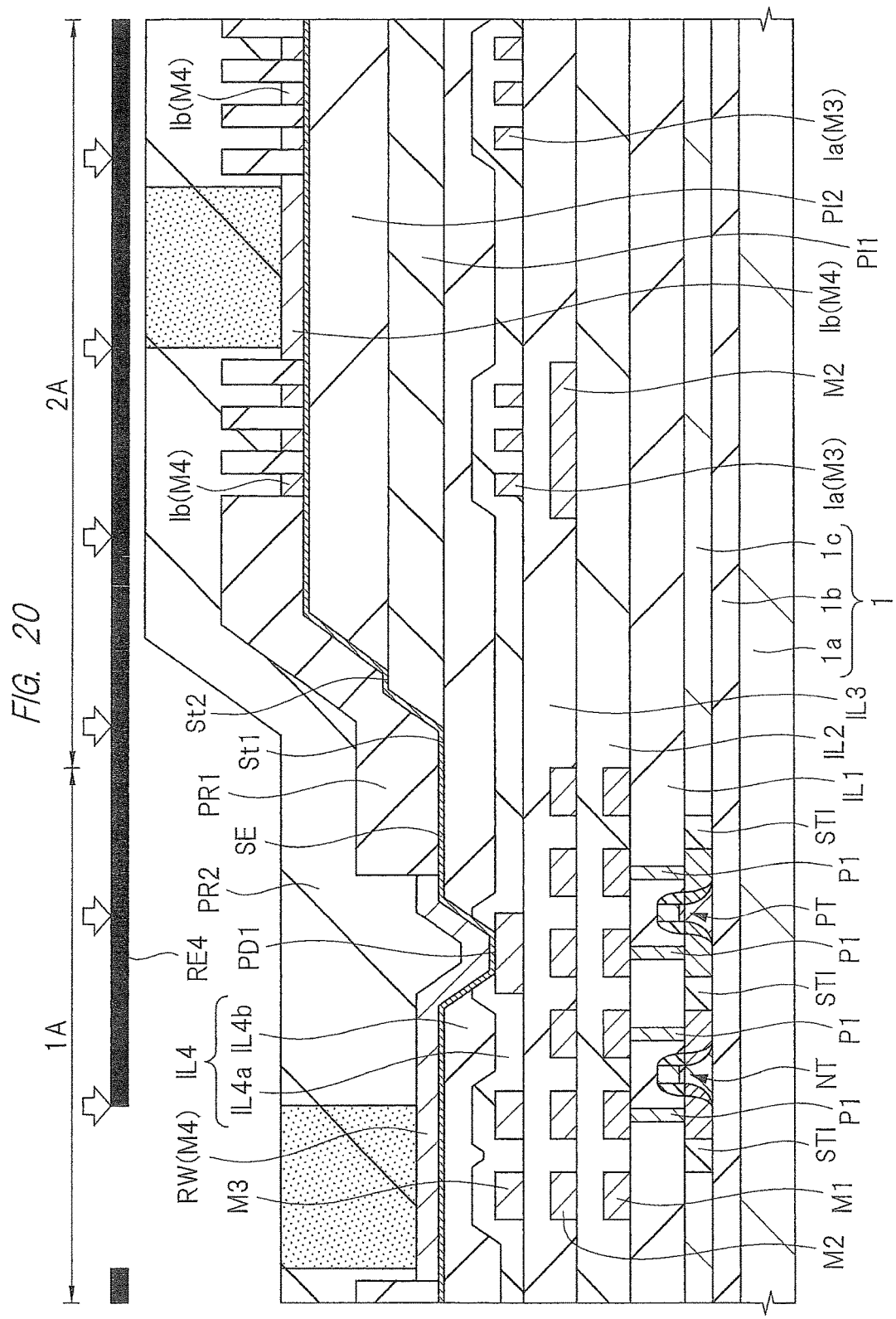
FIG. 20 is a sectional view showing the manufacturing step of the semiconductor device of the first embodiment, continued from FIG. 19.
Figure 21:
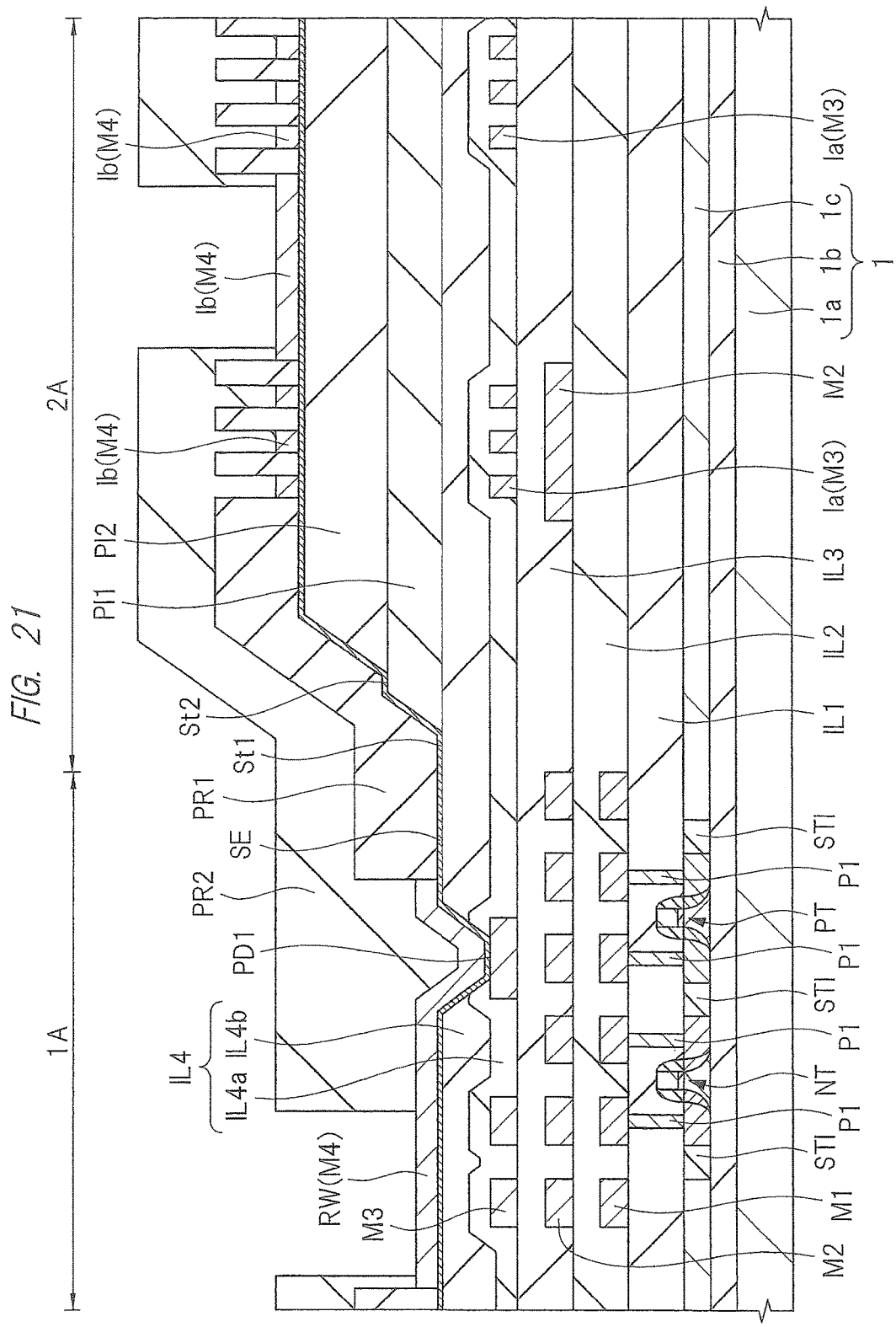
FIG. 21 is a sectional view showing the manufacturing step of the semiconductor device of the first embodiment, continued from FIG. 20.

Next, as shown in FIG. 18, a photoresist film PR2 is applied on the photoresist film PR1 including the inductor Ib and the rewiring RW. Next, as shown in FIG. 19, the photoresist film PR2 is exposed using as a mask a reticle RE3 on which a pattern of a base metal film UM of the transformer forming region 2A has been. Here, the photoresist film PR2 is qualitatively altered by irradiating the photoresist film PR2 with light through a region corresponding to the pattern of the base metal film UM of the transformer forming region 2A. Next, as shown in FIG. 20, the photoresist film PR2 is exposed using as a mask a reticle RE4 on which a pattern of the base metal film UM of the peripheral circuit forming region 1A has been drawn. Here, the photoresist film PR2 is qualitatively altered by irradiating the photoresist film PR2 with light through a region corresponding to the pattern of the base metal film UM of the peripheral circuit forming region 1A. Next, as shown in FIG. 21, by a development process, the photoresist film PR2 in a qualitatively-altered region is removed. Thus, the photoresist film PR2 in a base metal film UM forming region on the inductor Ib and in a base metal film UM forming region on the rewiring RW is removed. In addition, the inductor Ib and the rewiring RW are exposed in the respective regions from which the photoresist film PR2 has been removed.

Since the polyimide films PI1 and PI2 provide a difference in height between the surface of the peripheral circuit forming region 1A and the surface of the transformer forming region 2A in this manner, the photoresist film PR2 is exposed for each of the peripheral circuit forming region 1A and the transformer forming region 2A. Thus, exposure (transfer) of each pattern (the pattern of the base metal film UM on the inductor Ib, the pattern of the base metal film UM on the rewiring RW) can be performed precisely.

Figure 22:
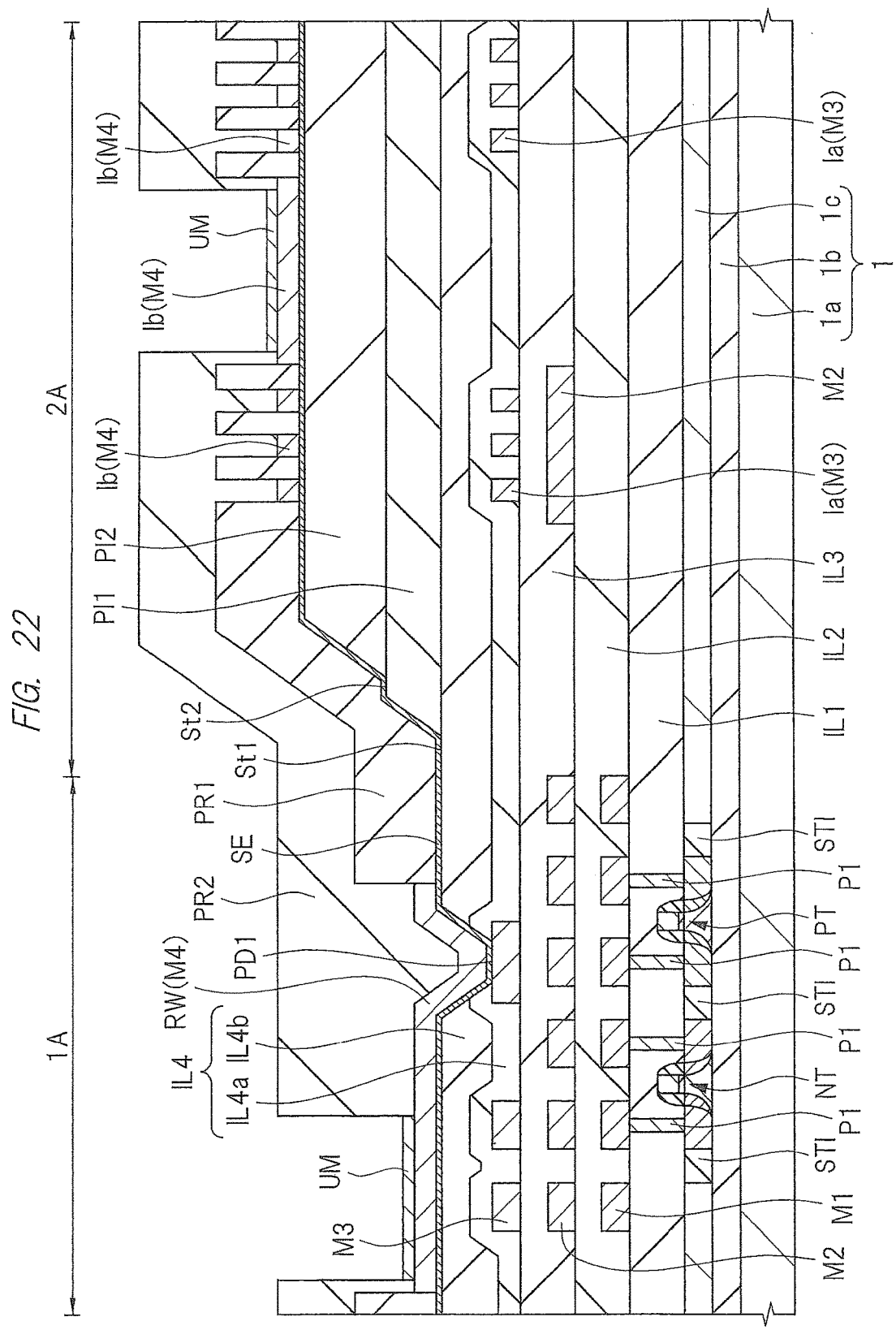
FIG. 22 is a sectional view showing the manufacturing step of the semiconductor device of the first embodiment, continued from FIG. 21.

Next, as shown in FIG. 22, within the remaining photoresist film PR2, i.e., on the Cu film (the inductor Ib and rewiring RW) in the base metal film UM forming regions, a Ni film (nickel film) is so formed as to have a film thickness of about 1.5 μm by an electrolytic plating process. Next, an Au film (gold film) is so formed on the Ni film as to have a film thickness of about 2 μm by an electrolytic plating process. Thus, a base metal film UM composed of a laminated film (Ni/Au) of the Ni film and the Au film can be formed.

Figure 23:
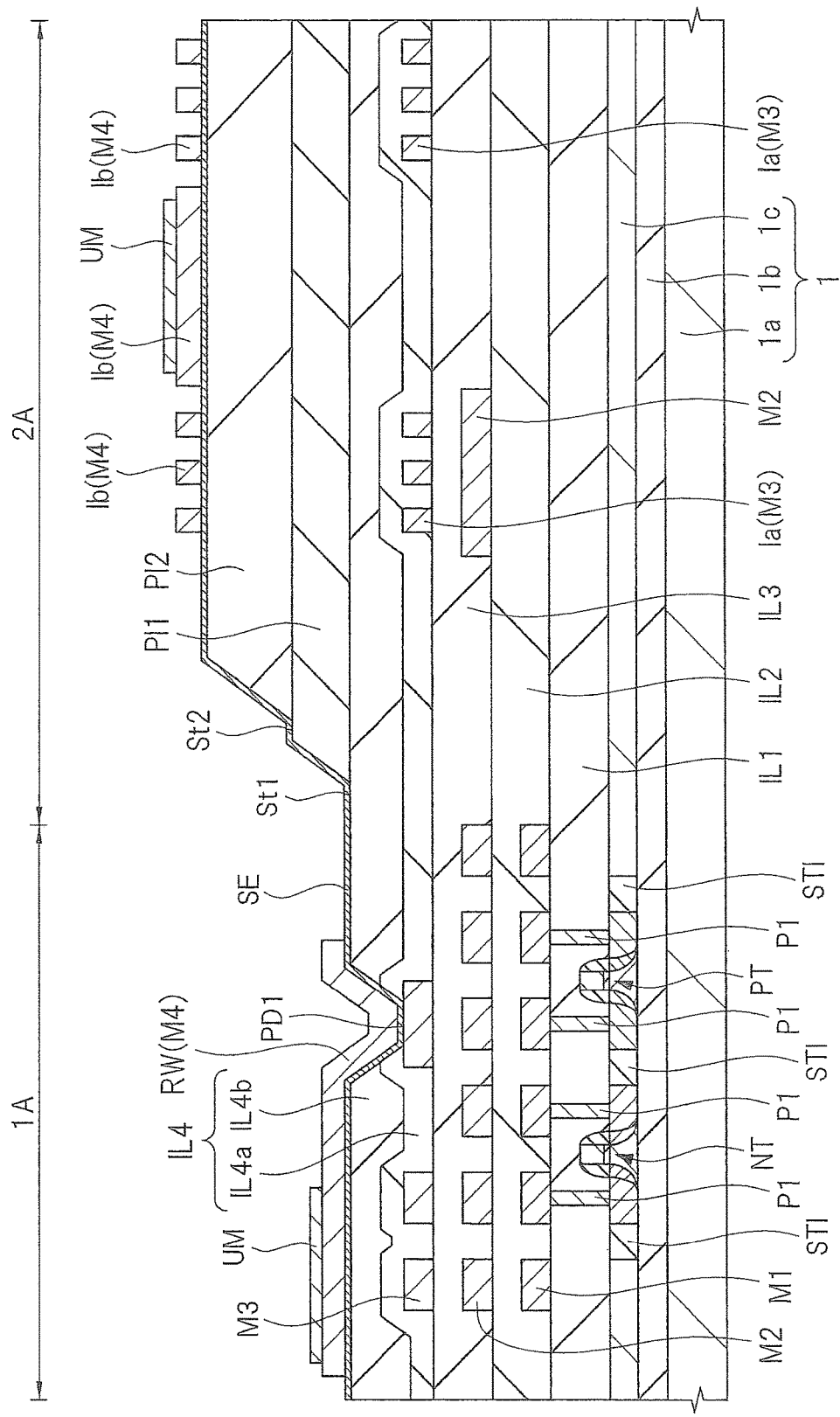
FIG. 23 is a sectional view showing the manufacturing step of the semiconductor device of the first embodiment, continued from FIG. 22.

Next, as shown in FIG. 23, the photoresist films PR1, PR2 are removed. Thus, the Cu seed layer SE is exposed in regions excluding the inductor Ib and the rewiring RW.

Figure 24:
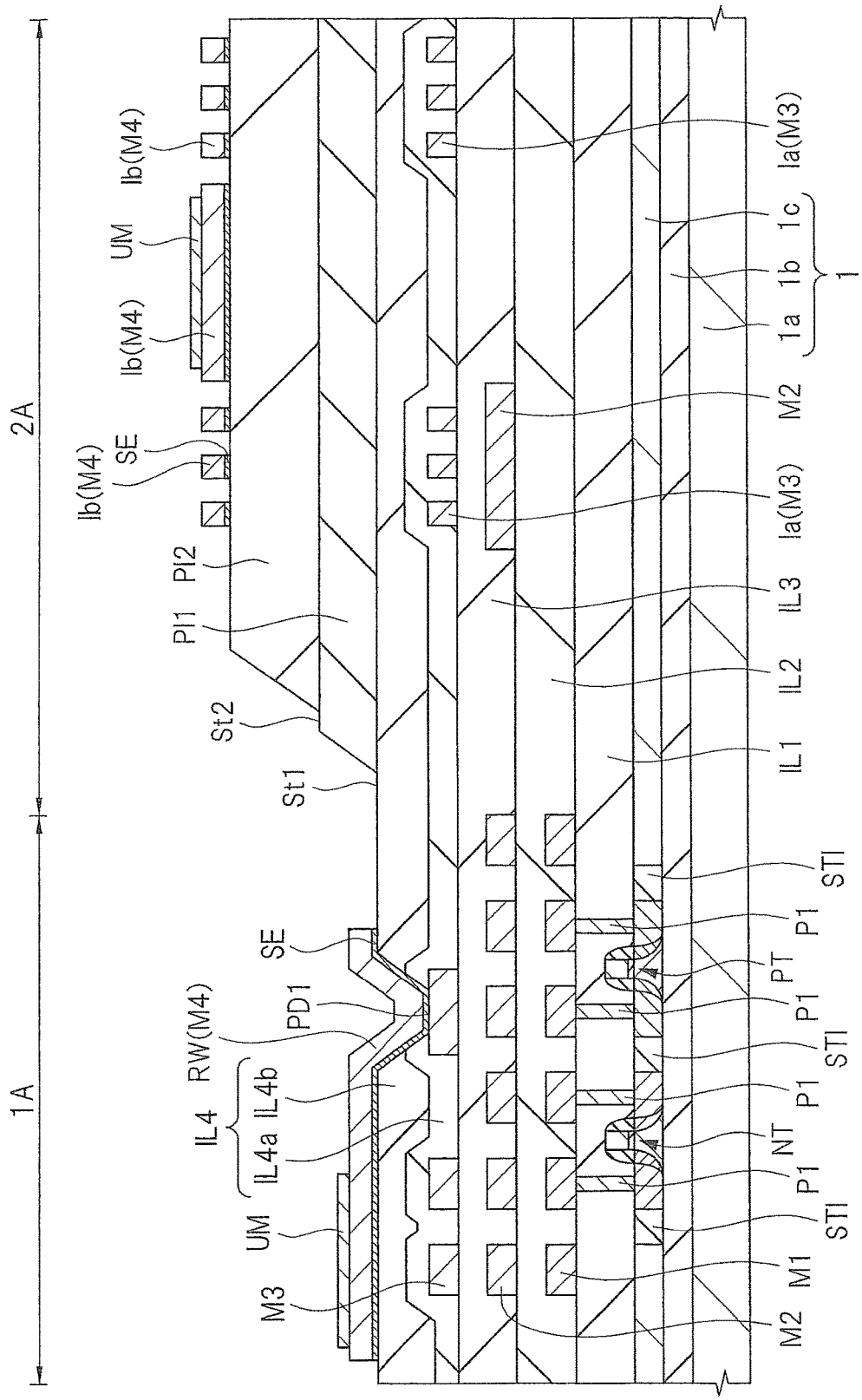
FIG. 24 is a sectional view showing the manufacturing step of the semiconductor device of the first embodiment, continued from FIG. 23.

Next, as shown in FIG. 24, the Cu seed layer SE in regions excluding the inductor Ib and the rewiring RW and the barrier film (not shown) positioned in a layer therebelow are removed by etching. Thus, the Cu seed layer SE and the barrier film (not shown) excluding those located in a layer below the inductor Ib and the rewiring RW are removed. It should be understood that a laminated film of the Cu seed layer SE, the barrier film (not shown), and the Cu film can be regarded as the inductor Ib and the rewiring RW.

Figure 25:
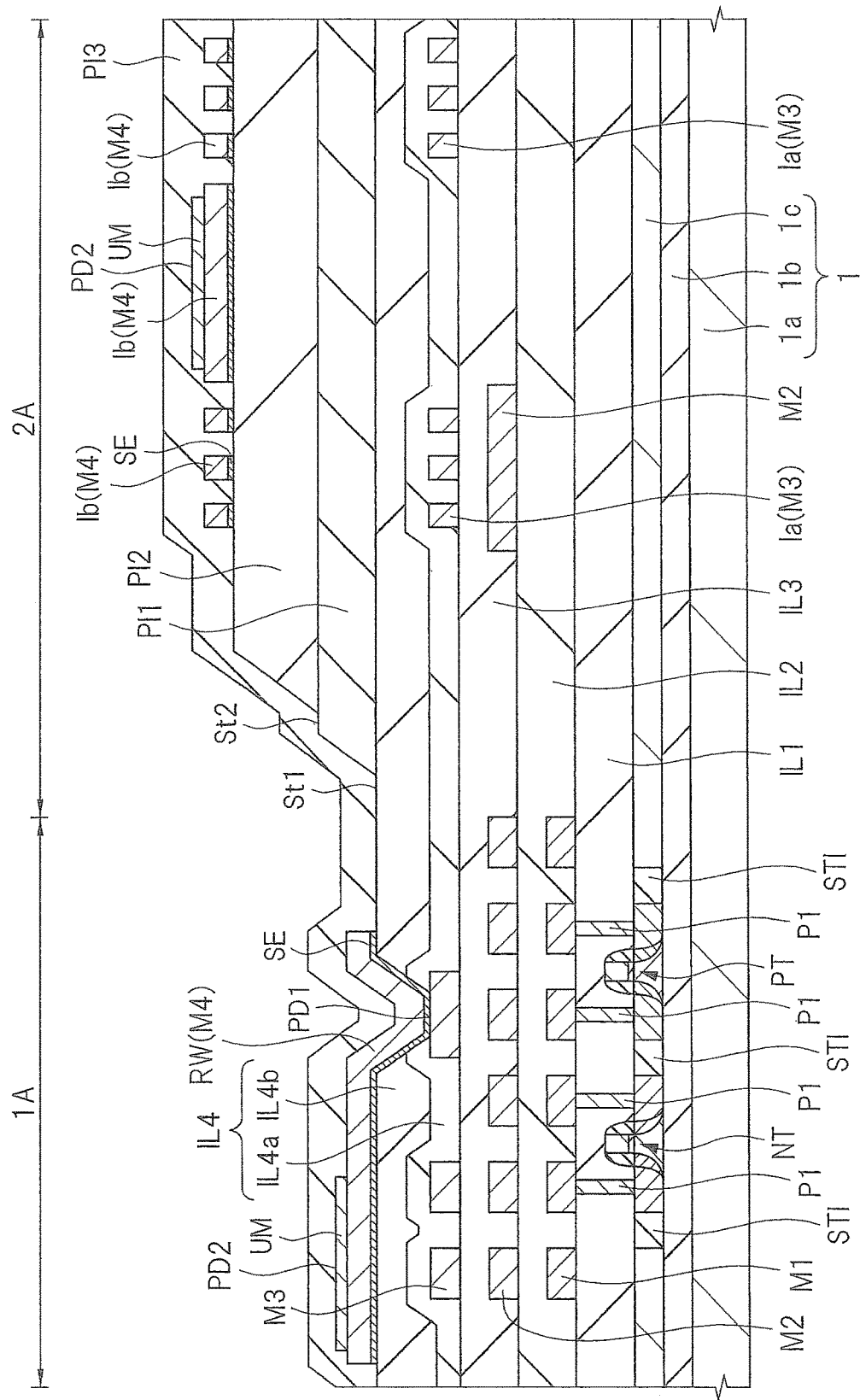
FIG. 25 is a sectional view showing the manufacturing step of the semiconductor device of the first embodiment, continued from FIG. 24.

Next, as shown in FIG. 25, the inductor Ib, a photosensitive polyimide film PI3 is applied on the rewiring RW, the polyimide film PI2, and the like, including the base metal film UM, as an insulating film (protective film). For example, the polyimide film PI3 is formed by rotationally applying a polyimide precursor solution on the surface of the SOI substrate 1, and then drying the same. Next, as shown in FIG. 26, the polyimide film PI3 is exposed using as a mask a reticle RE5 in which pattern portions of the pad region PD2 of the peripheral circuit forming region 1A, the pad region PD2 of the transformer forming region 2A, and an opening portion OA have been shielded. Here, the polyimide film PI3 is qualitatively altered by irradiating the polyimide film PI3 with light through regions excluding forming regions of the pad regions PD2 and the opening portion OA.

Next, as shown in FIG. 27, opening portions (opening regions, exposed parts of the base metal film UM) are formed by removing the polyimide film PI3 from regions excluding qualitatively-altered regions (in other words, shielding regions of the reticle RE5) by a development process. Thus, the base metal film UM on the inductor Ib and the base metal film UM on the rewiring RW are exposed. These exposed regions of the base metal films UM are the pad regions PD2. In addition, at this time, the opening portion OA is formed in the border between the peripheral circuit forming region 1A and the transformer forming region 2A. The interlayer insulating film IL4 (insulating film IL4b) is exposed in the bottom of the opening portion OA.

Thus, the opening portion (recess) OA exposing at least the interlayer insulating film IL4 (insulating film IL4b) is provided by removing the polyimide film PI3 in the border between the peripheral circuit forming region 1A and the transformer forming region 2A. This increases the surface area of the surface of a laminated film of polyimide films (PI1 to PI3) capable of becoming a leak path between the inductors (Ia, Ib), so that leakage current can be reduced. In addition, the reduction in leakage current can improve withstand voltage. Further, in a case where the polyimide film PI3 of a type that leaves a region which has altered qualitatively by exposure (negative type) is used, exposure amount adjustment is easy without the need to take into consideration an exposure amount for the border between the peripheral circuit forming region 1A and the transformer forming region 2A.

Incidentally, a "negative type" of the photosensitive film (for example, a photoresist film or a polyimide film) means a type of photosensitive film that decreases solubility to a developer when being exposed so that a region which has been altered quantitatively by exposure is left. On the other hand, a type of photosensitive film that increases solubility to a developer when being exposed so that a region which has been altered quantitatively by exposure is removed is called "positive type". For example, the above polyimide films PI1, PI2 and the photoresist films PR1, PR2 are of the "positive type".

Thereafter, the SOI substrate (wafer) 1 is divided (singulated) into a plurality of chips (semiconductor chips) by cutting (dicing). It should be noted that before dicing, the SOI substrate 1 may be thinned by backside grinding of the SOI substrate 1. Next, the semiconductor chip is mounted (bonded) on a die pad of a lead frame (die bonding). Leads (external terminals, terminals) are provided around the die pad. Next, the pad regions PD2 on the semiconductor chip and the leads are connected together by wires composed of gold wires (conductive wires, conductive members) (wire bonding, see FIG. 35).

Thereafter, if necessary, the semiconductor chip and the wires are encapsulated (packaged) with encapsulating resin (molding resin) or the like.

Since the laminated film of the polyimide films PI1 and PI2 is provided between the inductors Ia, Ib in the transformer forming region 2A in this manner in the first embodiment, the film thickness of the insulating film between the inductors Ia, Ib can be increased. This can improve withstand voltage between the inductors Ia, Ib. It should be noted that the laminated film of the polyimide films PI1 and PI2 is not provided in the peripheral circuit forming region 1A. This provides the step St1 between the interlayer insulating film IL4 (insulating film IL4b) that is an insulating film in a layer below the rewiring RW and the polyimide film PI1.

In addition, since the polyimide film PI2 is so disposed as to be retreated from the end of the polyimide film PI1 in the laminated film of the polyimide films PI1 and PI2, the occurrence of a depression or peeling-off of the polyimide film PI2 due to defective exposure can be reduced.

FIG. 28 is a sectional view of an inductor (Ia, Ib) portion of the semiconductor device of the first embodiment. As illustrated, the step St1 is provided between the interlayer insulating film IL4 (insulating film IL4b) that is an insulating film in a layer below the rewiring RW and the polyimide film PI1, and the step St2 is provided between the polyimide films PI1 and PI2.

Figure 30:
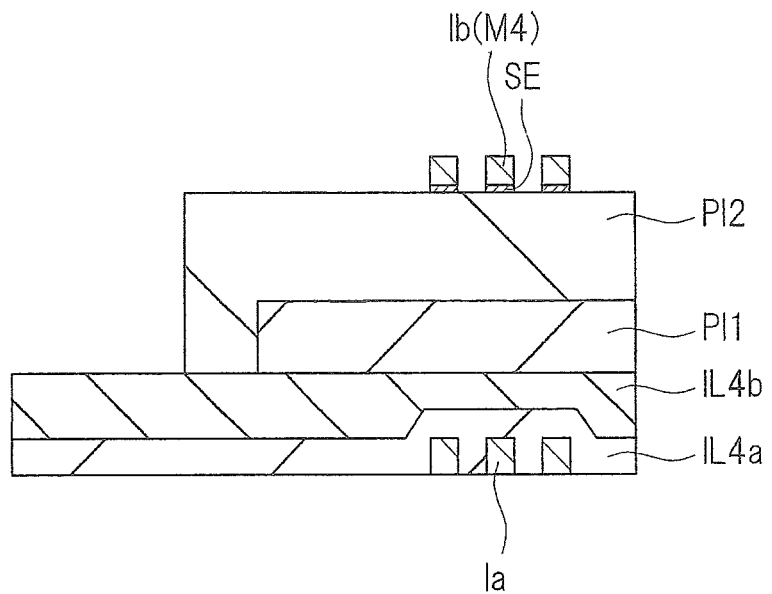
FIG. 30 is a sectional view showing a configuration of a comparative example 2 of the first embodiment.

FIG. 29 is a sectional view showing the configuration of a comparative example 1 of the first embodiment. In the comparative example 1, a single-layer polyimide film PI is provided between the inductors Ia, Ib. The film thickness of the polyimide film PI is about 15 to 25 µm, for example. Also, FIG. 30 is a sectional view showing the configuration of a comparative example 2 of the first embodiment. In the comparative example 2, the polyimide film PI2 is so disposed as to enclose the polyimide film PI1. Regarding the single-layer polyimide film PI shown in FIG. 29, since it is difficult to expose the polyimide film PI to light by single exposure, and defective exposure easily occurs. In addition, if the single-layer polyimide film PI is increased in film thickness, film contraction at the thermally-drying step of the developing process is increased, so that peeling-off of the film at the end of the polyimide film PI easily occurs, and the flatness of the film surface can also be deteriorated by the film contraction.

Also, as shown in FIG. 30, defective exposure easily occurs when the polyimide film PI2 is so disposed as to enclose the polyimide film PI1. According to examinations of the present inventors, a phenomenon has been confirmed that exposure causes the end of the laminated film of the polyimide films PI1 and PI2 to take an inversely-tapered shape.

Figure 31:
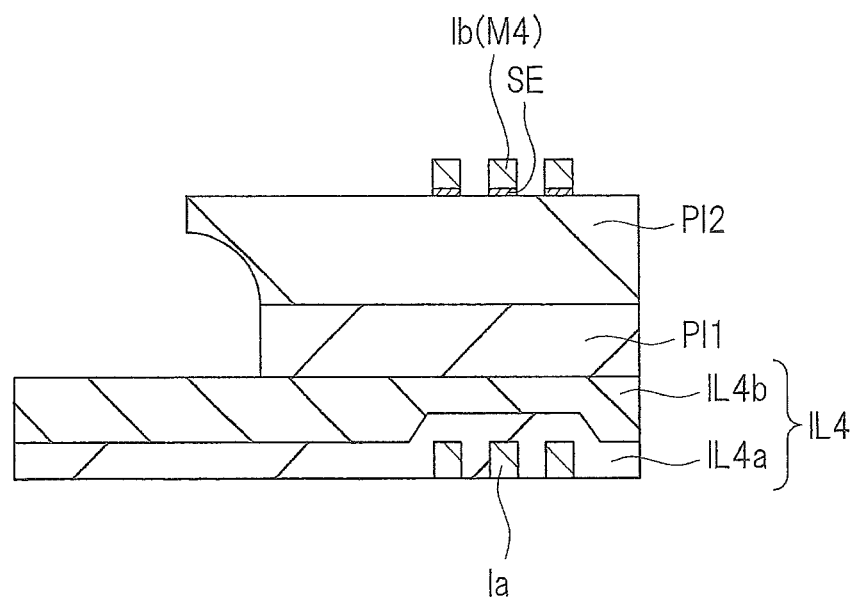
FIG. 31 is a sectional view schematically showing that a laminated film of polyimide films that is the comparative example 2 of the first embodiment is in an inversely-tapered state.
Figure 32:
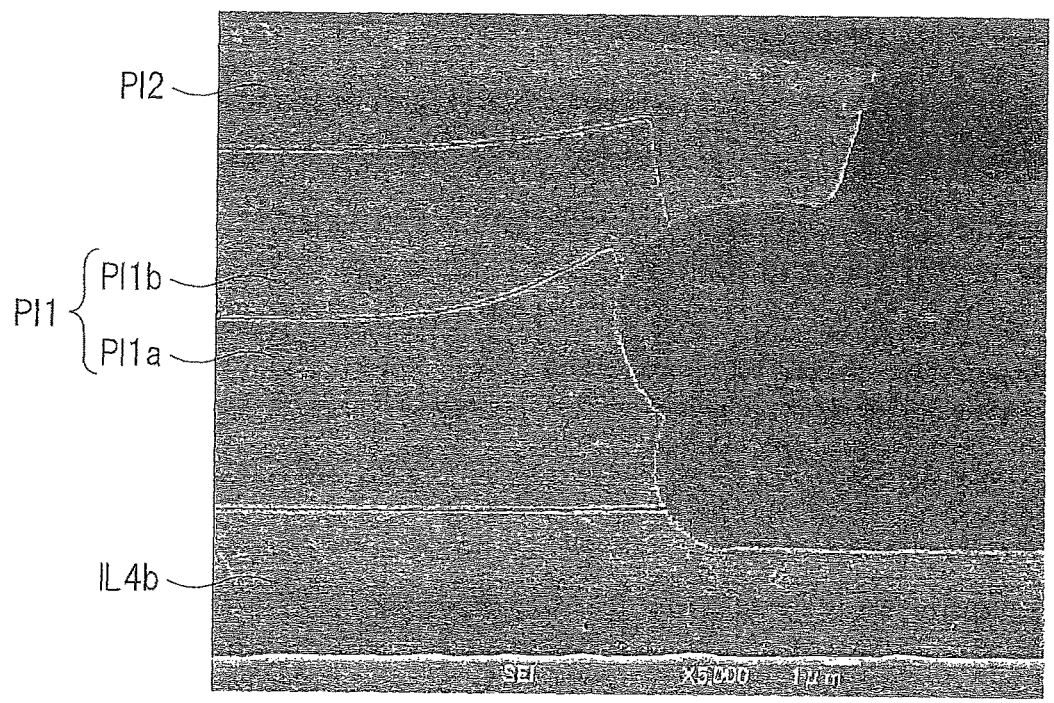
FIG. 32 is a photograph of a laminated film of polyimide films in an inversely-tapered state.
Figure 33:
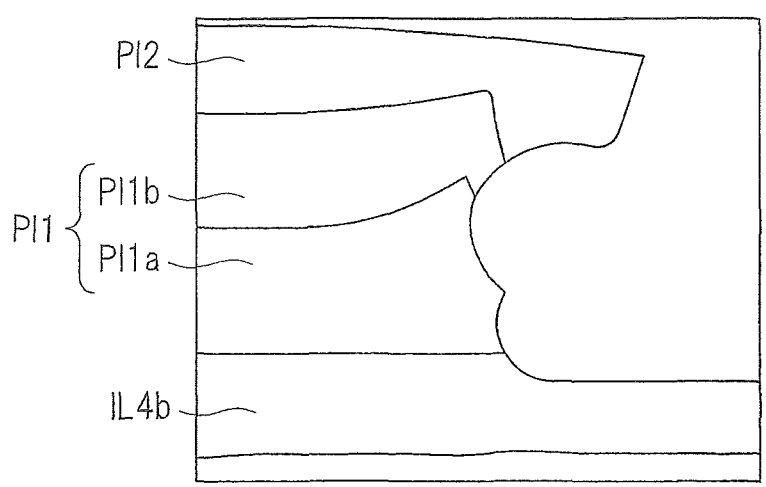
FIG. 33 is a tracing of the shape of polyimide films in the photograph of FIG. 32.

FIG. 31 is a sectional view showing schematically that the laminated film of the polyimide films that is the comparative example 2 of the first embodiment has been inversely tapered. In addition, FIG. 32 is a photograph of the inversely tapered laminated film of the polyimide films which the present inventors have confirmed. FIG. 33 is a tracing of the shape of the polyimide films in the photograph of FIG. 32. It should be noted that in FIGS. 33 and 32 the polyimide film PI1 has a two-layer structure composed of a polyimide film PI1a and a polyimide film PI1b.

As shown in FIGS. 31 to 33, if the laminated film of the polyimide films takes an inversely-tapered shape, the respective adhesiveness of the polyimide films are deteriorated, so that the end of the upper-layer polyimide film peels off. In particular, if the Cu seed layer SE for forming the rewiring RW and the inductor Ib by electrolytic plating is formed thereafter on the laminated film of the polyimide films (see FIG. 12), step disconnection of the Cu seed layer SE occurs at a depression or peeling-off due to defective exposure, so that a plating defect occurs. For example, insufficient power feeding causes difficulty in forming the rewiring RW and the inductor Ib.

On the other hand, in the first embodiment, since the polyimide films PI1 and PI2 are laminated, good application properties in forming each film can be obtained, so that each film can be formed with good flatness or adhesiveness.

Further, in the first embodiment, since the polyimide film PI2 is so disposed as to be retreated from the end of the polyimide film PI1 in the laminated film of the polyimide films PI1 and PI2, the occurrence of a depression or peeling-off of the polyimide film PI2 due to defective exposure can be reduced. In addition, since the film formability of the Cu seed layer SE can be improved, plating defects can also be reduced when the rewiring RW and the inductor Ib are formed by electrolytic plating.

In addition, since the polyimide film PI2 is so disposed as to be retreated from the end of the polyimide film PI1, the polyimide film PI2 can be formed on the polyimide film PI1 having good flatness, so that the film formability or flatness of the polyimide film PI2 can be improved.

In addition, since the rewiring RW is utilized to draw out the pad region PD1 up to a desire region (pad region PD2) in the chip, wire bonding can be easily performed.

Second Embodiment

Figure 34:
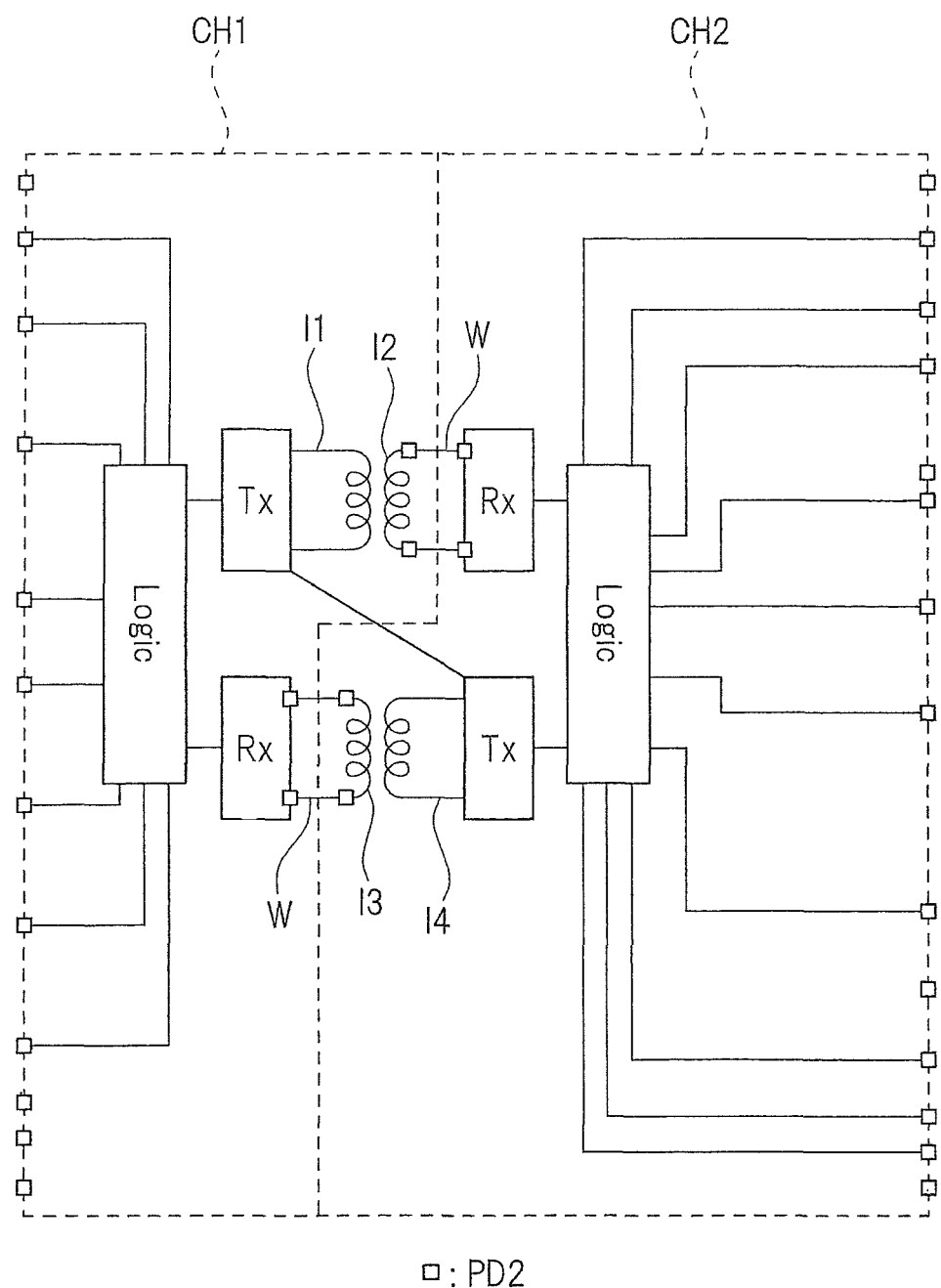
FIG. 34 is a block diagram showing a configuration of a semiconductor device of a second embodiment.
Figure 35:
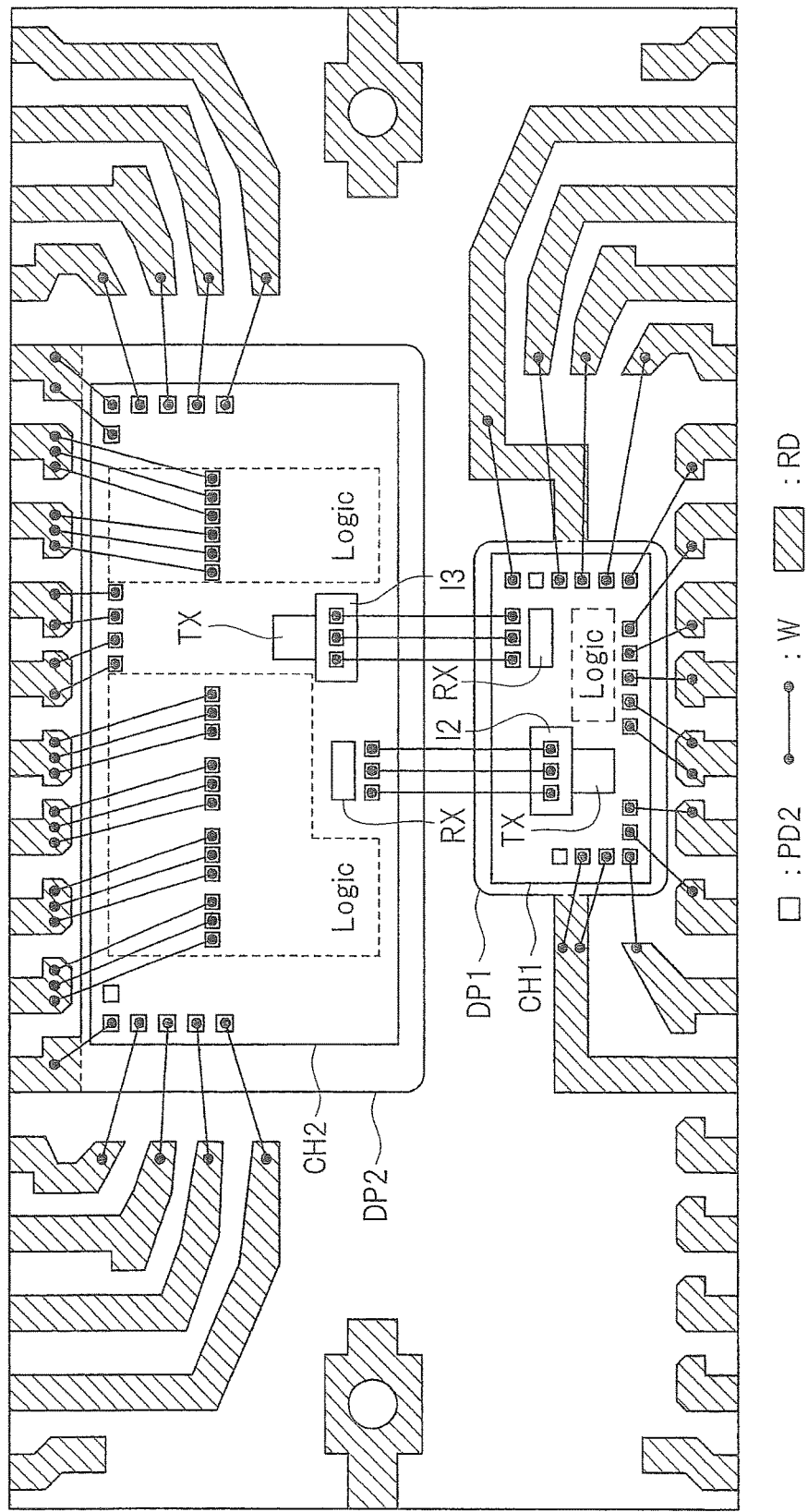
FIG. 35 is a plan view showing the configuration of the semiconductor device of the second embodiment.

In a second embodiment, an example of an application site of the semiconductor device described in the first embodiment will be described. FIG. 34 is a block diagram showing the configuration of a semiconductor device of the second embodiment. FIG. 35 is a plan view showing the configuration of the semiconductor device of the second embodiment.

In the semiconductor device shown in FIG. 34, a chip CH1 on a die pad DP1 and a chip CH2 on a die pad DP2 are configured to one package.

The chip CH1 has a transformer composed of an inductor I1 connected to a transmission circuit Tx, and an inductor I2. The inductor I2 is connected to a receiving circuit Rx of the chip CH2 via pad regions PD2 and wires W. Incidentally, in FIGS. 34 and 35, pad regions PD2 are represented by rectangles.

The chip CH1 also has a receiving circuit Rx and a logic circuit Logic. The logic circuit Logic is connected to the transmission circuit Tx and the receiving circuit Rx of the chip CH1, and the logic circuit Logic is connected to a plurality of pad regions PD2.

The chip CH2 has a transformer composed of an inductor I4 connected to a transmission circuit Tx, and an inductor I3. The inductor I3 is connected to the receiving circuit Rx of the chip CH1 via pad regions PD2 and wires W.

The chip CH2 also has a receiving circuit Rx and a logic circuit Logic. The logic circuit Logic is connected to the transmission circuit Tx and the receiving circuit Rx of the chip CH2, and the logic circuit Logic is connected to a plurality of pad regions PD2.

As shown in FIG. 35, the inductor I2 of the chip CH1 is connected to the receiving circuit Rx of the chip CH2 via the wires W. An inductor (I1) (not shown) is disposed in a layer below the inductor I2, and connected to the transmission circuit Tx of the chip CH1 via a wiring (not shown).

Further, the inductor I3 of the chip CH2 is connected to the receiving circuit Rx of the chip CH1 via a wire W. An inductor (I4) (not shown) is disposed in a layer below the inductor I3, and connected to the transmission circuit Tx of the chip CH2 via a wiring (not shown).

For example, the logic circuit Logic is disposed on the chip CH2. In the chip CH2, peripheral circuits including the logic circuit Logic, the transmission circuit Tx, the receiving circuit Rx, and the like, are connected to a plurality of pad regions PD2 via wirings (not shown). Also, in the chip CH1, peripheral circuits including the logic circuit Logic, the transmission circuit Tx, the receiving circuit Rx, and the like, are connected to a plurality of pad regions PD2 via wirings (not shown).

The pad regions PD2 of the chips CH1 and CH2 are connected to leads RD via wires W.

In such a semiconductor device, the configuration of the first embodiment (see FIG. 2, etc.) can be applied to a peripheral circuit part composed of the logic circuit Logic, the transmission circuit Tx, the receiving circuit Rx, and the like, and a transformer (inductors I1, I2) part of the chip CH2.

Also, the configuration of the first embodiment (see FIG. 2, etc.) can be applied to a peripheral circuit part composed of the logic circuit Logic, the transmission circuit Tx, the receiving circuit Rx, and the like, and a transformer (inductors I3, I4) part of the chip CH1.

Third Embodiment

Description of Structure

Figure 36:
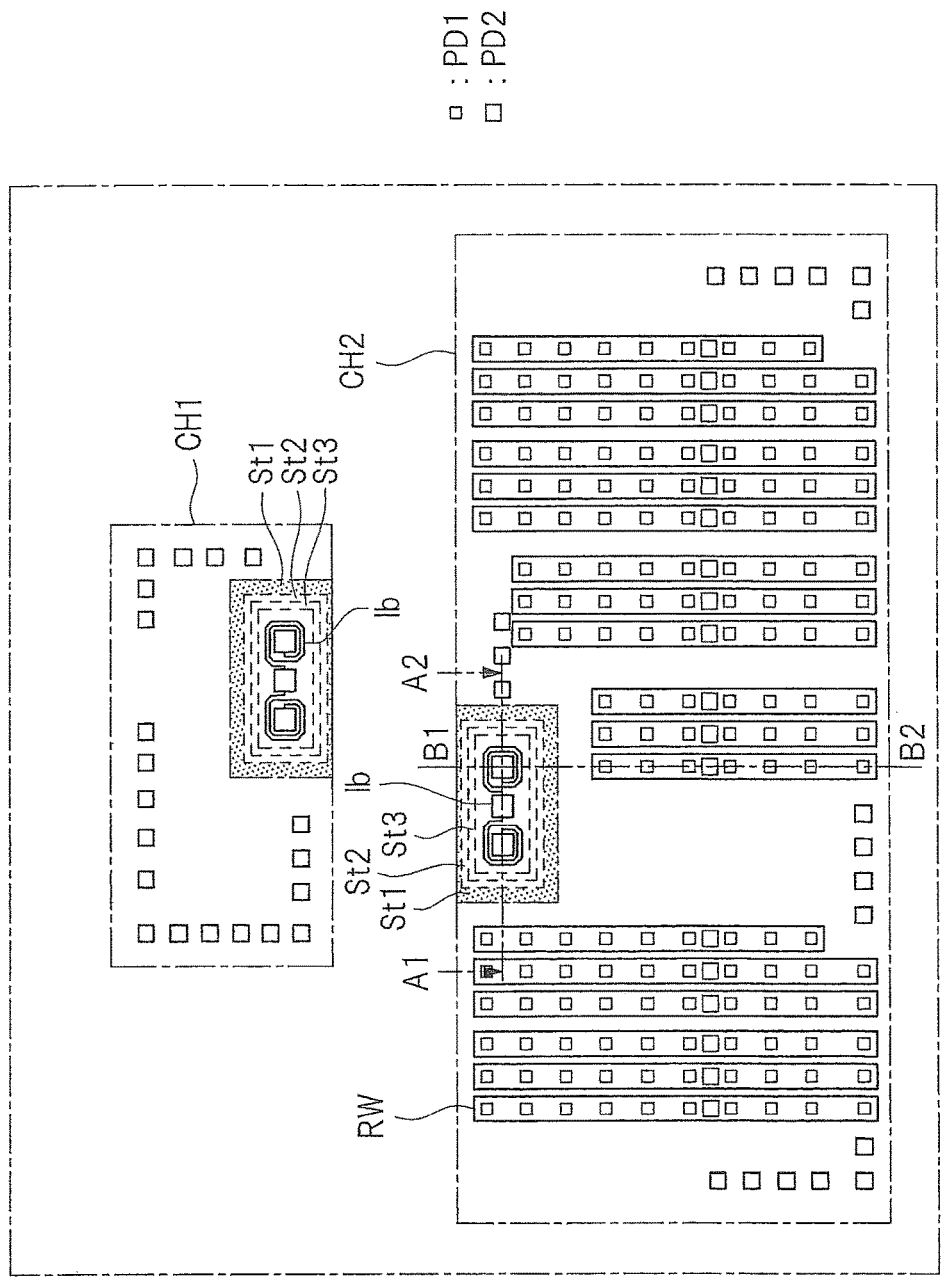
FIG. 36 is a plan view schematically showing a configuration of a semiconductor device of a third embodiment.
Figure 37:
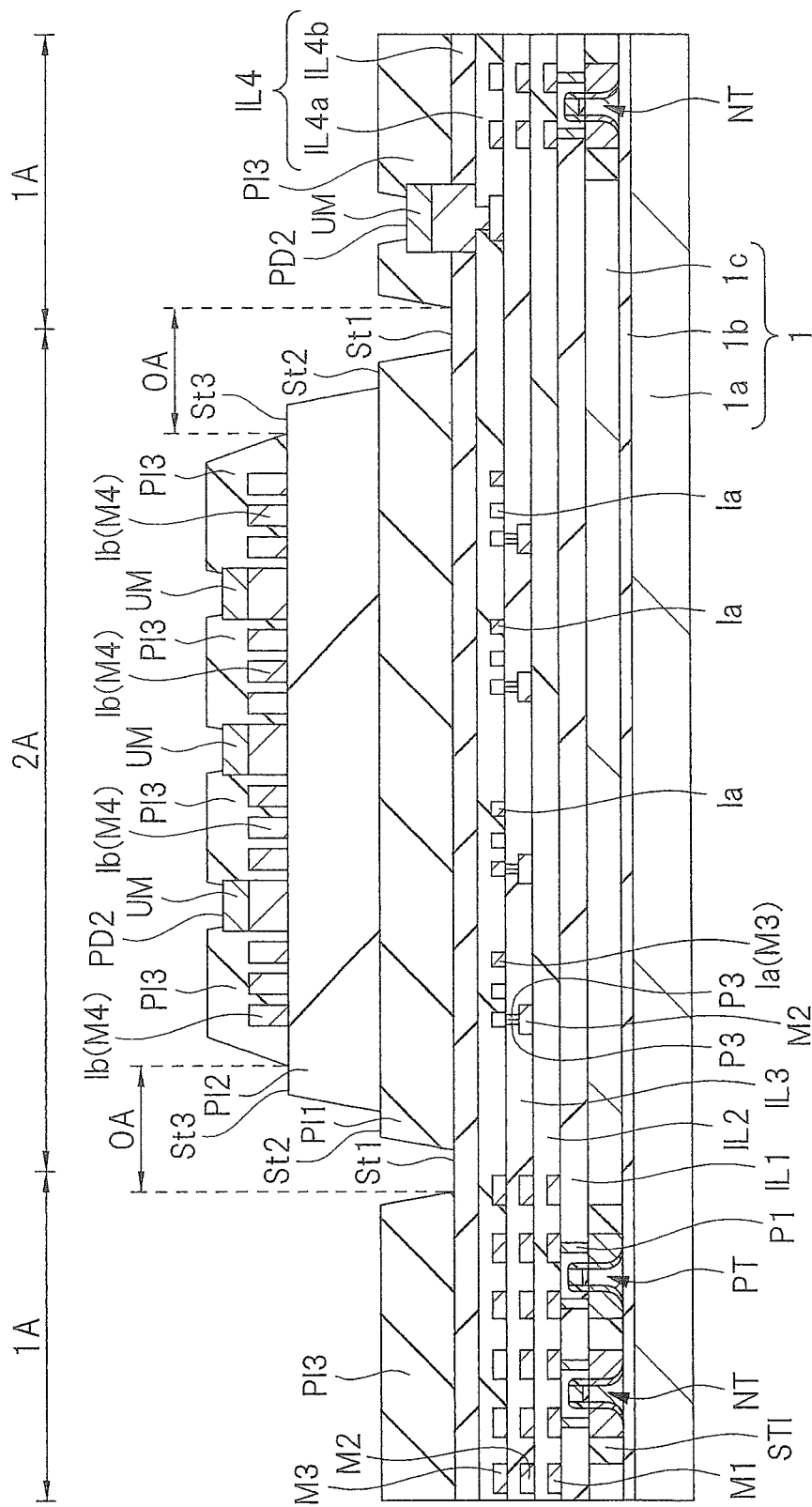
FIG. 37 is a cross-sectional view schematically showing the configuration of the semiconductor device of the third embodiment.
Figure 38:
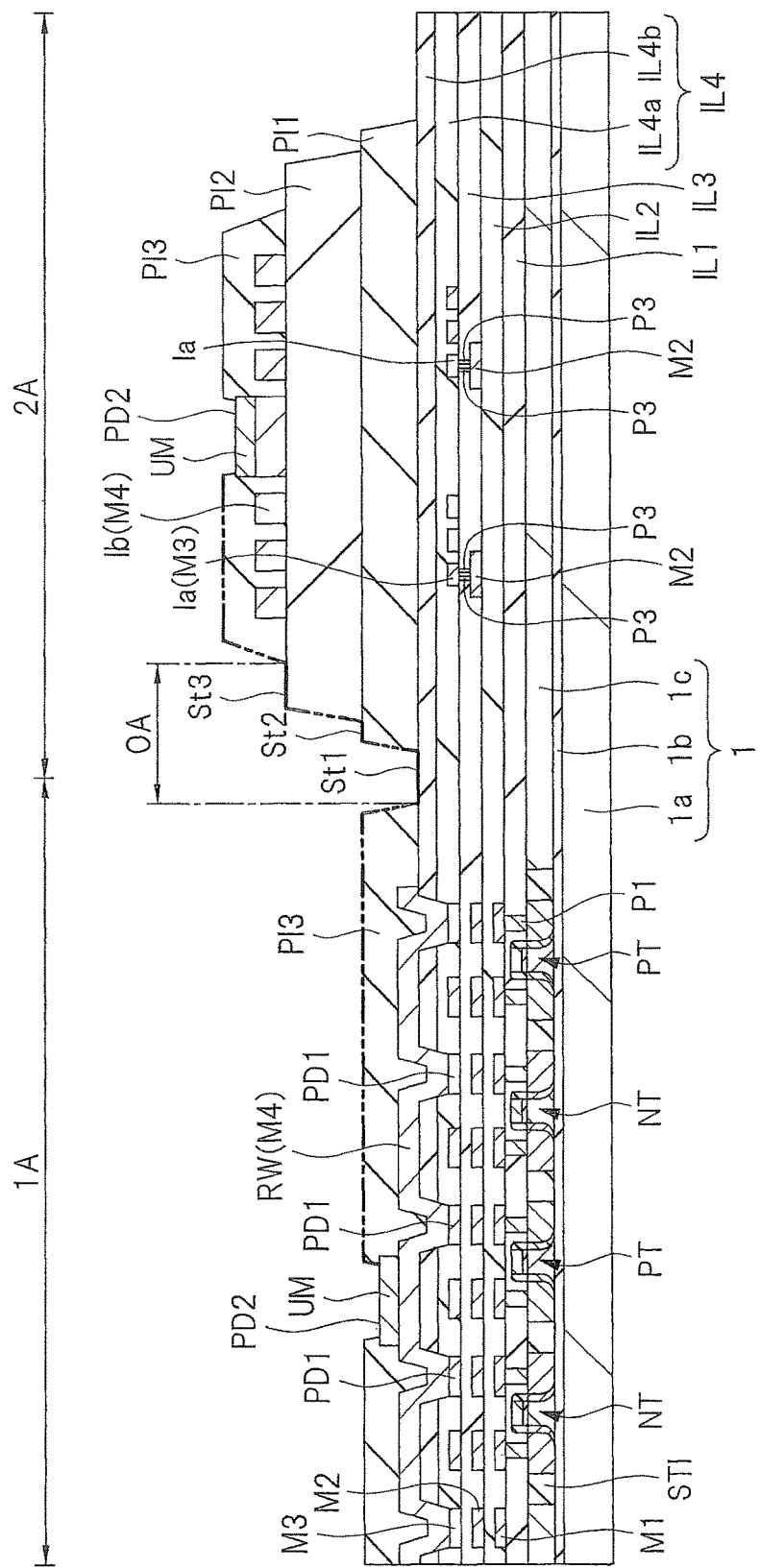
FIG. 38 is a cross-sectional view schematically showing the configuration of the semiconductor device of the third embodiment.

FIGS. 36 to 38 are a plan view or a sectional view showing schematically the configuration of a semiconductor device of a third embodiment. FIG. 36 corresponds to the plan view, FIG. 37 a sectional view taken along a line A1-A2 in FIG. 36, and FIG. 38 a sectional view taken along a line B1-B2 in FIG. 36.

In the semiconductor device shown in FIG. 36, a chip CH1 and a chip CH2 are integrated in one package.

The chip CH1 has a transformer composed of an upper-layer inductor Ia and a lower-layer inductor (not shown). A transformer forming region is a substantially-rectangular region, a step St3 is disposed therearound, and further a step St2 is disposed around the step St3. In addition, a step St1 is disposed around the step St2.

The chip CH2 also has a transformer composed of an upper-layer inductor Ia and a lower-layer inductor (not shown). A transformer forming region is a substantially-rectangular region, a step St3 is disposed therearound, and further a step St2 is disposed around the step St3. In addition, a step St1 is disposed around the step St2. Each of the steps St1 to St3 will be described in detail later with reference to the sectional views (FIGS. 37, 38).

Pad regions PD2 are disposed around each of the chips CH1, CH2.

In addition, in the chip CH2, rewirings RW are so disposed as to connect the tops of the pad regions PD1. Further, the pad regions PD2 are disposed on the rewirings RW.

The pad regions PD2 of the chips CH1 and CH2 are connected to leads via wires (see FIG. 35).

Further details will be described with reference to FIGS. 37 and 38.

Each chip CH1, CH2 of the semiconductor device of the third embodiment is formed utilizing an SOI substrate. For example, as shown in FIGS. 37 and 38, the chip CH2 is formed on an SOI substrate 1 having a peripheral circuit forming region 1A and a transformer forming region 2A.

The SOI substrate 1 has a supporting substrate 1$a$, an insulating layer 1$b$ formed on the supporting substrate 1$a$, and a semiconductor layer formed on the insulating layer 1$b$.

N-channel type MISFETs (NT) and p-channel type MISFETs (PT) are formed in the peripheral circuit forming region 1A. An interlayer insulating film IL1 is formed on these MISFETs, and first-layer wirings M1 are formed on the interlayer insulating film IL1. The MISFETs (NT, PT) and the first-layer wirings M1 are connected together via plugs P1. In addition, second-layer wirings M2 are formed on the first-layer wirings M1 via an interlayer insulating film IL2. The first-layer wirings M1 and the second-layer wirings M2 are connected together via plugs (not shown) formed in the interlayer insulating film IL2. Third-layer wirings M3 are formed on the second-layer wirings M2 via interlayer insulating film IL3. The second-layer wirings M2 and the third-layer wirings M3 are connected together via plugs P3 formed in the interlayer insulating film IL3.

Rewirings RW are formed on the third-layer wirings M3 via an interlayer insulating film (an insulating film, a protective film) IL4. The interlayer insulating film IL4 is composed of a laminated film of an insulating film IL4$a$ and an insulating film IL4$b$ on the insulating film IL4$a$. The rewirings RW are wirings (also referred to as fourth-layer wirings M4) that draw out the pad regions PD1, which are parts of an uppermost-layer wiring (here, the third-layer wirings M3), to desired regions (pad regions PD2) of the chip.

A transformer having an inductor Ia and an inductor Ib is formed in the transformer forming region 2A. The lower-layer inductor Ia is formed in the same layer as the third-layer wirings M3. The lower-layer inductor Ia is connected to the second-layer wirings M2 in a layer therebelow via a plurality of plugs P3. That is, the inductor Ia and the second-layer wirings M2 connected to the inductor Ia have the following relationship. The second-layer wirings M2 are wirings that are formed between the interlayer insulating film IL3 and the interlayer insulating film IL2, and that overlap with the inductor Ia in a plan view. In addition, as viewed in a cross section, the inductor Ia is covered with the interlayer insulating film IL4, and the inductor Ia and the second-layer wirings M2 are connected together via a plurality of plugs (connecting portions) P3 penetrating the interlayer insulating film IL3.

The inductor Ib is formed on the inductor Ia via the interlayer insulating film IL4 and polyimide films PI1 and PI2. The polyimide films PI1 and PI2 are not formed in the peripheral circuit forming region 1A. That is, the step St1 is formed between the interlayer insulating film IL4 (insulating film IL4b) and the polyimide film PI1. The polyimide film PI1 is formed on a main surface of the interlayer insulating film IL4. The polyimide film PI1 has a main surface and side surfaces continuous with this main surface. In addition, the polyimide film PI2 is formed on the main surface of the polyimide film PI1. The polyimide film PI2 has a main surface and side surfaces continuous with this main surface. Therefore, the step St1 is formed by the main surface of the interlayer insulating film IL4 and the side surfaces of the polyimide film PI1.

Thus, a difference in height corresponding to the film thickness of the polyimide films PI1 and PI2 (laminated film, laminated insulating film) exists between the forming position of the inductor Ia and the forming positions of the rewirings RW, but the inductor Ia and the rewirings RW are formed of the same material (the same step). Further, the polyimide film PI2 is so formed as to be retreated from an end of the polyimide film PI1. In other words, the polyimide films PI1 and PI2 are formed in a stairs-like shape (pyramid shape). That is, the step St2 is formed between the polyimide films PI1 and PI2. In other words, the polyimide films PI1 and PI2 are a laminated insulating film having the step St2 formed by the main surface of the polyimide film PI1 and the main surface of the polyimide film PI2 via the side surfaces of the polyimide film PI2.

Since the laminated structure of the polyimide films PI1 and PI2 is adopted in this manner, the film thickness of the insulating film between the inductors Ia, Ib can be increased, as described in detail in the first embodiment. This can improve withstand voltage between the inductors Ia, Ib.

Further, since the polyimide films PI1 and PI2 are so formed in a stairs-like shape as to have the steps St1, St2, the film formability of the polyimide films PI1 and PI2 can be improved, so that peeling-off of the polyimide films PI1 and PI2 can be reduced, as described in detail in the first embodiment.

A polyimide film PI3 is formed on the rewirings RW and the inductor Ia. The polyimide film 3 is formed on the main surface of the polyimide film PI2. The polyimide film PI3 has a main surface and side surfaces continuous with this main surface. In addition, the polyimide film PI3 is so formed as to be retreated from an end of the polyimide film PI2. In other words, in the transformer forming region 2A, the step St3 is formed between the polyimide film PI2 and the polyimide film PI3. That is, the main surface of the polyimide film PI2 and the main surface of the polyimide film PI3 form the step St3 via the side surfaces of the polyimide film PI3. In addition, the polyimide film PI3 has a main surface and side surfaces continuous with the main surface. In addition, an opening portion (recess) OA exposing at least the interlayer insulating film IL4 (insulating film IL4b) is formed by removing the polyimide film PI3 in the border between the peripheral circuit forming region 1A and the transformer forming region 2A.

Regarding the configuration the inductors, it is preferred that a conductive film having a spiral planar shape be used, as described above. Here, two spiral conductive films are so disposed as to be symmetrical with respect to the center line of a pad region PD2 located in the center of FIG. 3 (see FIG. 36, FIG. 3).

[Manufacturing Method Description]

Next, with reference to FIGS. 37 and 38, a method of manufacturing the semiconductor device of the third embodiment will be described, and the configuration of the semiconductor device thereof will be made clearer. It should be noted that detailed descriptions of the same steps as steps described in the first embodiment will be omitted.

As shown in FIGS. 37 and 38, for example, an SOI substrate 1 is prepared as the semiconductor substrate. The SOI substrate 1 is composed of a supporting substrate 1a composed of silicon single crystal (semiconductor film), an insulating layer 1b formed on the supporting substrate 1a, and a silicon layer 1c formed on the insulating layer 1b. The SOI substrate 1 has a peripheral circuit forming region 1A and a transformer forming region 2A.

Next, a device isolation insulating film. STI is formed in the silicon layer 1c of the SOI substrate 1. This device isolation region can be formed in the same manner as in the first embodiment by means of an STI process, for example.

For example, device isolation trenches are formed in the silicon layer 1c of the SOI substrate 1 by means of a photolithography technique and an etching technique. Next, on the SOI substrate 1, a silicon oxide film is so deposited, by means of a CVD process or the like, so as to have a film thickness just enough to fill the device isolation trenches, and the silicon oxide film other than the device isolation trenches is removed by means of a chemical mechanical polishing process, an etching-back process, or the like. Thus, the silicon oxide film can be buried in the device isolation trenches.

Next, MISFETs (NT, PT) are formed in the peripheral circuit forming region 1A. Although the method of forming the MISFETs is not limited, a MISFET (NT, PT) having a source-drain region (SD) having an LDD structure having a high-concentration impurity region and a low-concentration impurity region can be formed in the same manner as in the first embodiment, for example.

Next, an interlayer insulating film IL1 is formed on the SOI substrate 1 including on the MISFETs (NT, PT). For example, after a silicon oxide film is deposited by a CVD process, the surface of the interlayer insulating film IL1 is planarized by a CMP process or the like, if necessary.

Next, contact holes are formed by patterning the interlayer insulating film IL1. Next, plugs P1 are formed by burying a conductive film in the contact holes.

Next, on the interlayer insulating film IL1 and the plugs P1, a laminated film is formed as a conductive film by sequentially depositing a titanium/titanium-nitride film, an aluminum film, and a titanium/titanium-nitride film, for example, by means of a sputtering process or the like. Next, first-layer wirings M1 are formed on the plugs P1 by patterning the laminated film by means of the photolithography technique and the etching technique.

Next, an interlayer insulating film IL2 composed of a silicon oxide film is formed on the first-layer wirings M1 by a CVD process or the like. Next, contact holes are formed in the first-layer wirings M1 by patterning the interlayer insulating film IL2.

Next, plugs (not shown) are formed in the interlayer insulating film IL2 by burying a conductive film in the contact holes. These plugs can be formed in the same manner as the plugs P1.

Next, on the interlayer insulating film IL2 and the plugs, a laminated film is formed as a conductive film by sequentially depositing a titanium/titanium-nitride film, an aluminum film, and a titanium/titanium-nitride film, for example, by means of a sputtering process or the like. Next, second-layer wirings M2 are formed on the plugs by patterning the laminated film by means of the photolithography technique and the etching technique.

Next, an interlayer insulating film IL3 composed of a silicon oxide film is formed on the second-layer wirings M2 by a CVD process or the like. Next, contact holes are formed in the second-layer wirings M2 by patterning the interlayer insulating film IL3.

Next, plugs P3 are formed in the interlayer insulating film IL3 by burying a conductive film in the contact holes. These plugs can be formed in the same manner as the plugs P1.

Next, on the interlayer insulating film IL3 and the plugs, a laminated film is formed as a conductive film by sequentially depositing a titanium/titanium-nitride film, an aluminum film, and a titanium/titanium-nitride film, for example, by means of a sputtering process or the like. Next, third-layer wirings M3 are formed on the plugs by patterning the laminated film by means of the photolithography technique and the etching technique.

Here, in the transformer forming region 2A, a lower-layer inductor Ia is formed in the same layer as the third-layer wirings M3. That is, at the time of patterning the laminated film, the above-described spiral conductive films (inductor Ia) are formed in the transformer forming region 2A (see FIG. 37, FIG. 38). It should be noted that the conductive films (inductor Ia) are connected to the second-layer wirings M2 in a layer therebelow via the plugs P3 (see FIG. 38).

Next, an insulating film IL4a is formed on the third-layer wirings M3 (here, the uppermost-layer wirings) and the interlayer insulating film IL3. For example, the insulating film IL4a is formed by depositing a silicon nitride film by a CVD process or the like.

Next, a photosensitive polyimide film, for example, is applied on the insulating film IL4a as an insulating film IL4b. For example, the polyimide film is formed by rotationally applying a polyimide precursor solution on the surface of the SOI substrate 1, and then drying the same. Next, opening portions (opening regions, exposed portions of the third-layer wirings M3) are formed by removing the polyimide film (IL4b) in the pad regions PD1 by exposing and developing the photosensitive polyimide film (IL4b). Thereafter, the polyimide film (IL4b) is cured by a thermal treatment. The film thickness of the polyimide film (IL4b) is about 3 to 10 μm, for example. Next, the third-layer wirings M3 in the pad regions PD1 are exposed by removing the insulating film IL4a by etching. Thus, the interlayer insulating film IL4 having the opening portions in the pad regions PD1 and composed of a laminated film of the insulating film IL4a and the insulating film IL4b is formed.

Next, a photosensitive polyimide film PI1 is applied on the insulating film IL4b including the pad regions PD1 as a first insulating film (an interlayer insulating film, an insulating film for ensuring withstand voltage, an insulating film between the inductors). The film thickness of the polyimide film PI1 is about 3 to 10 μm, for example. Here, since the insulating film IL4b extends from the transformer forming region 2A to the peripheral circuit forming region 1A, a step St1 is formed between the insulating film IL4b and the polyimide film PI1.

Next, a photosensitive polyimide film PI2 is applied on the insulating film IL4b including the pad regions PD1 and the polyimide film PI1 as a second insulating film. For example, the polyimide film PI2 is formed by rotationally applying a polyimide precursor solution on the surface of the SOI substrate 1, and then drying the same. Next, the polyimide film PI2 in the peripheral circuit forming region 1A is removed by exposing and developing the photosensitive polyimide film PI2. At this time, the polyimide film PI2 is retreated from the end of the polyimide film PI1. Thus, the end of the polyimide film PI1 is exposed, and a step St2 is formed between the polyimide film PI1 and the polyimide film PI2. Thereafter, the polyimide film PI2 is cured by a thermal treatment. The film thickness of the polyimide film PI1 is about 3 to 10 μm, for example. Further, the retreat amount of the polyimide film PI2, i.e., a distance between the end of the polyimide film PI1 and the end of the polyimide film PI2 (step width) is 50 μm to 100 μm, for example.

Since the polyimide films PI1 and PI2 are laminated in this manner, the film thickness of an insulating film between the inductors (Ia, Ib) can be increased.

Further, since the polyimide films PI1 and PI2 are so formed in a stairs-like shape as to have the steps St1, St2, the occurrence of a depression or peeling-off of the polyimide film PI2 due to defective exposure can be reduced, as described in detail in the first embodiment.

Next, on the insulating film IL4b including the pad region PD1 and the polyimide films PI1 and PI2, a barrier film (not shown) composed of a titanium (Ti) or Chromium (Cr) film, for example, is deposited by a sputtering process or the like, and further, on the barrier film (not shown), a copper thin film (copper film) is deposited as a Cu seed layer (not shown) for electrolytic plating by a sputtering process or the like.

Here, according to the third embodiment, since depressions in the ends of the polyimide films PI1, PI2 or peeling-off thereof are reduced, the barrier film (not shown) or the Cu seed layer SE can be formed with good coatability.

Next, in the same manner as in the first embodiment, an inductor Ib and rewirings RW are formed on the Cu seed layer (not shown). Further, a base metal film UM composed of a laminated film of a Ni film and an Au film (Ni/Au) is formed on the inductor Ib and the rewirings RW.

Next, a photosensitive polyimide film PI3 is applied, as an insulating film (protective film), on top of the inductor Ib including the base metal film UM, the rewirings RW, the polyimide film PI2, and the like. For example, the polyimide film PI3 is formed by rotationally applying a polyimide precursor solution on the surface of the SOI substrate 1, and then drying the same. Next, the polyimide film PI3 is exposed using, as a mask, a reticle in which pattern portions of the pad regions PD2 of the peripheral circuit forming region 1A, the pad regions PD2 of the transformer forming region 2A, and an opening portion OA have been shielded.

Next, opening portions (opening regions, exposed portions of the base metal film UM) are formed by removing the polyimide film PI3 other than qualitatively-altered regions (i.e., shielded regions of the reticle) by a development process. Thus, the base metal film UM on the inductor Ib and the base metal film UM on the rewirings RW are exposed. The exposed regions of the base metal film UM become the pad regions PD2. In addition, at this time, the opening portion OA is formed in the border between the peripheral circuit forming region 1A and the transformer forming region 2A. The interlayer insulating film IL4 (insulating film IL4b) is exposed from the bottom of the opening portion OA. In this manner, the opening portion (recess) OA exposing at least the interlayer insulating film IL4 (insulating film IL4b) is provided by removing the polyimide film PI3 in the border between the peripheral circuit forming region 1A and the transformer forming region 2A.

Thereafter, the SOI substrate (wafer) 1 is divided (singulated) into a plurality of chips (semiconductor chips) by cutting (dicing) the SOI substrate 1. It should be noted that before dicing, the SOI substrate 1 may be thinned by backside grinding of the SOI substrate 1. Next, the semiconductor chip is mounted (bonded) on a die pad of a lead frame (die bonding). Leads (external terminals, terminals) are provided around the die pad. Next, the pad regions PD2 on the semiconductor chip and the leads are connected together by wires composed of gold wires (conductive wires, conductive members) (wire bonding, see FIG. 35).

Thereafter, if necessary, the semiconductor chip and the wires are encapsulated (packaged) with encapsulating resin (molding resin) or the like.

Since the laminated film of the polyimide films PI1 and PI2 is provided between the inductors Ia, Ib in the transformer forming region 2A in this manner in the third embodiment, the film thickness of the insulating film between the inductors Ia, Ib can be increased. This can improve withstand voltage between the inductors Ia, Ib.

In addition, since the polyimide film PI2 is so disposed as to be retreated from the end of the polyimide film PI1 in the laminated film of the polyimide films PI1 and PI2, the occurrence of depressions or peeling-off of the polyimide film PI2 due to defective exposure can be reduced.

In addition, since the rewirings RW are covered with the polyimide film PI3, the rewirings RW can be protected. In addition, since the inductor Ib is covered with the polyimide film PI3, the inductor Ib can be protected. In addition, since the polyimide film PI3 is so formed as to be retreated from the end of the polyimide film PI2, and the laminated film of the polyimide films (PI1 to PI3) is formed in a stairs-like shape (pyramid shape) in the transformer forming region 2A, the following advantageous effects are obtained.

In FIG. 38, a creepage distance (a shortest distance between two conductive portions along the surface of an insulating film) is represented by a dashed two-dotted line. In order to achieve electrical insulation without isolation by an insulator, it is necessary to secure both a spatial distance and a creepage distance. Here, in the third embodiment, since the steps (St1 to St3) are formed when the insulating films (PI1 to PI3) are laminated, a trench composed of multi-stage side walls of the insulating film insulator is formed between electrodes of a high withstand voltage and a low withstand voltage, namely, between the pad regions PD2 of the peripheral circuit forming region 1A and the pad regions PD2 of the transformer forming region 2A by combining the plurality of steps with each other, so that a high withstand-voltage region and a low withstand-voltage region are separated from each other. This can gain a longer creepage distance, so that a high withstand-voltage electrically-insulated state can be achieved.

Further, in the third embodiment, as shown in the peripheral circuit forming region 1A in FIG. 38, the plurality of pad regions PD1 are drawn out to the pad regions PD2 by means of the rewirings RW. Specifically, source electrodes (or drain electrodes) of a plurality of MISFETs (NT, PT) are connected by the rewirings RW and drawn out to the pad regions PD2. This makes it possible to lower resistance as compared with the case where the pad regions PD1 are connected by the lower-layer wirings (M1 to M3) composed of Al or the like. That is, Cu that constitutes the rewirings RW has lower resistance than Al, and regarding the rewirings RW located in the upper layer, wiring resistance can be lowered because the wiring can be thickly formed. In addition, since the pad regions PD2 are disposed in the vicinity of the center of the rewirings (strip-shaped straight line), as shown in FIG. 36, current can be equally distributed (or collected) from the individual source electrodes (or drain electrodes) of the MISFETs (NT, PT), so that the loads applied to the individual MISFETs can be more equalized.

Fourth Embodiment

The laminated film of the polyimide films PI1 and PI2 has been provided between the inductors Ia, Ib in the transformer forming region 2A in the first to third embodiments, but the film thickness of the insulating film between the inductors Ia, Ib can be reduced when required withstand voltage is small. In this case, the insulating film between the inductors Ia, Ib may be a single layer.

[Description of Description]

Figure 39:
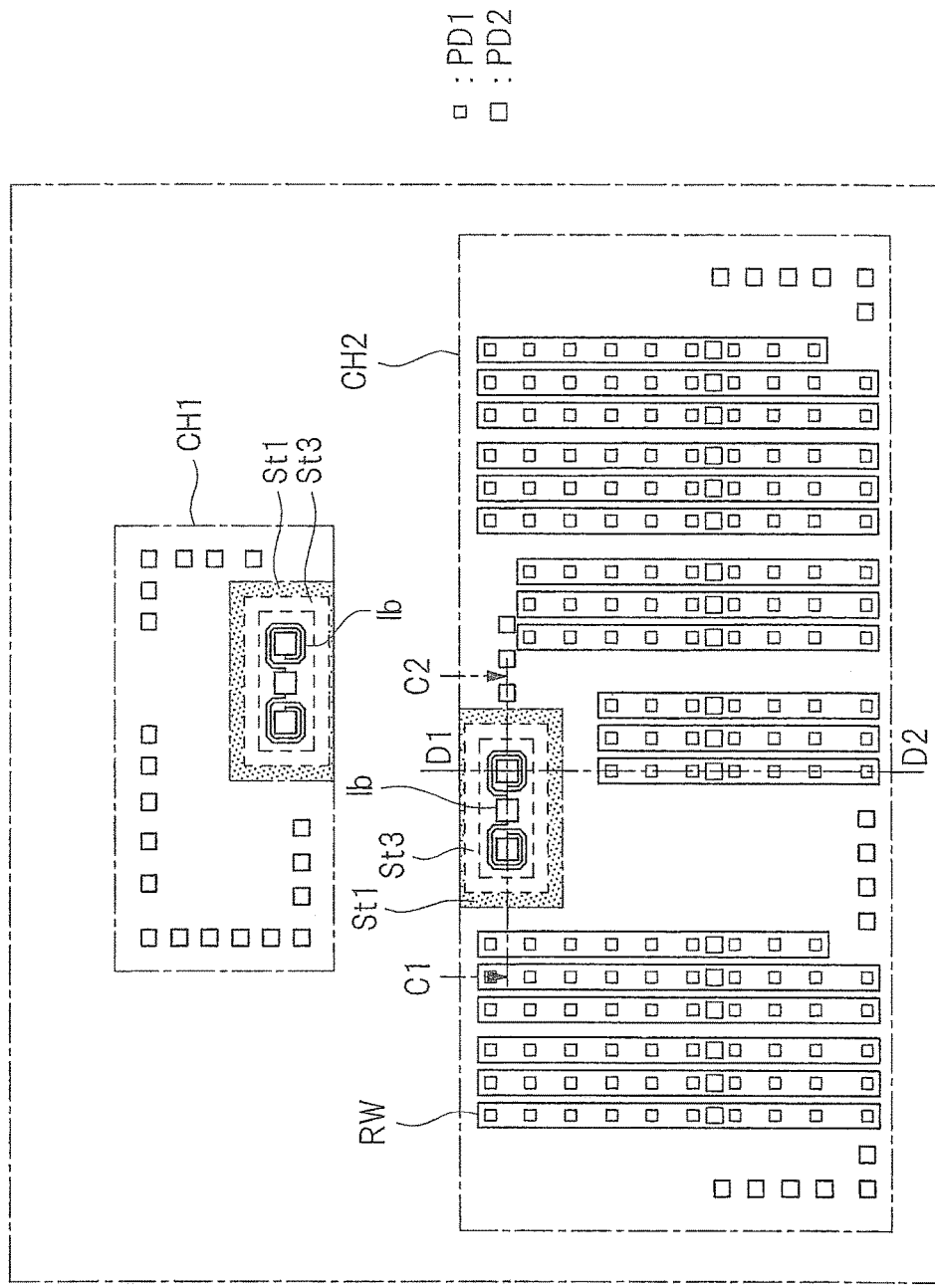
FIG. 39 is a plan view schematically showing a configuration of a semiconductor device of a fourth embodiment.
Figure 40:
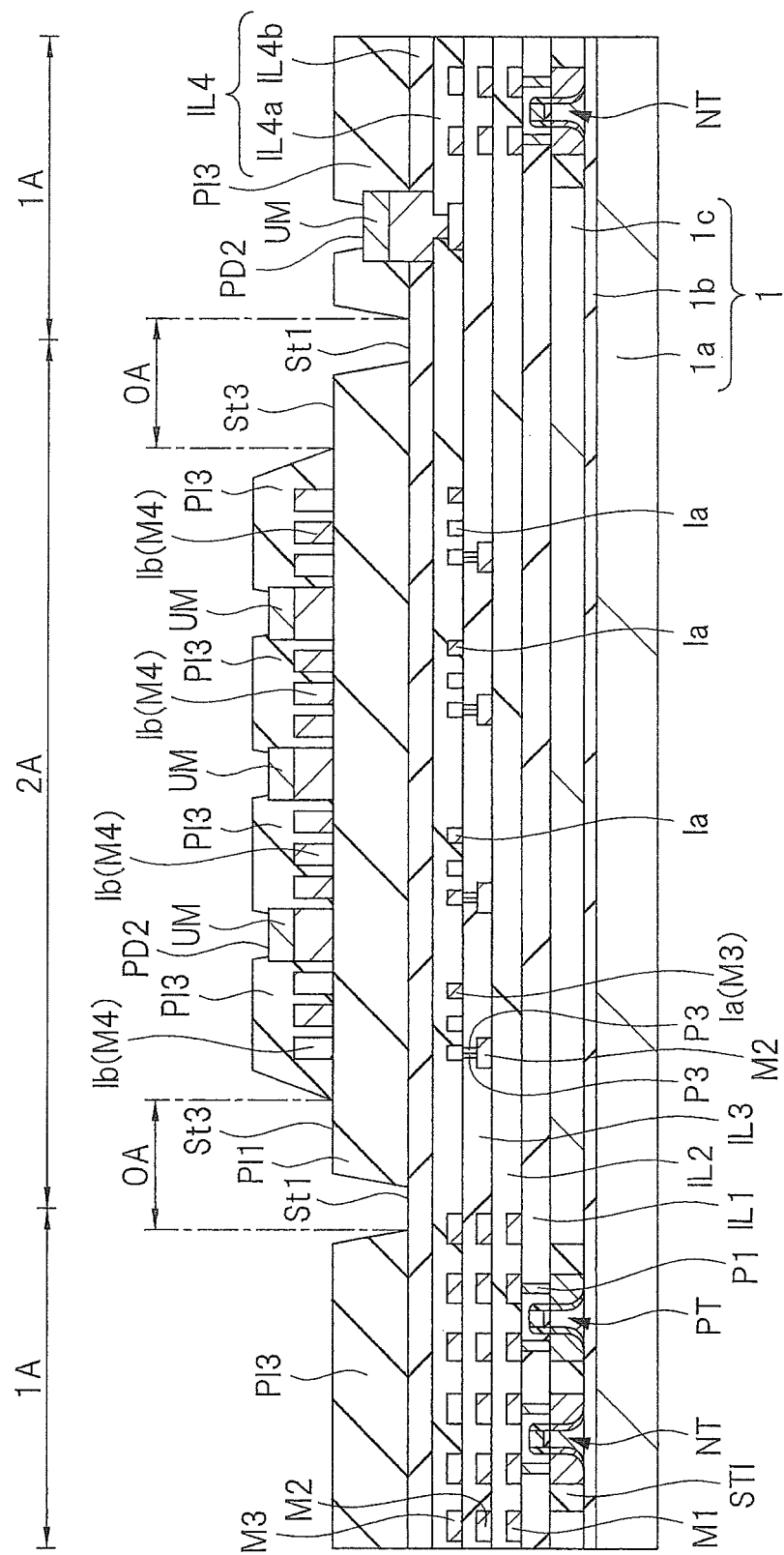
FIG. 40 is a cross-sectional view schematically showing the configuration of the semiconductor device of the fourth embodiment.
Figure 41:
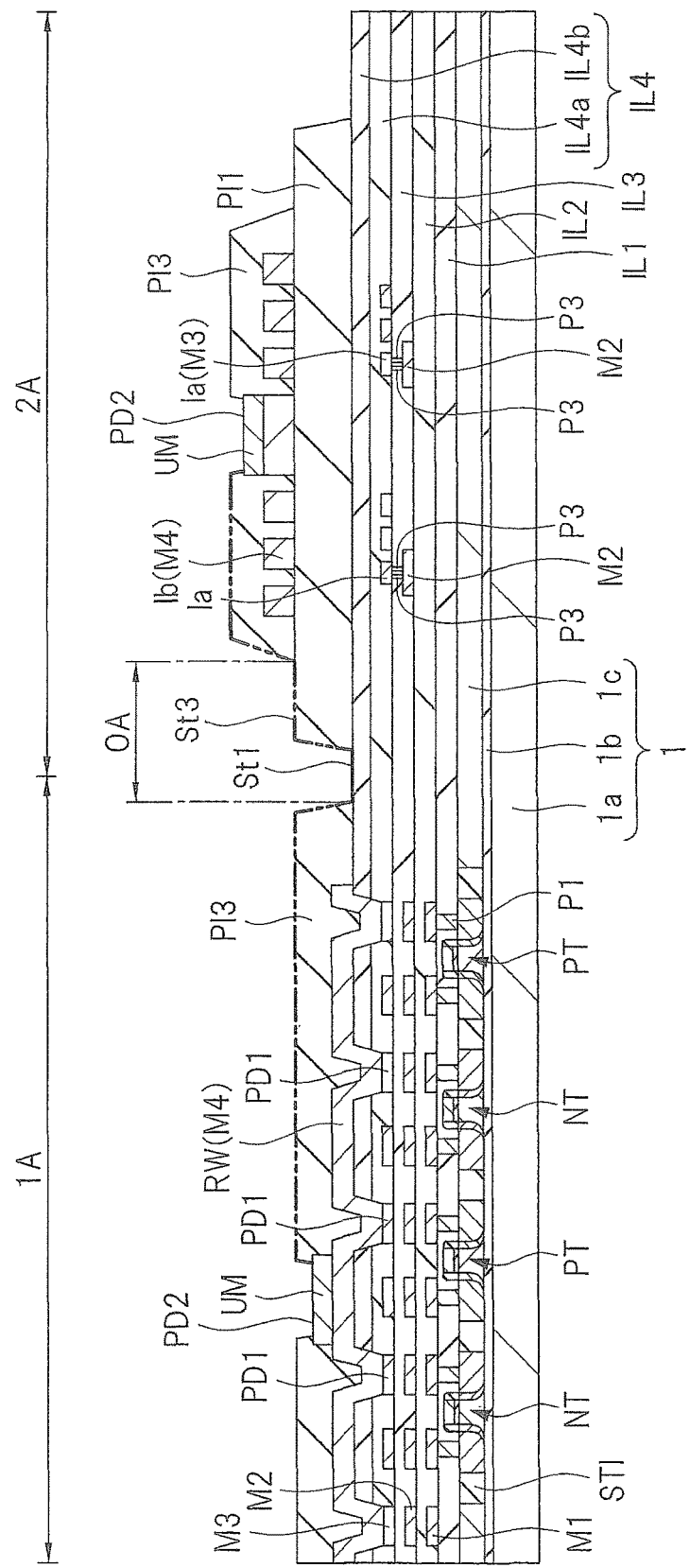
FIG. 41 is a cross-sectional view schematically showing the configuration of the semiconductor device of the fourth embodiment.

FIGS. 39 to 41 are a plan view or a sectional view schematically showing the configuration of the semiconductor device of a fourth embodiment. FIG. 39 corresponds to a plan view, FIG. 40 a sectional view taken along a line C1-C2 in FIG. 39, and FIG. 41 a sectional view taken along a line D1-D2 in FIG. 39.

In the semiconductor device shown in FIG. 39 a chip CH1 and a chip CH2 are integrated in one package.

The chip CH1 has a transformer composed of an upper-layer inductor Ia and a lower-layer inductor (not shown). A forming region of the transformer is a substantially-rectangular region, a step St3 is disposed therearound, and further a step St1 is disposed around the step St3.

The chip CH2 also has a transformer composed of an upper-layer inductor Ia and a lower-layer inductor (not shown). A forming region of the transformer is a substantially-rectangular region, a step St3 is disposed therearound, and further a step St1 is disposed around the step St3. Each of the steps St1, St3 will be described in detail later with reference to the sectional views (FIGS. 40, 41).

Pad regions PD2 are disposed around each of the chips CH1, CH2.

Further, in the chip CH2, rewirings RW are so disposed as to connect the tops of the pad regions PD1. Further, the pad regions PD2 are disposed on the rewirings RW.

The pad regions PD2 of the chips CH1 and CH2 are connected to leads via wires (see FIG. 35).

Further details will be described with reference to FIGS. 40 and 41.

Each chip CH1, CH2 of the semiconductor device of the fourth embodiment is formed utilizing an SOI substrate. For example, as shown in FIGS. 40 and 41, the chip CH2 is formed on an SOI substrate 1 having a peripheral circuit forming region 1A and a transformer forming region 2A.

The SOI substrate 1 has a supporting substrate 1a, an insulating layer 1b formed on the supporting substrate 1a, and a semiconductor layer formed on the insulating layer 1b.

N-channel type MISFETs (NT) and p-channel type MISFETs (PT) are formed in the peripheral circuit forming region 1A. An interlayer insulating film IL1 is formed on these MISFETs, and first-layer wirings M1 are formed on the interlayer insulating film IL1. The MISFETs (NT, PT) and the first-layer wirings M1 are connected together via plugs P1. In addition, second-layer wirings M2 are formed on the first-layer wirings M1 via an interlayer insulating film IL2. The first-layer wirings M1 and the second-layer M2 are connected together via plugs (not shown) formed in the interlayer insulating film IL2. Third-layer wirings M3 are formed on the second-layer wirings M2 via interlayer insulating film IL3. The second-layer wirings M2 and the third-layer wirings M3 are connected together via plugs P3 formed in the interlayer insulating film IL3.

Rewirings RW are formed on the third-layer wirings M3 via an interlayer insulating film (an insulating film, a protective film) IL4. The interlayer insulating film IL4 is composed of a laminated film of an insulating film IL4a and an insulating film IL4b on the insulating film IL4a. The rewirings RW are wirings (also referred to as fourth-layer wirings M4) that draw out the pad regions PD1, which are parts of an uppermost-layer wiring (here, the third-layer wirings M3), to desired regions (pad regions PD2) of the chip.

A transformer having an inductor Ia and an inductor Ib is formed in the transformer forming region 2A. The lower-layer inductor Ia is formed in the same layer as the third-layer wirings M3. The lower-layer inductor Ia is connected to the second-layer wirings M2 in a layer therebelow via a plurality of plugs P3. That is, the inductor Ia and the second-layer wirings M2 connected to the inductor Ia have the following relationship. The second-layer wirings M2 are wirings that are formed between the interlayer insulating film IL3 and the interlayer insulating film IL2, and that overlap with the inductor Ia in a plan view. In addition, as viewed in a cross section, the inductor Ia is covered with the interlayer insulating film IL4, and the inductor Ia and the second-layer wirings M2 are connected together via a plurality of plugs (connecting portions) P3 penetrating the interlayer insulating film IL3.

The inductor Ib is formed on the inductor Ia via the interlayer insulating film IL4 and a polyimide film PI1. The polyimide film PI1 is not formed in the peripheral circuit forming region 1A. That is, the step St1 is formed between the interlayer insulating film IL4 (insulating film IL4b) and the polyimide film PI1. The polyimide film PI1 is formed on a main surface of the interlayer insulating film IL4. The polyimide film PI1 has a main surface and side surfaces continuous with this main surface. Therefore, the step St1 is formed by the main surface of the interlayer insulating film IL4 and the side surfaces of the polyimide film PI1.

Thus, a difference in height corresponding to the film thickness of the polyimide film PI1 exists between the forming position of the inductor Ia and the forming positions of the rewirings RW, but the inductor Ia and the rewirings RW are formed of the same material (the same step).

A polyimide film PI3 is formed on the rewirings RW and the inductor Ia. The polyimide film PI3 is formed on the main surface of the polyimide film PI1. The polyimide film PI3 has a main surface and side surfaces continuous with this main surface. In addition, the polyimide film PI3 is so formed as to be retreated from an end of the polyimide film PI1. In other words, in the transformer forming region 2A, the step St3 is formed between the polyimide film PI1 and the polyimide film PI3. That is, the main surface of the polyimide film PI1 and the main surface of the polyimide film PI3 form the step St3 via the side surfaces of the polyimide film PI3. In addition, the polyimide film PI3 has a main surface and side surfaces continuous with the main surface. In addition, an opening portion (recess) OA exposing at least the interlayer insulating film IL4 (insulating film IL4b) is formed by removing the polyimide film PI3 in the border between the peripheral circuit forming region 1A and the transformer forming region 2A.

Regarding the configuration the inductors, it is preferred that a conductive film having a spiral planar shape be used, as described above. Here, two spiral conductive films are so disposed as to be symmetrical with respect to the center line of a pad region PD2 located in the center of FIG. 39 (see FIG. 39, FIG. 3).

[Manufacturing Method Description]

Next, with reference to FIGS. 40 and 41, a method of manufacturing the semiconductor device of the fourth embodiment will be described, and the configuration of the semiconductor device thereof will be made clearer. It should be noted that detailed descriptions of the same steps as steps described in the first embodiment will be omitted.

As shown in FIGS. 40 and 41, for example, an SOI substrate 1 is prepared as the semiconductor substrate. The SOI substrate 1 is composed of a supporting substrate 1a composed of silicon single crystal (semiconductor film), an insulating layer 1b formed on the supporting substrate 1a, and a silicon layer 1c formed on the insulating layer 1b. The SOI substrate 1 has a peripheral circuit forming region 1A and a transformer forming region 2A.

Next, a device isolation insulating film STI is formed in the silicon layer 1c of the SOI substrate 1. This device isolation film can be formed in the same manner as in the first embodiment by means of an STI process, for example.

For example, device isolation trenches are formed in the silicon layer 1c of the SOI substrate 1 by means of a photolithography technique and an etching technique. Next, on the SOI substrate 1, a silicon oxide film is deposited, by means of a CVD process or the like, so as to have a thickness just enough to fill the device isolation trenches, and the silicon oxide film other than the device isolation trenches is removed by means of a chemical mechanical polishing process, an etching-back process, or the like. Thus, the device isolation trenches can be filled with the silicon oxide film.

Next, MISFETs (NT, PT) are formed in the peripheral circuit forming region 1A. Although the method of forming the MISFETs is not limited, a MISFET (NT, PT) having a source-drain region (SD) having an LDD structure having a high-concentration impurity region and a low-concentration impurity region can be formed in the same manner as in the first embodiment, for example.

Next, an interlayer insulating film IL1 is formed on the SOI substrate 1 including on the MISFETs (NT, PT). For example, after a silicon oxide film is deposited by a CVD process, the surface of the interlayer insulating film IL1 is planarized by a CMP process or the like, if necessary.

Next, contact holes are formed by patterning the interlayer insulating film IL1. Next, plugs P1 are formed by burying a conductive film in the contact holes.

Next, on the interlayer insulating film IL1 and the plugs P1, a laminated film is formed as a conductive film by sequentially depositing a titanium/titanium-nitride film, an aluminum film, and a titanium/titanium-nitride film, for example, by means of a sputtering process or the like. Next, first-layer wirings M1 are formed on the plugs P1 by patterning the laminated film by means of the photolithography technique and the etching technique.

Next, an interlayer insulating film IL2 composed of a silicon oxide film is formed on the first-layer wirings M1 by a CVD process or the like. Next, contact holes (not shown) are formed on the first-layer wirings M1 by patterning the interlayer insulating film IL2.

Next, plugs (not shown) are formed in the interlayer insulating film IL2 by burying a conductive film in the contact holes. These plugs can be formed in the same manner as the plugs P1.

Next, on the interlayer insulating film IL2 and the plugs, a laminated film is formed as a conductive film by sequentially depositing a titanium/titanium-nitride film, an aluminum film, and a titanium/titanium-nitride film, for example, by means of a sputtering process or the like. Next, second-layer wirings M2 are formed on the plugs by patterning the laminated film by means of the photolithography technique and the etching technique.

Next, an interlayer insulating film IL3 composed of a silicon oxide film is formed on the second-layer wirings M2 by a CVD process or the like. Next, contact holes are formed on the second-layer wirings M2 by patterning the interlayer insulating film IL3.

Next, plugs P3 are formed in the interlayer insulating film IL3 by burying a conductive film in the contact holes. These plugs can be formed in the same manner as the plugs P1.

Next, on the interlayer insulating film IL3 and the plugs, a laminated film is formed as a conductive film by sequentially depositing a titanium/titanium-nitride film, an aluminum film, and a titanium/titanium-nitride film, for example, by means of a sputtering process or the like. Next, third-layer wirings M3 are formed on the plugs by patterning the laminated film by means of the photolithography technique and the etching technique.

Here, in the transformer forming region 2A, a lower-layer inductor Ia is formed in the same layer as the third-layer wirings M3. That is, at the time of patterning the laminated film, the above-described spiral conductive films (inductor Ia) are formed in the transformer forming region 2A (see FIG. 40, FIG. 41). It should be noted that the conductive films (inductor Ia) are connected to the second-layer wirings M2 in a layer therebelow via the plugs P3 (see FIG. 41).

Next, an insulating film IL4a is formed on the third-layer wirings M3 (here, the uppermost-layer wirings) and the interlayer insulating film IL3. For example, the insulating film IL4a is formed by depositing a silicon nitride film so as to have a film thickness of about 1 to 4 μm by a CVD process or the like.

Next, for example, a photosensitive polyimide film is applied on the insulating film IL4a as an insulating film IL4b. For example, the polyimide film is formed by rotationally applying a polyimide precursor solution on the surface of the SOI substrate 1, and then drying the same. Next, opening portions (opening regions, exposed portions of the third-layer wirings M3) are formed by removing the polyimide film (IL4b) in the pad regions PD1 by exposing and developing the photosensitive polyimide film (IL4b). Thereafter, the polyimide film (IL4b) is cured by a thermal treatment. The film thickness of the polyimide film (IL4b) is about 3 to 10 μm, for example. Next, the third-layer wirings M3 in the pad regions PD1 are exposed by removing the insulating film IL4a by etching. Thus, the interlayer insulating film IL4 having the opening portions in the pad regions PD1 and composed of a laminated film of the insulating film IL4a and the insulating film IL4b is formed.

Next, a photosensitive polyimide film PI1 is applied to the insulating film IL4b including the pad regions PD1 as a first insulating film (an interlayer insulating film, an insulating film for ensuring withstand voltage, an insulating film between inductors). The film thickness of the polyimide film PI1 is about 11 μm, for example. Here, since the insulating film IL4b extends from the transformer forming region 2A to the peripheral circuit forming region 1A, a step St1 is formed between the insulating film IL4b and the polyimide film PI1.

Next, in the same manner as in the first embodiment, an inductor Ib and rewirings RW are formed. Further, a base metal film UM composed of a laminated film of a Ni film and an Au film (Ni/Au) is formed on the inductor Ib and the rewirings RW.

Next, a photosensitive polyimide film PI3 is applied, as an insulating film (protective film), on top of the inductor Ib including the base metal film UM, the rewirings RW, the polyimide film PI1, and the like. For example, the polyimide film PI3 is formed by rotationally applying a polyimide precursor solution on the surface of the SOI substrate 1, and then drying the same. Next, the polyimide film PI3 is exposed using, as a mask, a reticle in which pattern portions of the pad regions PD2 of the peripheral circuit forming region 1A, the pad regions PD2 of the transformer forming region 2A, and an opening portion OA have been shielded.

Next, opening portions (opening regions, exposed portions of the base metal film UM) are formed by removing the polyimide film PI3 other than qualitatively-altered regions (i.e., shielded regions of the reticle) by a development process. Thus, the base metal film UM on the inductor Ib and the base metal film UM on the rewirings RW are exposed. The exposed regions of the base metal film UM become the pad regions PD2. In addition, at this time, the opening portion OA is formed in the border between the peripheral circuit forming region 1A and the transformer forming region 2A. The interlayer insulating film IL4 (insulating film IL4b) is exposed from the bottom of the opening portion OA. In this manner, the opening portion (recess) OA exposing at least the interlayer insulating film IL4 (insulating film IL4b) is provided by removing the polyimide film PI3 in the border between the peripheral circuit forming region 1A and the transformer forming region 2A.

Thereafter, the SOI substrate (wafer) 1 is divided (singulated) into a plurality of chips (semiconductor chips) by cutting (dicing) the SOI substrate 1. It should be noted that before dicing, the SOI substrate 1 may be thinned by backside grinding of the SOI substrate 1. Next, the semiconductor chip is mounted (bonded) on a die pad of a lead frame (die bonding). Leads (external terminals, terminals) are provided around the die pad. Next, the pad regions PD2 on the semiconductor chip and the leads are connected together by wires composed of gold wires (conductive wires, conductive members) (wire bonding, see FIG. 35).

Thereafter, if necessary, the semiconductor chip and the wires are encapsulated (packaged) with encapsulating resin (molding resin) or the like.

In this manner, in the fourth embodiment, the single layer of the polyimide film PI1 is provided between the inductors Ia, Ib in the transformer forming region 2A.

Further, in the fourth embodiment, since the rewirings RW are covered with the polyimide film PI3, the rewirings RW can be protected. In addition, since the inductor Ib is covered with the polyimide film PI3, the inductor Ib can be protected. Moreover, since the polyimide film PI3 is so formed as to be retreated from the end of the polyimide film PI1, and the laminated film of the polyimide films (PI1 to PI3) is formed in a stairs-like shape (pyramid shape) in the transformer forming region 2A, the following advantageous effects are obtained.

In FIG. 41, a creepage distance (a shortest distance between two conductive portions along the surface of an insulating film) is represented by a dashed two-dotted line. In order to achieve electrical insulation without isolation by an insulator, it is necessary to secure both a spatial distance and a creepage distance. Here, in the fourth embodiment, since the steps (St1, St3) are formed when the insulating films (PI1, PI3) are laminated, a trench composed of multi-stage side walls of the insulating films is formed between electrodes of a high withstand voltage and a low withstand voltage, namely, between the pad regions PD2 of the peripheral circuit forming region 1A and the pad regions PD2 of the transformer forming region 2A by combining the plurality of steps with each other, so that a high withstand-voltage region and a low withstand-voltage region are separated from each other. This can gain a longer creepage distance, so that a high withstand voltage electrically-insulated state can be achieved.

In addition, in the fourth embodiment, as shown in the peripheral circuit forming region 1A in FIG. 40, the plurality of pad regions PD1 are drawn out to the pad regions PD2 by means of the rewirings RW. Specifically, a plurality of source electrodes (or drain electrodes) of MISFETs (NT, PT) are connected by the rewirings RW and drawn out to the pad regions PD2. This makes it possible to lower resistance as compared with the case where the pad regions PD1 are connected by the lower-layer wirings (M1 to M3) composed of Al or the like. That is, Cu that constitutes the rewirings RW has lower resistance than Al, and regarding the rewirings RW located in the upper layer, wiring resistance can be lowered because the wiring can be thickly formed. In addition, since the pad regions PD2 are disposed in the vicinity of the center of the rewirings (strip-shaped straight line), as shown in FIG. 39, current can be equally distributed (or collected) from the individual source electrodes (or drain electrodes) of the MISFETs (NT, PT), so that the loads applied to the individual MISFETs can be more equalized.

Fifth Embodiment

Figure 42:
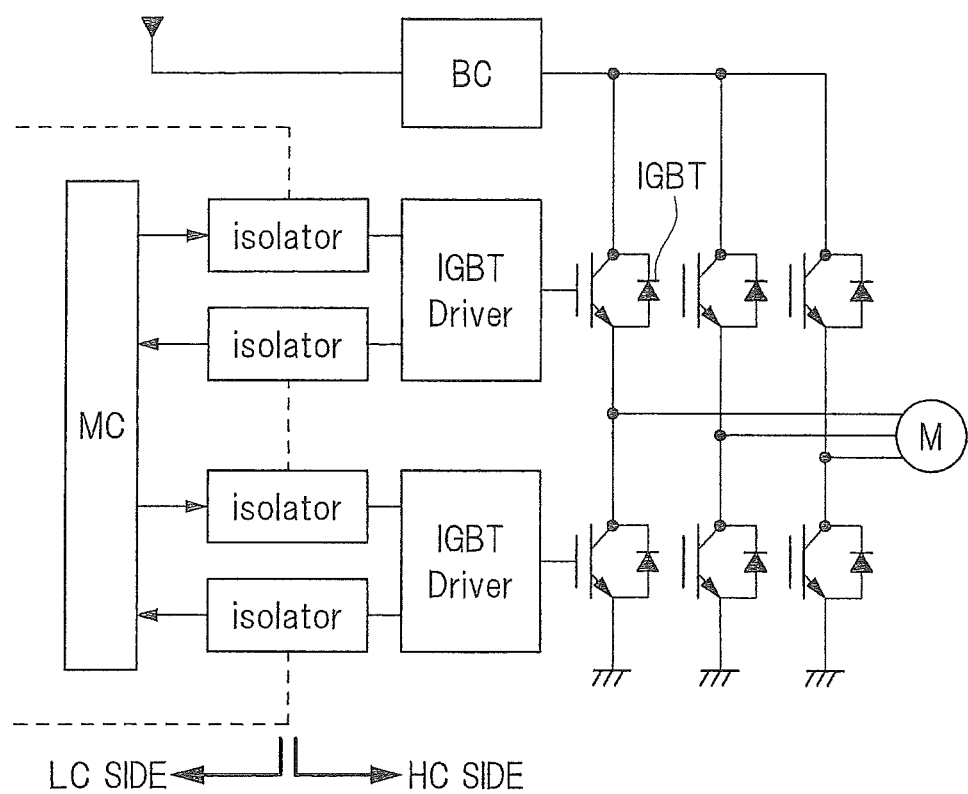
FIG. 42 is a diagram showing a circuit diagram of a three-phase motor in a fifth embodiment.

The application field of the semiconductor devices described in the first to fourth embodiment is not limited, and the semiconductor devices are widely applicable to devices that wirelessly transfer electrical signals between two circuits the potentials of inputted electrical signals of which are different from each other. Here, as an applied device, a three-phase motor will be described by way of example. FIG. 42 is a diagram showing a circuit diagram of the three-phase motor in the fifth embodiment.

A motor M shown in FIG. 42 is a so-called three-phase motor, and has inputs of a U phase, a V phase, and a W phase. In this circuit, variable speed control of the number of revolutions of the motor M can be performed by boosting input voltage from a power supply by means of a booster circuit BC, and performing conversion into alternate current having a desired frequency by utilizing IGBT (Insulated Gate Bipolar Transistor).

Each IGBT is connected to an IGBT driver, and controlled thereby. In addition, the IGBT driver is connected to a microcomputer MC via isolators.

Here, in FIG. 42, the left side from the isolators, i.e., a side from the isolators to the microcomputer MC is a low-voltage region LC. That is, there is a circuit drivable at low voltage (for example, 50 V or less). On the other hand, in FIG. 42, the right side from the isolators, i.e., a side from the isolator to the motor M is a high-voltage region HC. That is, there is a circuit driven at high voltage (for example, an AC RMS value of 100 Vrms or more).

In this manner, the transformers (inductors Ia, Ib, I1 to I4) described in the first or second embodiment can be incorporated as isolators between the low-voltage region LC and the high-voltage region HC. In particular, according to the semiconductor devices of the first and second embodiment, in addition to the transformers (inductors Ia, Ib, I1 to I4), various elements constituting peripheral circuits (for example, a MISFET) can be incorporated in the same chip or in a package. Therefore, for example, the isolators and the IGBT drivers shown in FIG. 42 can be incorporated in the same chip or in the package. Of course, it is also possible to prepare a chip on the side of a low-voltage region LC and another chip on the side of the high-voltage region HC, connect these chips together via a transformer incorporated in either one of the chips, incorporate a microcomputer MC in the chip on the low-voltage region LC, and incorporate a circuit driven at high voltage, such as an IGBT, in the chip on the high-voltage region HC.

The invention made by the present inventors has been specifically described on the basis of embodiments thereof, but the present invention is not limited to the embodiments described above, and obviously the present invention can be modified without departing from the gist thereof.

For example, the first-layer wirings M1 to the third-layer wirings M3 are formed by patterning in the first embodiment, but the first-layer wirings M1 to the third-layer wirings M3 may be formed by means of a so-called "damascene process" of burying a conductive film in wiring trenches provided in interlayer insulating films.

In addition, the insulating film between the inductors (Ia, Ib) is composed of the laminated film of polyimide films (PI1, PI2) in the first embodiment, but a different insulating film may be used. However, it is preferred that a polyimide film be used between the inductors (Ia, Ib) because of excellent withstand voltage thereof. In addition, since the polyimide film can be formed by application, and is also easy to photosensitize, using a polyimide film makes it possible to form a semiconductor device by simple steps.

In addition, a laminated film of polyimide films (PI1, PI2) between the inductors (Ia, Ib) has a two-layered structure in the first embodiment, but more than two layers of polyimide films are laminated. In this case, individual polyimide films are laminated in a stairs-like shape (pyramid shape).

In addition, the ends of a laminated film of polyimide films (PI1, PI2) between the inductors (Ia, Ib) each have tapered shapes in the first embodiment, but this is not a limitation. However, it is preferred that a side surface of each polyimide film have a tapered shape, i.e., an angle formed by a side surface of each polyimide film and the surface of a substrate be set to 90° or less. Since the side surface of each polyimide film is formed in a tapered shape in this manner, peeling-off at the end of each polyimide film can be further reduced, and a step disconnection of a Cu seed layer (SE) can also be effectively reduced.

In addition, the SOI substrate has been described by way of example in the first embodiment, but a so-called "bulk substrate" may be used. However, if a polyimide film is laminated above the SOI substrate, a film stress of the polyimide film acts in a direction of relaxing warpage of the SOI substrate. This improves the flatness of the SOI substrate, so that it is more effective that the semiconductor device of the first embodiment is applied to a semiconductor device using an SOI substrate.

What is claimed is:
1. A semiconductor device comprising:
 a semiconductor substrate having a main surface;
 a first coil formed on the main surface;
 a first insulating film formed over the first coil and having a first main surface;

a second insulating film formed on the first main surface of the first insulating film and having a second main surface;

a second coil formed on the second main surface of the second insulating film, wherein the first main surface of the first insulating film has a first area on which the second insulating film is formed, and has a second area without the first area in a plan view, and wherein the second insulating film is surrounded by the second area in the plan view, the main surface of the semiconductor having a fifth area on which the first insulating film is formed, a sixth area surrounding the fifth area, and a seventh area between the fifth area and the sixth area;

a fourth insulating film formed on the sixth area, wherein the first insulating film is surrounding by the seventh area of the main surface of the semiconductor substrate in the plan view, and wherein the first insulating film is surrounded by the fourth insulating film in the plan view; and a first opening formed on a third insulating film formed over the second coil, and a second opening formed on the fourth insulating film, wherein a surface of a first electrode pad is exposed in the first opening, and wherein a surface of a second electrode pad is exposed in the second opening.

2. The semiconductor device according to claim 1, wherein the first insulating film and the second insulating film comprise organic insulating films.

3. The semiconductor device according to claim 1, further comprising:

a third insulating film formed over the second coil, wherein the second main surface of the second insulating film has a third area on which the third insulating film is formed and has a fourth area without the third area in a plan view, and wherein the third insulating film is surrounded with the fourth area in the plan view.

4. The semiconductor device according to claim 1, wherein the second coil overlaps the first coil in the plan view.

5. The semiconductor device according to claim 1, further comprising:

a fifth insulating film formed between the main surface of the semiconductor substrate and the first insulating film in a cross-sectional view, wherein the first coil is covered with the fifth insulating film in the cross-sectional view, and wherein the first and fourth insulating films are formed on the fifth insulating film in the cross-sectional view.

6. The semiconductor device according to claim 3, wherein the third insulating film comprises an organic insulating film.

7. The semiconductor device according to claim 5, wherein the fourth and fifth insulating films comprise organic insulating films.

8. A semiconductor device comprising:
a semiconductor substrate;
a first inductor formed on the semiconductor substrate;
a first insulating film formed over the first inductor and including a first surface;

a second insulating film formed on the first surface of the first insulating film and including a second surface;

a second inductor formed on the second surface of the second insulating film, wherein the first surface of the first insulating film includes a first area on which the second insulating film is formed, and includes a second area void of the first area in a plan view, and wherein the second insulating film is surrounded by the second area in the plan view, the semiconductor substrate comprising a fifth area on which the first insulating film is formed, a sixth area surrounding the fifth area, and a seventh area between the fifth area and the sixth area;

a fourth insulating film formed on the sixth area, wherein the first insulating film is surrounding by the seventh area of the semiconductor substrate in the plan view, and wherein the first insulating film is surrounded by the fourth insulating film in the plan view; and a first opening formed on a third insulating film formed over the second inductor, and a second opening formed on the fourth insulating film, wherein a surface of a first electrode pad is exposed in the first opening, and wherein a surface of a second electrode pad is exposed in the second opening.

9. The semiconductor device according to claim 8, wherein the first insulating film and the second insulating film comprise organic insulating films.

10. The semiconductor device according to claim 8, further comprising:

a third insulating film formed over the second inductor, wherein the second surface of the second insulating film includes a third area on which the third insulating film is formed and has a fourth area without the third area in a plan view, and wherein the third insulating film is surrounded with the fourth area in the plan view.

11. The semiconductor device according to claim 8, wherein a groove is formed between the second insulating film and the fourth insulating film in a cross-sectional view, and wherein the second insulating film is surrounded by the groove in the plan view.

12. The semiconductor device according to claim 8, wherein the second inductor overlaps the first inductor in the plan view.

13. The semiconductor device according to claim 8, further comprising:

a fifth insulating film formed between the semiconductor substrate and the first insulating film in a cross-sectional view, wherein the first inductor is covered with the fifth insulating film in the cross-sectional view, and wherein the first and fourth insulating films are formed on the fifth insulating film in the cross-sectional view.

14. The semiconductor device according to claim 10, wherein the third insulating film comprises an organic insulating film.

15. The semiconductor device according to claim 13, wherein the fourth and fifth insulating films comprise organic insulating films.

* * * * *